United States Patent
Yamazaki et al.

(10) Patent No.: US 11,176,900 B2
(45) Date of Patent: Nov. 16, 2021

(54) DISPLAY DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/146,573

(22) Filed: Jan. 12, 2021

(65) Prior Publication Data

US 2021/0210035 A1    Jul. 8, 2021

Related U.S. Application Data

(63) Continuation of application No. 16/720,697, filed on Dec. 19, 2019, now Pat. No. 10,902,804, which is a
(Continued)

(30) Foreign Application Priority Data

Feb. 17, 2017  (JP) .............................. JP2017-027901

(51) Int. Cl.
  *G09G 3/36*    (2006.01)
  *H01L 27/12*   (2006.01)
  (Continued)

(52) U.S. Cl.
  CPC ..... *G09G 3/3614* (2013.01); *G02F 1/136286* (2013.01); *G09G 3/3648* (2013.01); *H01L 27/124* (2013.01); *H01L 27/1225* (2013.01); *H01L 27/1244* (2013.01); *H01L 27/1262* (2013.01); *H01L 29/66969* (2013.01); *H01L 29/7869* (2013.01); *G02F 1/1368* (2013.01);
  (Continued)

(58) Field of Classification Search
  CPC .. G09G 3/3614; G09G 3/3648; G09G 3/3607; G09G 3/3659; G09G 3/3685; G09G 3/3696; G09G 3/3688
  See application file for complete search history.

(56) References Cited

U.S. PATENT DOCUMENTS

6,127,998 A    10/2000  Ichikawa et al.
6,940,484 B2    9/2005  Yatabe
(Continued)

FOREIGN PATENT DOCUMENTS

CN    001187632 A    7/1998
CN    001979318 A    6/2007
(Continued)

OTHER PUBLICATIONS

Chinese Office Action (Application No. 201880012368.6) dated Mar. 1, 2021.
(Continued)

*Primary Examiner* — Gerald Johnson
(74) *Attorney, Agent, or Firm* — Robinson Intellectual Property Law Office; Eric J. Robinson

(57) ABSTRACT

A display device that is suitable for increasing in size is achieved. Three or more source lines are provided for each pixel column. Video signals having the same polarity are input to adjacent source lines during one frame period. Dot inversion driving is used to reduce a flicker, crosstalk, or the like.

10 Claims, 48 Drawing Sheets

Related U.S. Application Data continuation of application No. 15/891,573, filed on Feb. 8, 2018, now Pat. No. 10,573,261.

(51) Int. Cl.

| | | |
|---|---|---|
| *H01L 29/786* | (2006.01) | |
| *H01L 29/66* | (2006.01) | |
| *G02F 1/1362* | (2006.01) | |
| *H01L 21/02* | (2006.01) | |
| *G02F 1/1335* | (2006.01) | |
| *G02F 1/1368* | (2006.01) | |
| *H01L 21/027* | (2006.01) | |
| *H01L 21/4763* | (2006.01) | |
| *H01L 29/24* | (2006.01) | |
| *H01L 21/465* | (2006.01) | |
| *H01L 21/67* | (2006.01) | |

(52) U.S. Cl.
CPC .... *G02F 1/13685* (2021.01); *G02F 1/133512* (2013.01); *G02F 1/136295* (2021.01); *G09G 2300/0417* (2013.01); *G09G 2300/0426* (2013.01); *G09G 2310/0297* (2013.01); *G09G 2320/0223* (2013.01); *H01L 21/0274* (2013.01); *H01L 21/02565* (2013.01); *H01L 21/02581* (2013.01); *H01L 21/02631* (2013.01); *H01L 21/02675* (2013.01); *H01L 21/465* (2013.01); *H01L 21/47635* (2013.01); *H01L 21/67115* (2013.01); *H01L 27/1255* (2013.01); *H01L 27/1274* (2013.01); *H01L 29/24* (2013.01)

(56) References Cited

U.S. PATENT DOCUMENTS

| | | | | |
|---|---|---|---|---|
| 7,834,868 B2* | 11/2010 | Lee | ............... | G09G 3/3614 |
| | | | | 345/209 |
| 8,514,160 B2 | 8/2013 | Huang et al. | | |
| 2007/0120810 A1* | 5/2007 | You | ............... | G09G 3/3666 |
| | | | | 345/103 |
| 2007/0132684 A1 | 6/2007 | Baek et al. | | |
| 2009/0033818 A1 | 2/2009 | Nakajima et al. | | |
| 2010/0045782 A1* | 2/2010 | Morita | ............... | H04N 13/156 |
| | | | | 348/51 |
| 2010/0295844 A1 | 11/2010 | Hayashi | | |
| 2011/0241526 A1* | 10/2011 | Huang | ............... | G09G 3/3648 |
| | | | | 313/307 |
| 2011/0299003 A1 | 12/2011 | Arasawa et al. | | |
| 2012/0268481 A1* | 10/2012 | Niioka | ............... | G02B 30/27 |
| | | | | 345/619 |
| 2014/0092355 A1 | 4/2014 | Teranuma et al. | | |
| 2016/0225330 A1 | 8/2016 | Park et al. | | |
| 2017/0011680 A1* | 1/2017 | Miyata | ............... | G09G 3/3696 |
| 2018/0196322 A1 | 7/2018 | Yamazaki et al. | | |
| 2018/0203319 A1 | 7/2018 | Yamazaki et al. | | |
| 2018/0204532 A1 | 7/2018 | Kobayashi et al. | | |
| 2018/0226034 A1 | 8/2018 | Takahashi | | |

FOREIGN PATENT DOCUMENTS

| | | |
|---|---|---|
| CN | 101894514 A | 11/2010 |
| CN | 101937634 A | 1/2011 |
| CN | 105842943 A | 8/2016 |
| EP | 0837445 A | 4/1998 |
| EP | 1174853 A | 1/2002 |
| EP | 3054445 A | 8/2016 |
| JP | 02-214818 A | 8/1990 |
| JP | 10-177162 A | 6/1998 |
| JP | 2001-053283 A | 2/2001 |
| JP | 2007-156483 A | 6/2007 |
| JP | 2012-014168 A | 1/2012 |
| KR | 10-0559225 | 3/2006 |
| KR | 2016-0095697 A | 8/2016 |
| TW | 201135331 | 10/2011 |
| WO | WO-2012/147950 | 11/2012 |
| WO | WO-2018/130920 | 7/2018 |

OTHER PUBLICATIONS

Kumakura.T et al., "Development of Super Hi-Vision 8Kx4K Direct-View LCD for Next Generation TV", SID Digest '12 : SID International Symposium Digest of Technical Papers, Jun. 5, 2012, vol. 43, No. 1, pp. 780-783.

Kumakura.T et al., "Development of a Novel Wide-Gamut 8K 120Hz LCD Complying with ITU-R BT.2020", SID Digest '15 : SID International Symposium Digest of Technical Papers, Jun. 2, 2015, pp. 1070-1073.

International Search Report (Application No. PCT/IB2018/050722) dated May 1, 2018.

Written Opinion (Application No. PCT/IB2018/050722) dated May 1, 2018.

\* cited by examiner

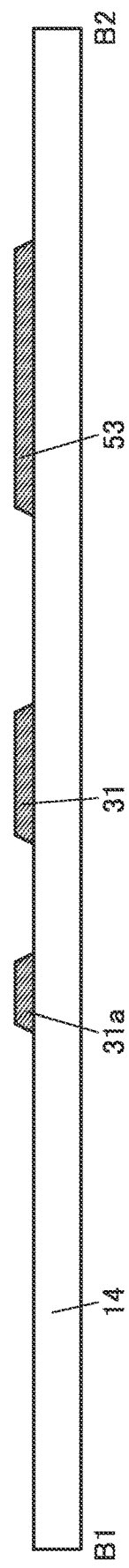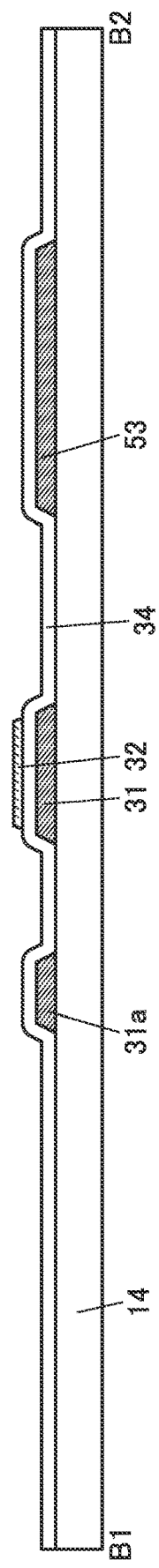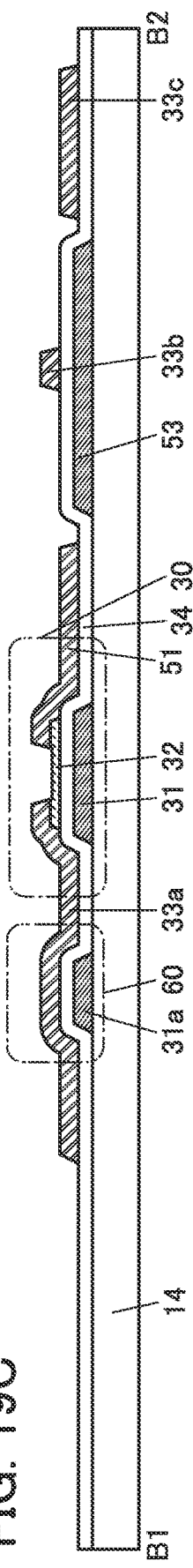

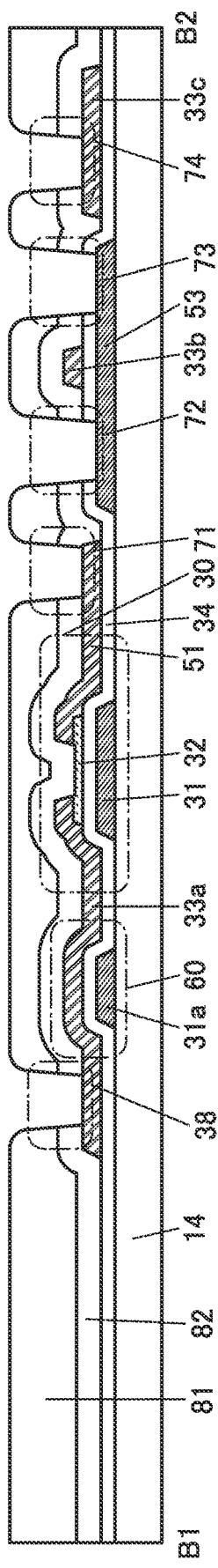
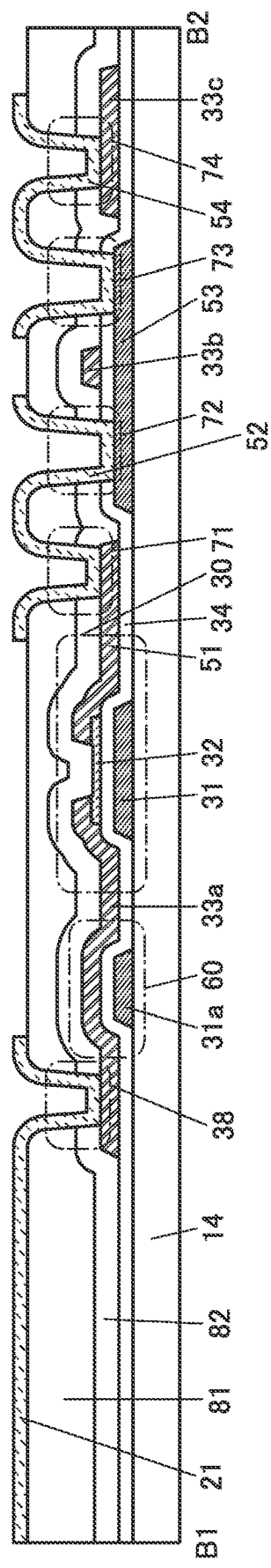
FIG. 20A
FIG. 20B

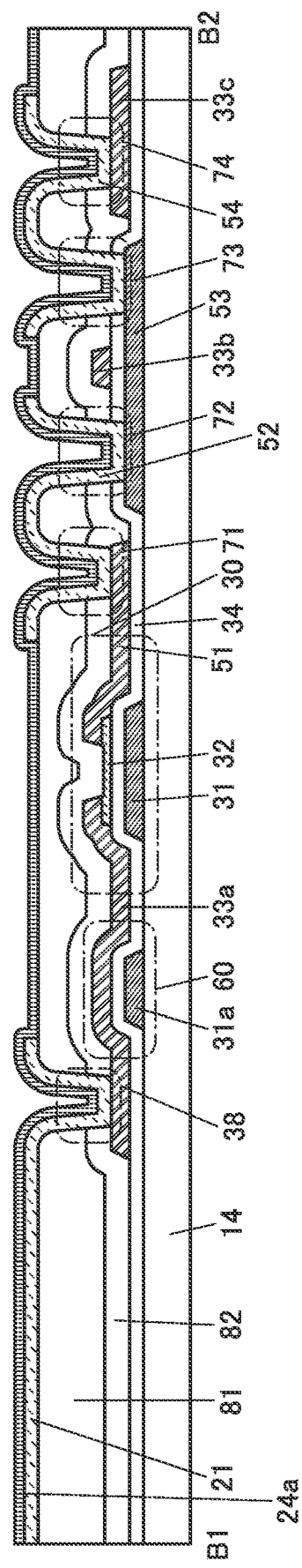
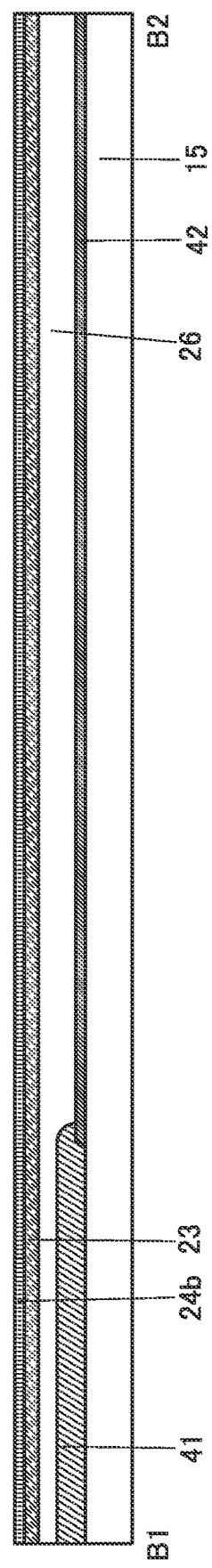
FIG. 21A
FIG. 21B

200b

200b

200b

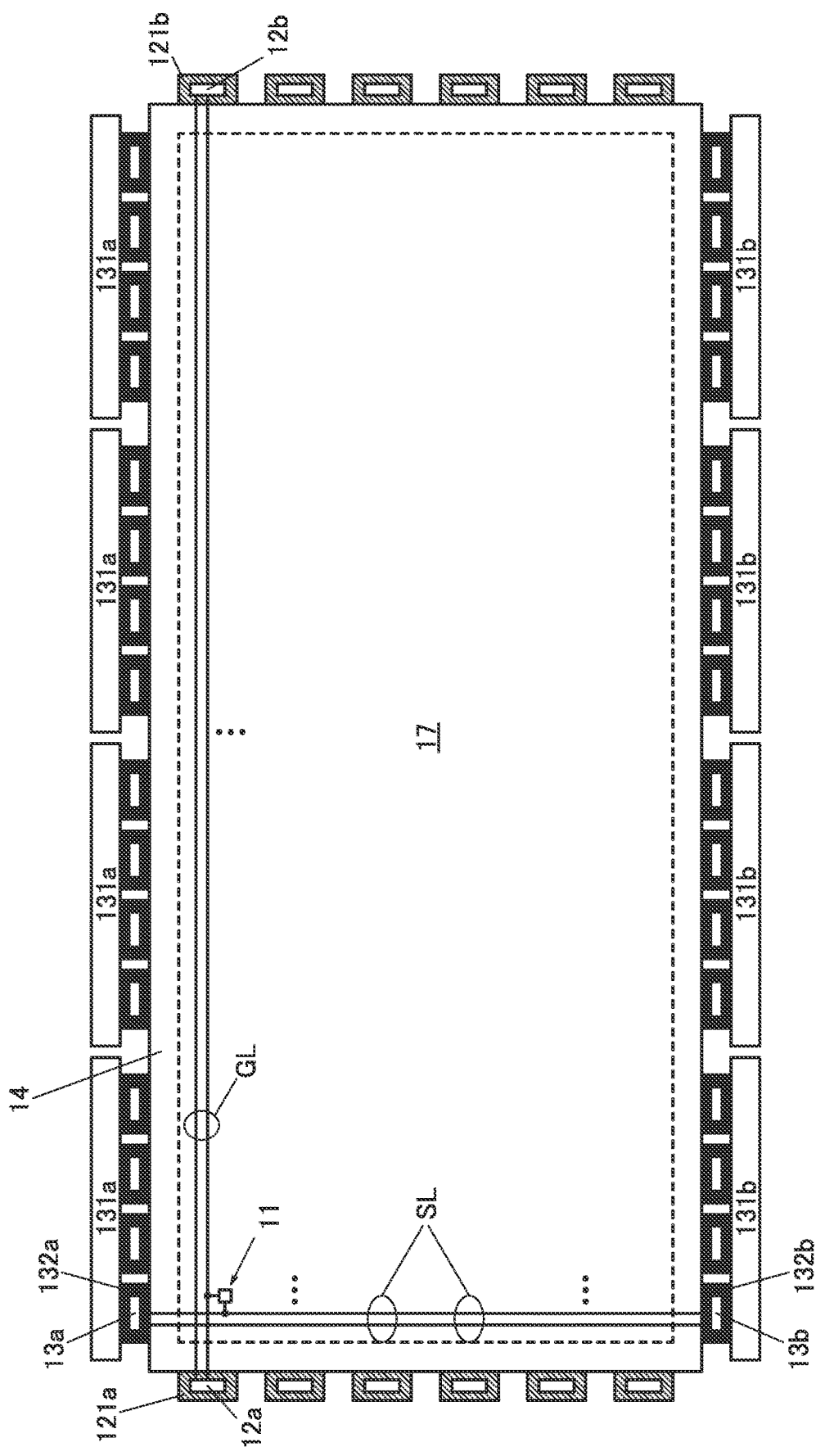

DISPLAY DEVICE

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device refers to any device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

In recent years, a high-resolution display device has been required. For example, full high-definition (the number of pixels is 1920×1080) has been in the mainstream of home-use television devices (also referred to as televisions or television receivers), while high-resolution display devices such as a 4K (the number of pixels is 3840×2160) display and an 8K (the number of pixels is 7680×4320) display have been developed.

A liquid crystal display device is known as a kind of display devices. A transmissive liquid crystal display device adjusts the amount of light from a backlight to be transmitted and shows contrast to display an image by utilizing optical modulation action of a liquid crystal.

As a kind of field-effect transistors, a thin film transistor whose channel formation region is formed using a semiconductor film that is formed over a substrate having an insulating surface is known. Patent Document 1 discloses a technique in which amorphous silicon is used for a semiconductor film that is used in a channel formation region of a thin film transistor. For example, in a liquid crystal display device, a thin film transistor is used as a switching transistor in each pixel.

REFERENCE

Patent Document

[Patent Document 1] Japanese Published Patent Application No. 2001-053283

DISCLOSURE OF INVENTION

An increase in the resolution or screen size of a display device such as a television device or a monitor device causes a significant increase in the load of a transistor or the like included in the display device. This might make operation at a high driving frequency difficult particularly when the field-effect mobility of the transistor is low.

An object of is to provide a high-resolution display device and a method of manufacturing the display device. Another object is to achieve a display device that is suitable for increasing in size and a method of manufacturing the display device. Another object of is to provide an inexpensive display device and a method of manufacturing the display device. Another object of is to provide a highly reliable display device and a method of manufacturing the display device. Another object of is to provide a display device using a metal oxide or the like and a method of manufacturing the display device. Another object of is to provide a novel display device and a method of manufacturing the display device.

Note that the description of these objects does not disturb the existence of other objects. In one embodiment of the present invention, there is no need to achieve all the objects. Note that other objects can be derived from the description of the specification, the drawings, the claims, and the like.

One embodiment of the present invention is a display device including a plurality of gate lines, a plurality of source lines, and a display portion. The display portion includes a plurality of pixels arranged in m rows and n columns (m and n are each an integer greater than or equal to 2). A plurality of pixels each include a transistor and a display element. The plurality of pixels arranged in an i-th row are electrically connected to an i-th gate line (i is an integer greater than or equal to 1 and less than or equal to m). The display device includes g source lines for each column. Among g source lines arranged in a j-th column and g source lines arranged in a j+1-th column, the g source lines supplying signals having the same polarity are provided adjacent to each other. Note that g is preferably greater than or equal to 3.

In the above, at least one of the g adjacent source lines is electrically connected to one or more of the plurality of pixels in the j-th column. At least another one of the g adjacent source lines is electrically connected to one or more of the plurality of pixels in the j+1-th column. Signals having the same polarity are supplied to the g adjacent source lines during one frame period. Signals are supplied to every f of the plurality of gate lines at one time. Note that f is preferably greater than or equal to 3.

The above display device is preferably operated by dot inversion driving.

The semiconductor layer in the transistor may include an amorphous silicon or a metal oxide.

According to one embodiment of the present invention, a display device that is suitable for increasing in size and a method of manufacturing the display device can be provided. A high-resolution display device and a method of manufacturing the display device can be provided. An inexpensive display device and a method of manufacturing the display device can be provided. A highly reliable display device and a method of manufacturing the display device can be provided. A display device using a metal oxide or the like and a method of manufacturing the display device can be provided. A novel display device and a method of manufacturing the display device can be provided.

Note that the description of these effects does not preclude the existence of other effects. One embodiment of the present invention does not necessarily achieve all the effects listed above. Other effects can be derived from the description of the specification, the drawings, the claims, and the like.

BRIEF DESCRIPTION OF DRAWINGS

FIGS. 19A to 19C illustrate an example of a method of manufacturing the display device.
FIGS. 20A and 20B illustrate an example of a method of manufacturing the display device.
FIGS. 21A and 21B illustrate an example of a method of manufacturing the display device.
FIG. 45 illustrates a structural example of a display panel.

BEST MODE FOR CARRYING OUT THE INVENTION

Figure 1A:
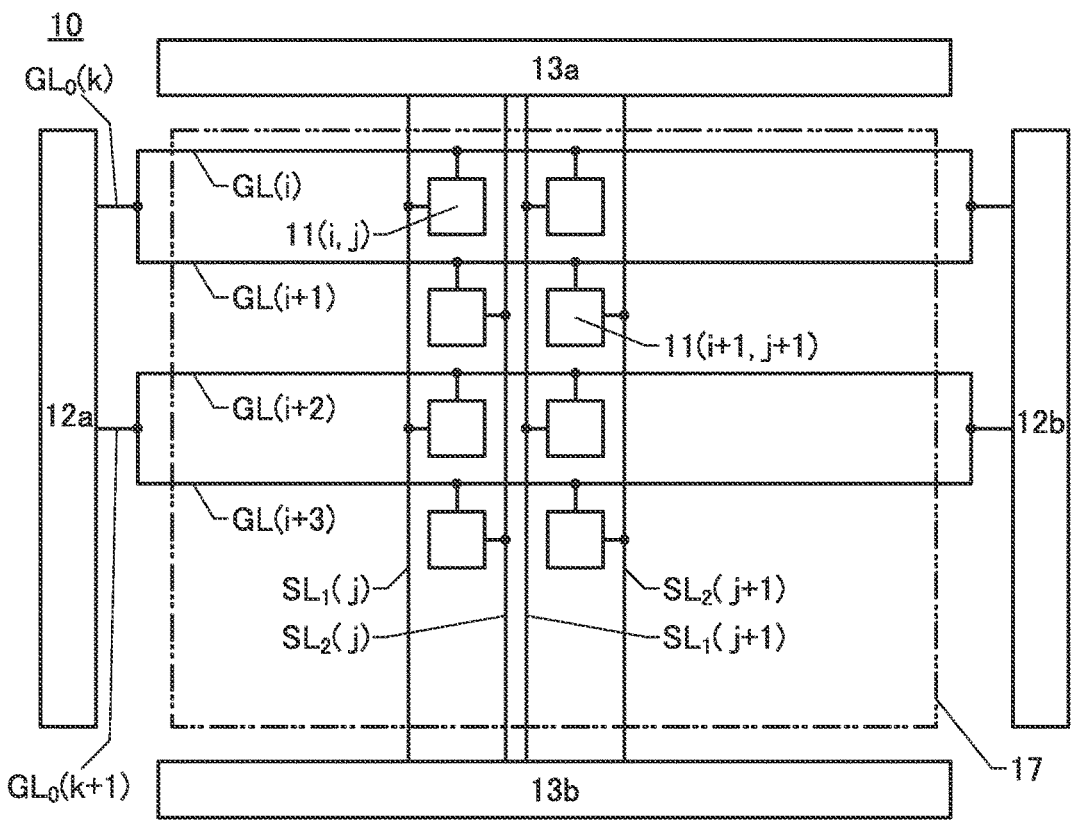
FIGS. 1A and 1B illustrate structural examples of a display device.

Embodiments will be described in detail with reference to the drawings. Note that the present invention is not limited to the following description. It will be readily understood by those skilled in the art that modes and details of the present invention can be modified in various ways without departing from the spirit and scope of the present invention. Thus, the present invention should not be construed as being limited to the description in the following embodiments.

Note that in the structures of the present invention described below, the same portions or portions having similar functions are denoted by the same reference numerals in different drawings, and description thereof is not repeated. The same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT) in its category.

Furthermore, functions of a source and a drain might be switched when a transistor of opposite polarity is employed or a direction of current flow is changed in circuit operation, for example. Therefore, the terms "source" and "drain" can be switched in this specification.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, a coil, a capacitor, and an element with a variety of functions as well as an electrode and a wiring.

In this specification and the like, a display panel as one embodiment of the display device has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing the contact, press, approach, or the like of an object such as a finger or a stylus. In addition, the touch sensor may have a function of sensing the positional information. Therefore, the touch sensor is one embodiment of an input device. For example, the touch sensor can include one or more sensor elements.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an IC is mounted on a substrate by a COG method or the like is referred to as a touch sensor panel module, a touch sensor module, or a sensor module, or simply referred to as a touch sensor or the like in some cases.

Note that in this specification and the like, a touch panel which is one embodiment of the display device has a function of displaying (outputting) an image or the like on (to) a display surface and a function as a touch sensor capable of sensing contact, press, approach, or the like of an object such as a finger or a stylus on or to the display surface. Therefore, the touch panel is an embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel or on a surface of the display panel.

In this specification and the like, a structure in which a connector such as a TCP is attached to a substrate of a touch panel, or a structure in which an IC is mounted on a substrate by a COG method or the like is referred to as a touch panel module or a display module, or simply referred to as a touch panel or the like in some cases.

Embodiment 1

In this embodiment, a display device of one embodiment of the present invention is described.

One embodiment of the present invention is a display device including a display portion where a plurality of pixels are provided in a matrix. In the display portion, a plurality of wirings to which selection signals are supplied (also referred to as gate lines or scan lines) and a plurality of wirings to which signals written to pixels (also referred to as video signals or the like) are supplied (also referred to as source lines, signal lines, data lines, or the like) are provided.

The plurality of gate lines extend in the row direction (also referred to as a "first direction") and the plurality of source lines extend in the column direction (also referred to as a "second direction"). In a display portion 17, at least one of the plurality of gate lines and at least one of the plurality of source lines include a region where they overlap with each other.

One pixel includes at least one transistor and one display element. The display element includes a conductive layer having a function as a pixel electrode. The conductive layer is electrically connected to one of a source and a drain of the transistor. A gate of the transistor is electrically connected to a gate line. The other of the source and the drain is electrically connected to a source line.

The same selection signals are preferably supplied to two adjacent gate lines. That is, selection periods of these gate lines are preferably the same. In particular, three gate lines are preferably regarded as a group, in which case the structure of a driver circuit can be simplified.

In the case where the same selection signals are supplied to two gate lines, two pixels which are adjacent to each other in the column direction are concurrently selected. Thus, different source lines are connected to the two pixels. That is, two source lines are provided for each column.

With the structure in which two source lines are provided for each column, one horizontal period can be longer than the conventional one. For example, in the case where two gate lines are supplied with the same selection signals, the length of one horizontal period can be twice the length of the conventional one. In the case where three gate lines are supplied with the same selection signals, the length of one horizontal period can be three times the length of the conventional one. Furthermore, since the number of pixels 11 electrically connected to one source line is reduced, an output load of a source driver can be reduced.

Thus, even a significantly high-resolution display device such as a 4K display or an 8K display can be operated with use of a transistor with a low field-effect mobility. Needless to say, even a display device with a resolution exceeding 8K (for example, 10K, 12K, or 16K) can be operated according to one embodiment of the present invention. A large display device with a diagonal screen size of 50 inches or larger, 60 inches or larger, or 70 inches or larger can also be easily achieved according to one embodiment of the present invention.

In the case where four source lines are provided for each column, two source lines can be provided on the left side of a pixel and two source lines can be provided on the right side of the pixel. In other words, a source line can be provided on each of the outer left, inner left, inner right, and outer right sides of a pixel. In this structure, a source of a transistor which is electrically connected to the source line on the outer left side of a pixel intersects with the source line on the inner left side of the pixel. Also in this structure, a source of a transistor which is electrically connected to the source line on the outer right side of a pixel intersects with the source line on the inner right side of the pixel. According to one embodiment of the present invention, a short-circuit between the source of a transistor which is electrically connected to the source line on the outer left side of a pixel and the source line on the inner left side of the pixel is prevented with the use of a conductive layer that can be formed in the same step as a pixel electrode and a conductive layer that can be formed in the same step as a gate of the transistor. Also according to one embodiment of the present invention, a short-circuit between the source of a transistor which is electrically connected to the source line on the outer right side of a pixel and the source line on the inner right side of the pixel is prevented with the use of a conductive layer that can be formed in the same step as a pixel electrode and a conductive layer that can be formed in the same step as a gate of the transistor. Thus, even the structure including four source lines for each column can be obtained by steps the number of which is similar to that of the steps of obtaining the structure including one or two source lines for each column, or more specifically, the four source lines can be provided without increasing the number of photolithography steps. That is, the four source lines can be provided without increasing the number of photomasks. Accordingly, an increase in the manufacturing cost of the display device can be suppressed.

More specific examples of the display device are described below with reference to drawings.

Structural Examples of Display Device

FIG. 1A is a block diagram of a display device 10 of one embodiment of the present invention. The display device 10 includes the display portion 17, a gate driver 12a, a gate driver 12b, a source driver 13a, and a source driver 13b. In the display portion 17, a plurality of pixels 11 are arranged in a matrix of m rows and n columns. Note that m and n are each an integer greater than or equal to 2. In this specification and the like, the pixel 11 in the i-th row and the j-th column is referred to as a pixel 11(i, j). Note that i is an integer greater than or equal to 2 and less than or equal to m. Note that j is an integer greater than or equal to 2 and less than or equal to n. One or both of a gate driver and a source driver is referred to as a "driver circuit" in some cases.

FIG. 1A shows an example in which the gate driver 12a and the gate driver 12b are provided to face each other with the display portion 17 provided therebetween. A plurality of gate lines $GL_0$ are connected to the gate driver 12a and the gate driver 12b. In this specification and the like, a k-th wiring $GL_0$ is referred to as a wiring $GL_0(k)$. Note that k is an integer greater than or equal to 1.

In FIG. 1A, the wiring $GL_0(k)$ is electrically connected to two wirings GL (a wiring GL(i) and a wiring GL(i+1)). Accordingly, the two wirings GL are supplied with the same selection signals. Note that the wiring $GL_0$ and the wiring GL each have a function as a gate line. In this specification and the like, an i-th wiring GL is referred to as a wiring GL(i).

The gate driver 12a and the gate driver 12b have a function of supplying the same selection signal to one wiring $GL_0$. Accordingly, the charge and discharge time of the wirings $GL_0$ can be reduced as compared to that in the display device 10 including only one gate driver. Thus, even a significantly high-resolution display device such as a 4K display or an 8K display can be operated with use of a transistor with a low field-effect mobility. Furthermore, a large display device with a diagonal screen size of 50 inches or larger, 60 inches or larger, or 70 inches or larger can be easily achieved.

FIG. 1A shows an example in which the source driver 13a and the source driver 13b are provided to face each other with the display portion 17 provided therebetween. In addition, 2×n wirings SL are connected to the source driver 13a and the source driver 13b. In FIG. 1A, two wirings SL are provided for each pixel column. In the case where g wirings SL are provided for each pixel column (g is an integer greater than or equal to 2), g×n wirings SL are connected to the source driver 13a and the source driver 13b.

In FIG. 1A, two wirings SL for the pixel column in the j-th column are denoted by a wiring $SL_1(j)$ and a wiring $SL_2(j)$. Different signals can be supplied to different wirings SL. For example, different signals can be supplied to the wiring $SL_1(j)$ and the wiring $SL_2(j)$. Note that each wiring SL has a function as a source line.

The source driver 13a and the source driver 13b have a function of supplying the same selection signal to one wiring SL. Accordingly, the charge and discharge time of the wirings SL can be reduced as compared to that in the display device 10 including only one source driver. Thus, even a significantly high-resolution display device such as a 4K display or an 8K display can be operated with use of a transistor with a low field-effect mobility. Furthermore, a large display device with a diagonal screen size of 50 inches or larger, 60 inches or larger, or 70 inches or larger can be easily achieved.

Although two gate drivers and two source drivers are placed in the example in FIG. 1A, the number of gate drivers and/or source drivers may be one.

One pixel 11 corresponds to one color. In the case where color display is performed by utilizing mixture of light emitted from a plurality of pixels, the pixel 11 can be called a sub-pixel.

Full-color display can be achieved by making the pixel 11 that controls red light, the pixel 11 that controls green light, and the pixel 11 that controls blue light collectively function as one pixel and by controlling the amount of light (emission luminance) emitted from each pixel 11. Thus, the three pixels 11 each function as a sub-pixel. That is, three sub-pixels control, for example, the amount of light of red light, green light, and blue light. The light colors controlled by the three sub-pixels are not limited to red (R), green (G), and blue B and may be cyan (C), magenta (M), and yellow (Y).

Four sub-pixels may collectively function as one pixel. For example, a sub-pixel that controls white light may be added to the three sub-pixels that control red light, green light, and blue light. The addition of the sub-pixel that controls white light can increase the luminance of a display region. Alternatively, a sub-pixel that controls yellow light may be added to the three sub-pixels that control red light, green light, and blue light. Alternatively, a sub-pixel that controls white light may be added to the three sub-pixels that control cyan light, magenta light, and yellow light.

When sub-pixels that control light of colors such as red, green, blue, cyan, magenta, and yellow are combined as appropriate with more sub-pixels functioning as one pixel, the reproducibility of halftones can be increased. Thus, the display quality can be improved.

Using the pixels arranged in a matrix of 1920×1080, the display device 10 can achieve full color display with full high definition (also referred to as 2K resolution, 2K1K, 2K, and the like). Using the pixels arranged in a matrix of 3840×2160, the display device 10 can achieve full color display with ultra high definition (also referred to as 4K resolution, 4K2K, 4K, and the like). Using the pixels arranged in a matrix of 7680×4320, the display device 10 can achieve full color display with super high definition (also referred to as 8K resolution, 8K4K, 8K, and the like). Using a larger number of pixels, the display device 10 can achieve full color display with 16K or 32K resolution.

Furthermore, pixels provided in the column direction preferably emit light of the same color. In the case where a liquid crystal element is used as a display element, the pixels provided in the column direction are preferably provided with coloring layers that transmit light of the same color to overlap with the liquid crystal elements.

In the case where a transistor with a low field-effect mobility is used, a display portion of a display device may be divided into a plurality of display regions and driven. In the above method, a boundary portion between divided pixel regions might be visually recognized owing to, for example, variations in characteristics of a driver circuit, which decreases the visibility in some cases. In addition, image processing or the like for dividing in advance image data to be input is necessary; thus, a large-scale image processing device that can operate at a high speed is required.

By contrast, the display device of one embodiment of the present invention can be driven without dividing the display region into a plurality of display regions even when including a transistor with a relatively low field-effect mobility.

Figure 1B:
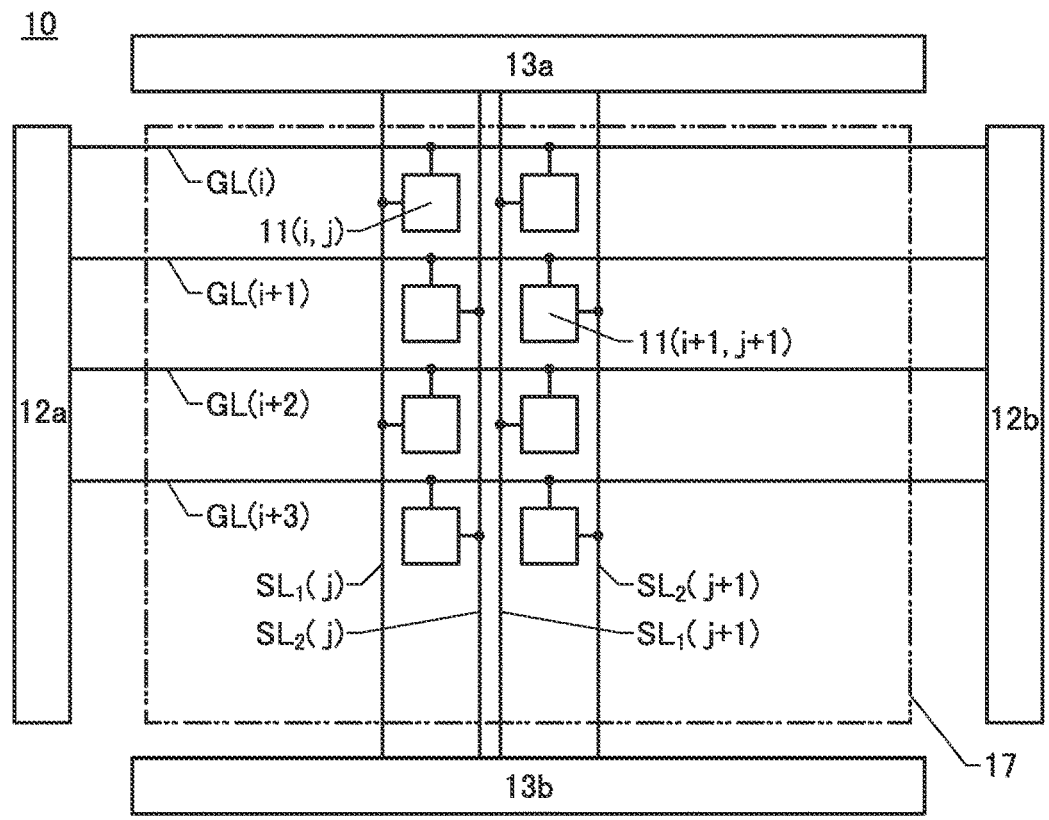

As illustrated in FIG. 1B, the gate driver 12a and the gate driver 12b may be connected to the wirings GL while the wirings $GL_0$ are omitted.

Figure 2:
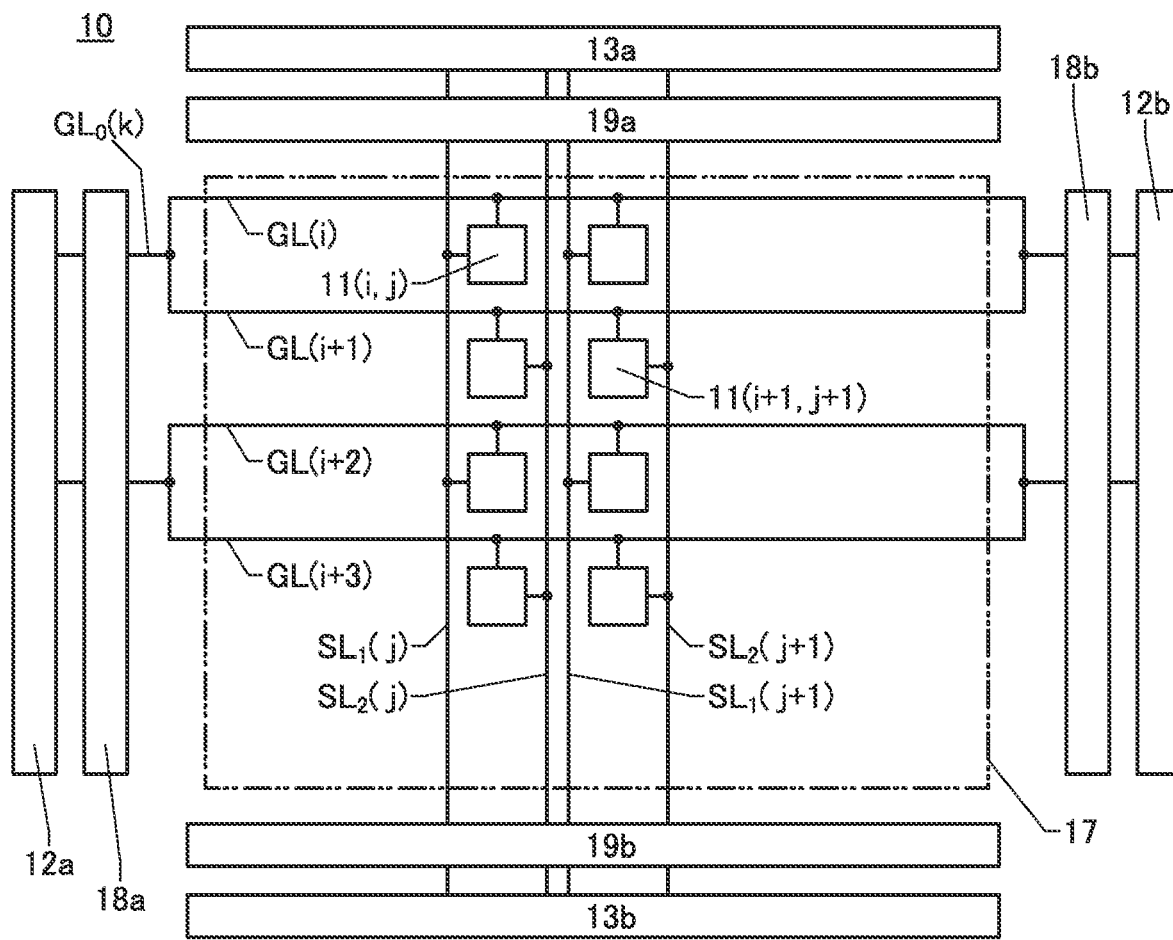
FIG. 2 illustrates a structural example of a display device.

A protective circuit may be provided in the display device 10. FIG. 2 is a block diagram showing the case where a protective circuit 18a, a protective circuit 18b, a protective circuit 19a, and a protective circuit 19b are provided in the display device 10 having the structure in FIG. 1A. The wirings $GL_0$ are electrically connected to the protective circuit 18a or the protective circuit 18b. The protective circuit 19a and the protective circuit 19b are electrically connected to the wirings SL (the wirings $SL_1$ and $SL_2$).

The protective circuit 18a can be provided on the gate driver 12a side, and the protective circuit 18b can be provided on the gate driver 12b side. In other words, the protective circuit 18a and the protective circuit 18b can be provided to face each other with the display portion 17 provided therebetween. The protective circuit 19a can be provided on the source driver 13a side, and the protective circuit 19b can be provided on the source driver 13b side. In other words, the protective circuit 19a and the protective circuit 19b can be provided to face each other with the display portion 17 provided therebetween.

With the protective circuit provided in the display device 10, the pixels 11 can be protected from noise, surge, electrostatic discharge, and the like. This leads to higher reliability of the display device 10.

Figure 3:
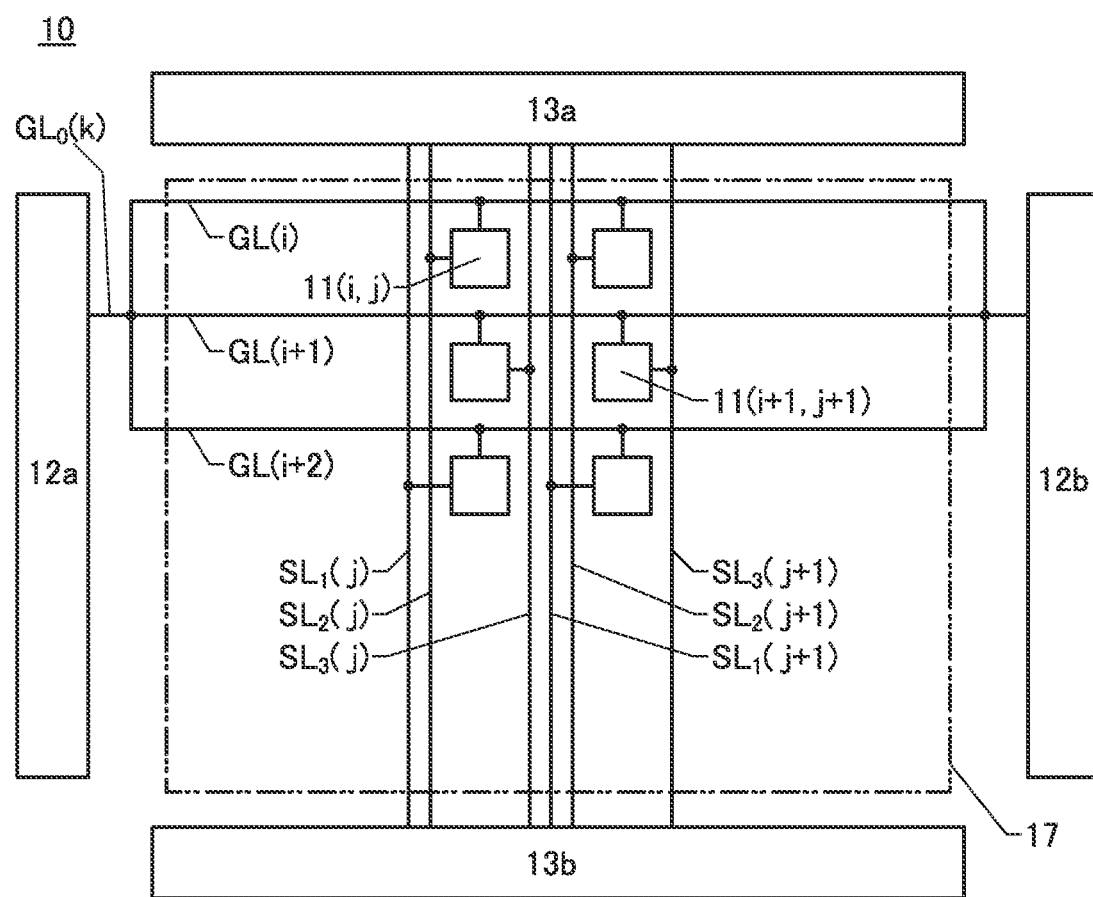
FIG. 3 illustrates a structural example of a display device.

Although two source lines are provided for each pixel column in the example in FIG. 1A, one embodiment of the present invention is not limited to this example. FIG. 3 illustrates a structure in which three source lines (wirings $SL_1$, $SL_2$, and $SL_3$) are provided for each pixel column. In the display device 10 in FIG. 3, the wiring $GL_0(k)$ is electrically connected to three wirings GL (wirings GL(i), GL(i+1), and GL(i+2)), and the same selection signals are supplied to these three wirings.

Figure 4:
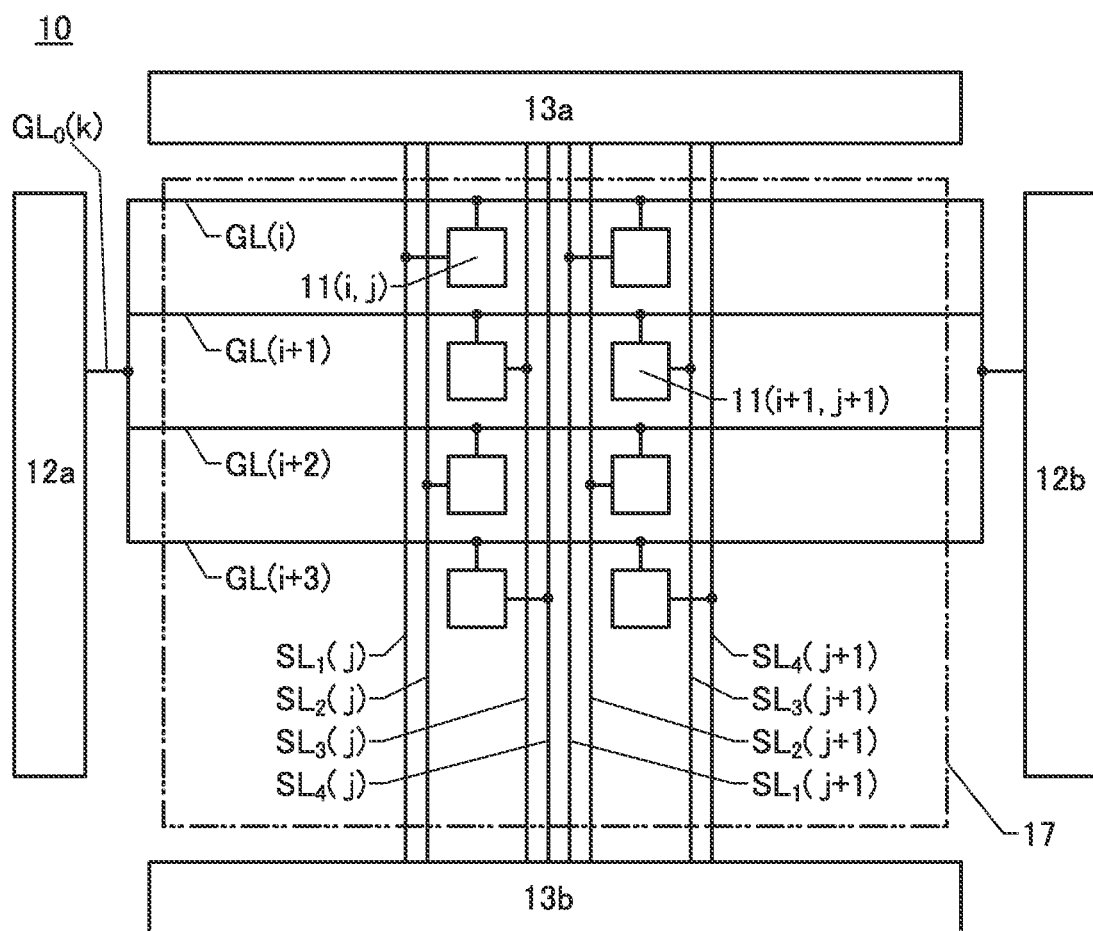
FIG. 4 illustrates a structural example of a display device.

FIG. 4 illustrates a structure in which four source lines (wirings $SL_1$, $SL_2$, $SL_3$, and $SL_4$) are provided for each pixel column. In the display device 10 in FIG. 4, the wiring $GL_0(k)$ is electrically connected to four wirings GL (wirings GL(i), GL(i+1), GL(i+2), and GL(i+3)), and the same selection signals are supplied to these four wirings. Needless to say, five or more source lines may be provided for each pixel column in one embodiment of the present invention.

Figure 5:
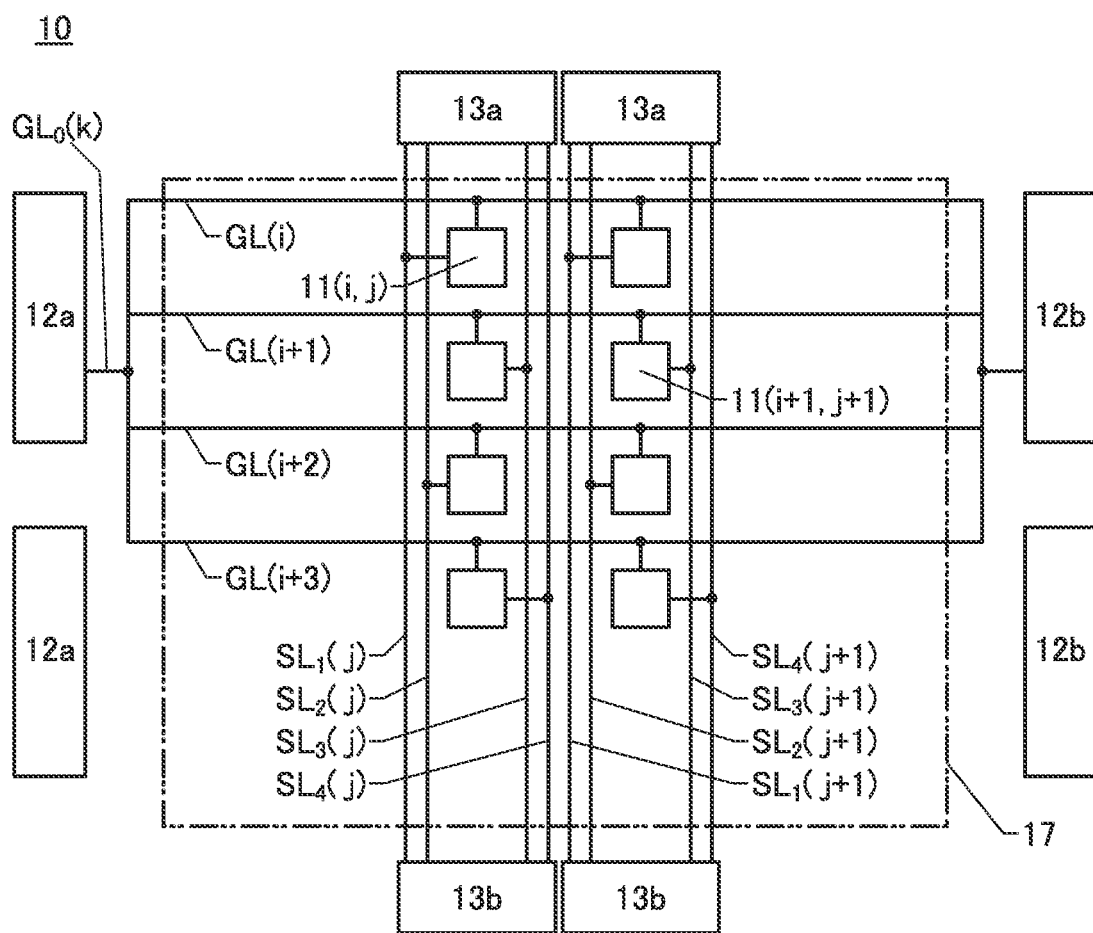
FIG. 5 illustrates a structural example of a display device.

FIG. 5 shows an example in which one source driver 13a and one source driver 13b are provided for each pixel column. In other words, the source drivers 13a equal in number to the pixel columns are provided along one side of the rectangular display portion 17, and the source drivers 13b equal in number to the pixel columns are provided with the display portion 17 provided between the source drivers 13a and 13b. In the example in FIG. 5, one gate driver 12a and one gate driver 12b are provided for each wiring $GL_0$.

In the display device 10 of the example shown in FIG. 5, where four source lines are provided for each pixel column, the gate drivers 12a whose number is obtained by dividing the number of pixel rows by 4 are provided along one side of the rectangular display portion 17, and the gate drivers 12b whose number is obtained by dividing the number of pixel rows by 4 are provided with the display portion 17 provided between the gate drivers 12a and 12b. Such a structure illustrated in FIG. 5 can reduce the load of the gate drivers, so that display unevenness due to a potential drop caused by wiring resistance can be suppressed even in a large display device.

In the display device 10, a reference voltage generation circuit can be provided. The reference voltage generation circuit has a function of generating a reference voltage for signals supplied by the source drivers. The reference voltage generation circuit can be a gamma reference generation circuit, for example.

Figure 6:
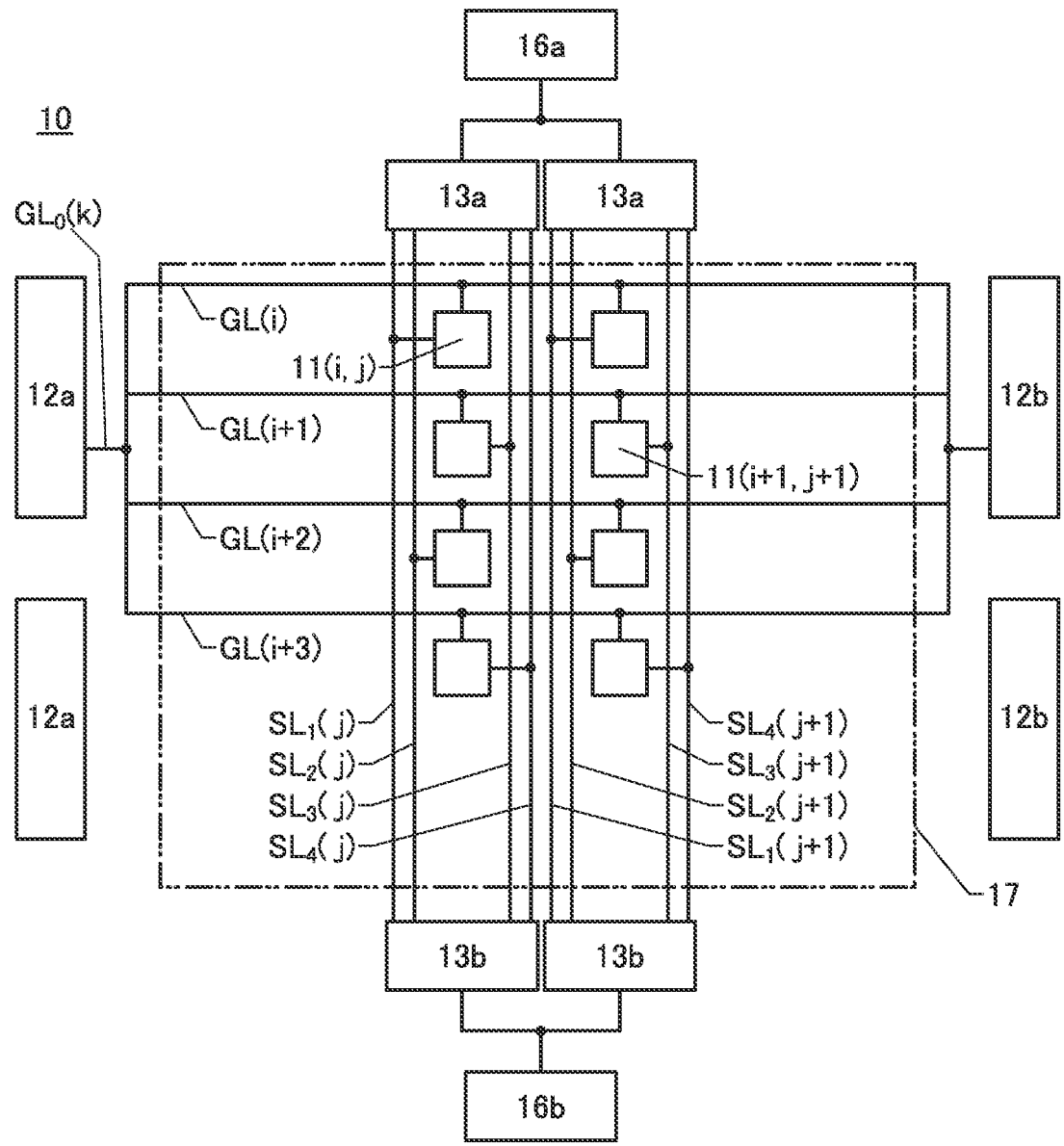
FIG. 6 illustrates a structural example of a display device.

FIG. 6 shows an example in which a reference voltage generation circuit 16a having a function of supplying a reference voltage to the source drivers 13a and a reference voltage generation circuit 16b having a function of generating a reference voltage to the source drivers 13b are provided in the display device 10 having the structure illustrated in FIG. 5. The display device 10 having the structure illustrated in FIG. 6 can improve the accuracy of a voltage of the signal generated from each source driver 13a and the accuracy of a voltage of the signal generated from each source driver 13b.

Figure 7:
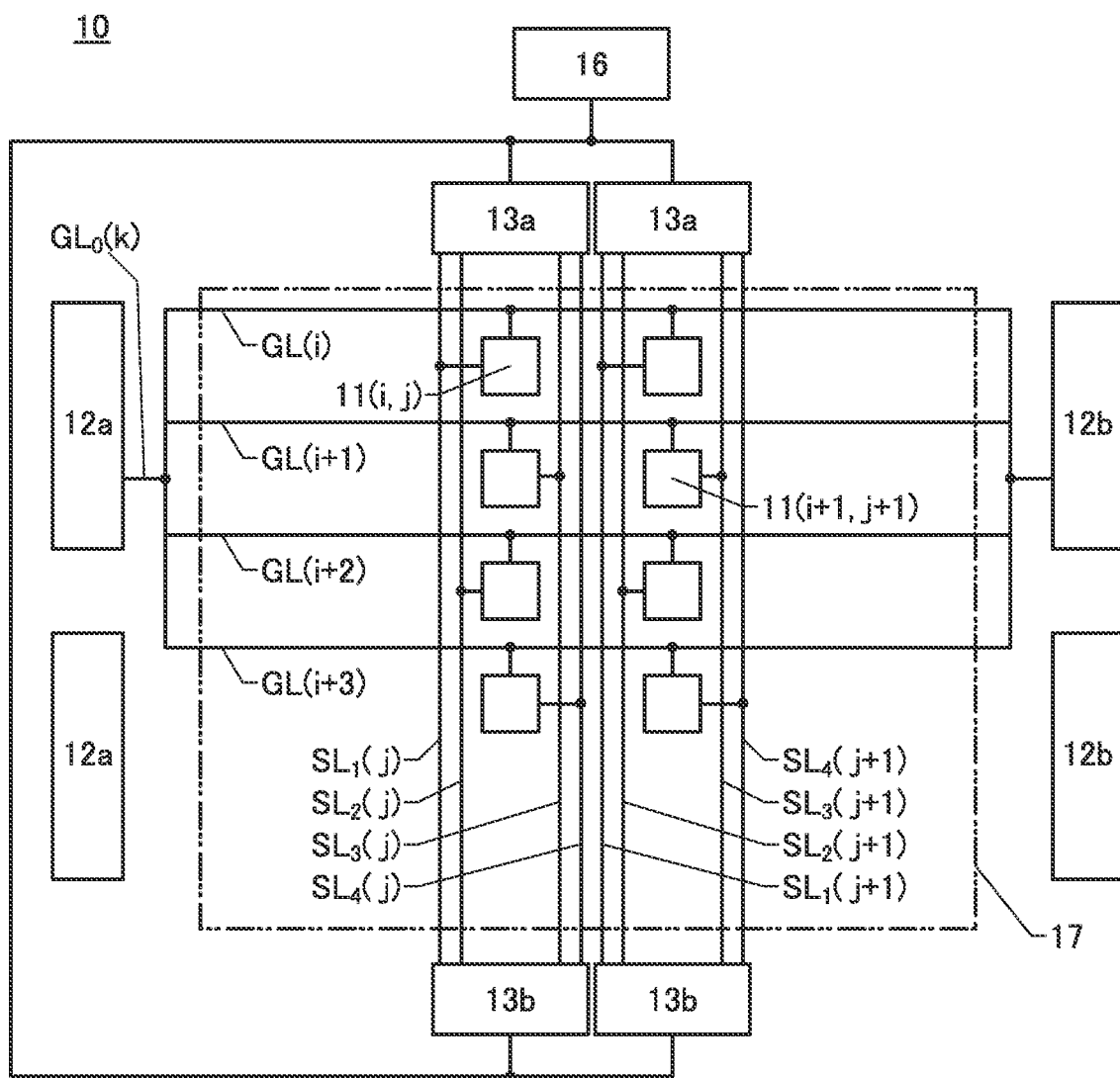
FIG. 7 illustrates a structural example of a display device.

FIG. 7 shows an example in which a reference voltage generation circuit 16 having a function of supplying a reference voltage to the source drivers 13a and the source drivers 13b provided in the display device 10 having the structure illustrated in FIG. 5. The display device 10 even having the structure illustrated in FIG. 7 can improve the accuracy of a voltage of the signal generated from each source driver 13a and the accuracy of a voltage of the signal generated from each source driver 13b.

An increase in the screen size or resolution of a display device tends to cause an increase in wiring resistance and parasitic capacitance. The increase in wiring resistance causes delay of signal transmission to an end of a wiring, distortion of a signal waveform, or the like, which results in a reduction in display quality such as display unevenness or a defect in grayscale, an increase in power consumption, or the like. The increase in parasitic capacitance generated in a wiring also causes a reduction in display quality, an increase in power consumption, or the like.

Figure 8A:
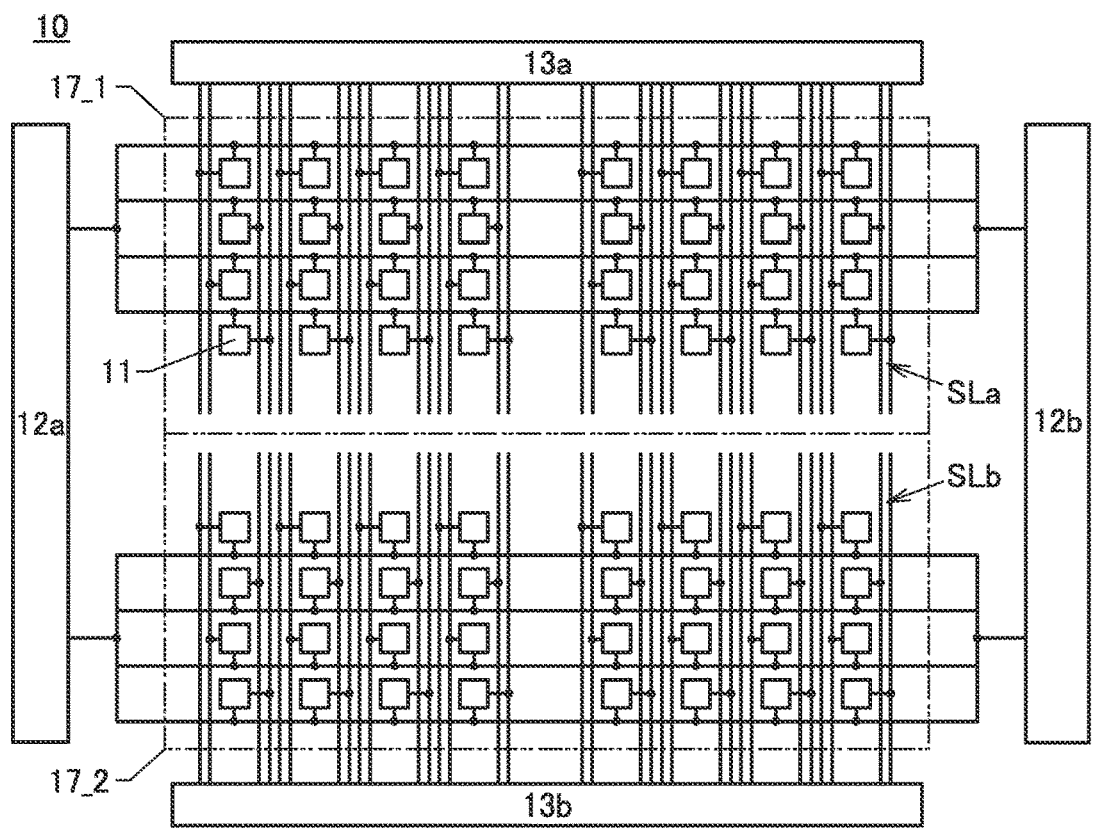
FIGS. 8A and 8B each illustrate a structural example of a display device.

To reduce the wiring resistance and the parasitic capacitance, a wiring SL may be divided in half into a wiring SLa and a wiring SLb (see FIG. 8A). In the block diagram of FIG. 8A, a region including the wiring SLa and a region including the wiring SLb in the display portion 17 are denoted by a display portion 17_1 and a display portion 17_2, respectively.

The wiring SLa is electrically connected to the source driver 13a, and the wiring SLb is electrically connected to the source driver 13b. The source driver 13a supplies a signal to the wiring SLa and the source driver 13b supplies a signal to the wiring SLb.

When a wiring SL is divided into halves, the wiring resistance and the parasitic capacitance can each be reduced by half. Thus, the influence on the signal delay and signal distortion can be reduced to one fourth. Consequently, the display quality of the display device can be improved.

Furthermore, the load of the source driver can be reduced, so that power consumption of the display device can be reduced.

Figure 8B:
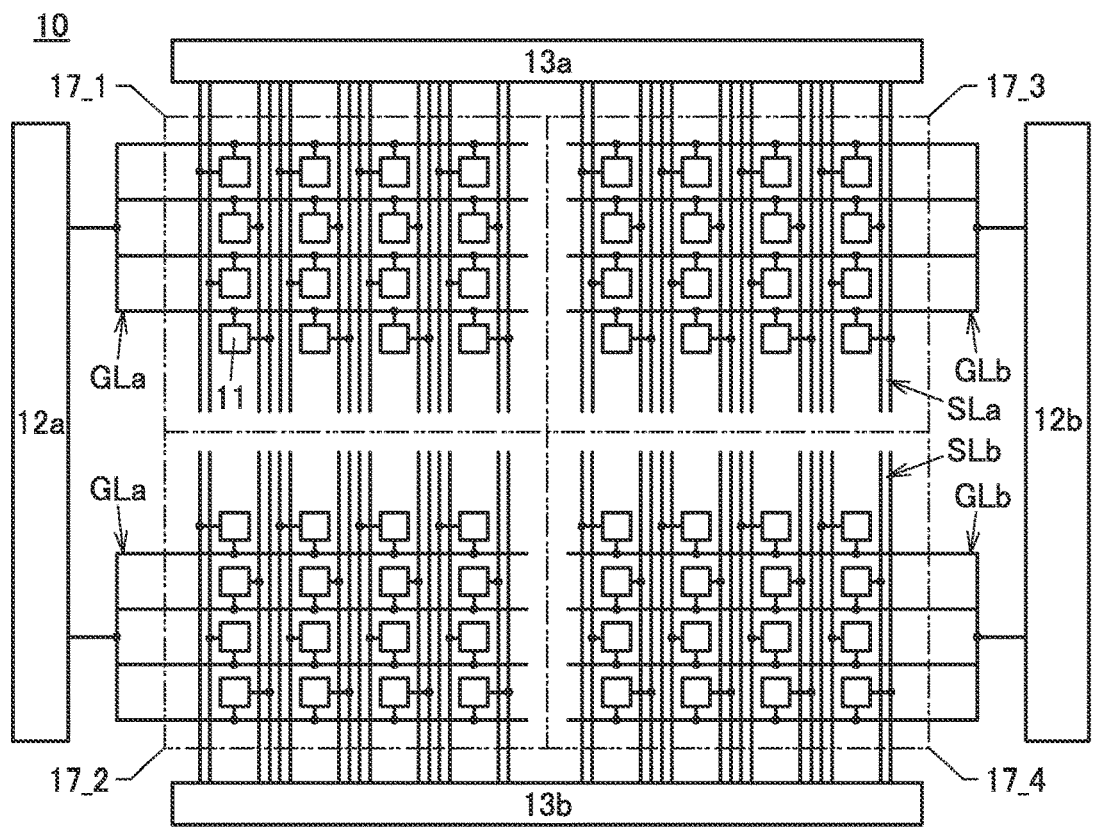

Furthermore, a wiring GL may be divided in half into a wiring GLa and a wiring GLb (see FIG. 8B). In the block diagram of FIG. 8B, a region including the wirings SLa and GLa, a region including the wirings SLb and GLa, a region including the wirings SLa and GLb, and a region including the wirings SLb and GLb in the display portion 17 are denoted by the display portion 17_1, the display portion 17_2, a display portion 17_3, and a display portion 17_4, respectively.

The wiring GLa is electrically connected to the gate driver 12a, and the wiring GLb is electrically connected to the gate driver 12b. The gate driver 12a supplies a signal to the wiring GLa and the gate driver 12b supplies a signal to the wiring GLb.

Figure 9A:
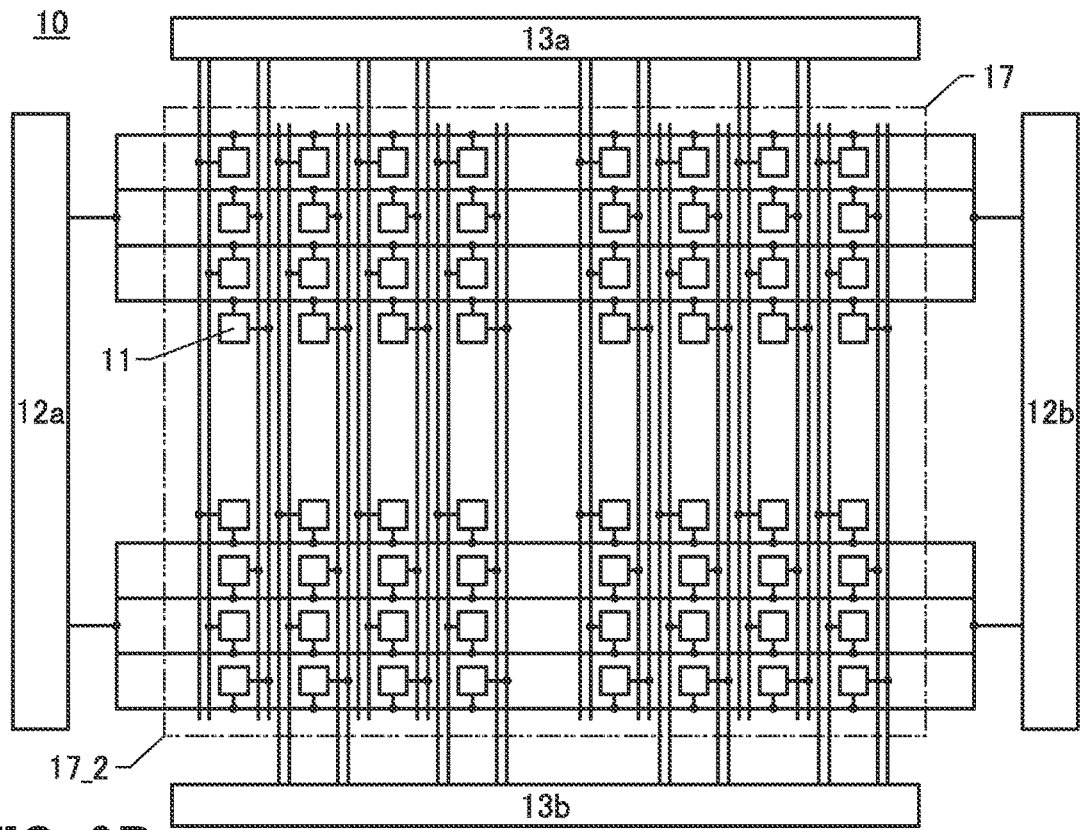
FIGS. 9A and 9B each illustrate a structural example of a display device.

When the display portion 17 is divided as illustrated in FIGS. 8A and 8B, a boundary portion is perceived as a stripe by a viewer of the display device in some cases. In view of the above, in alternate columns or alternate pluralities of columns, the wirings SL may be connected to the source driver 13a or 13b as illustrated in FIG. 9A. For example, the wirings SL electrically connected to the pixels 11 in an odd-numbered column are electrically connected to the source driver 13a, and the wirings SL electrically connected to the pixels 11 in an even-numbered column are electrically connected to the source driver 13b.

The structure illustrated in FIG. 9A can eliminate the stripe and diminish the reduction in display quality caused by delay of signal transmission to an end of a wiring, distortion of a signal waveform, or the like.

Figure 9B:
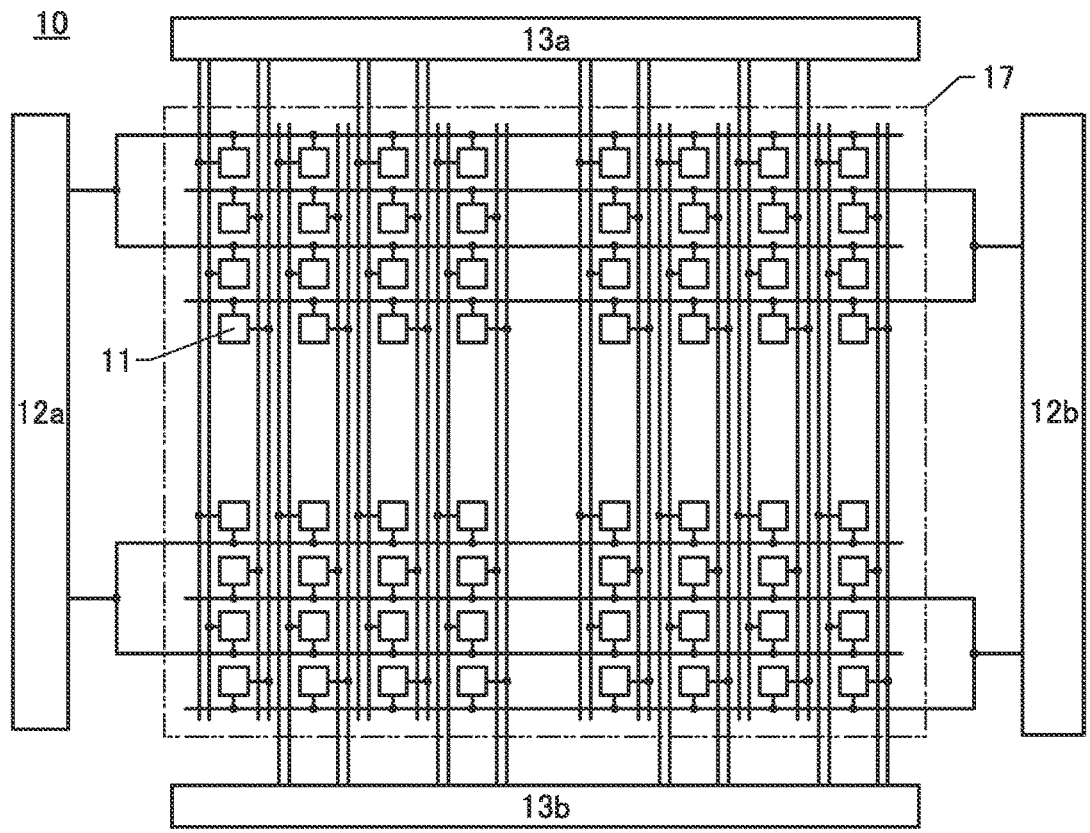

In alternate rows or alternate pluralities of rows, the wirings GL may be connected to the gate driver 12a or 12b as illustrated in FIG. 9B. For example, the wirings GL electrically connected to the pixels 11 in an odd-numbered column are electrically connected to the gate driver 12a, and the wirings GL electrically connected to the pixels 11 in an even-numbered column are electrically connected to the gate driver 12b.

[Plan-View Structure Examples of Pixels]

Plan-view structure examples of the pixels arranged in the display portion 17 of the display device 10 in FIG. 5 are described below.

Figure 10:
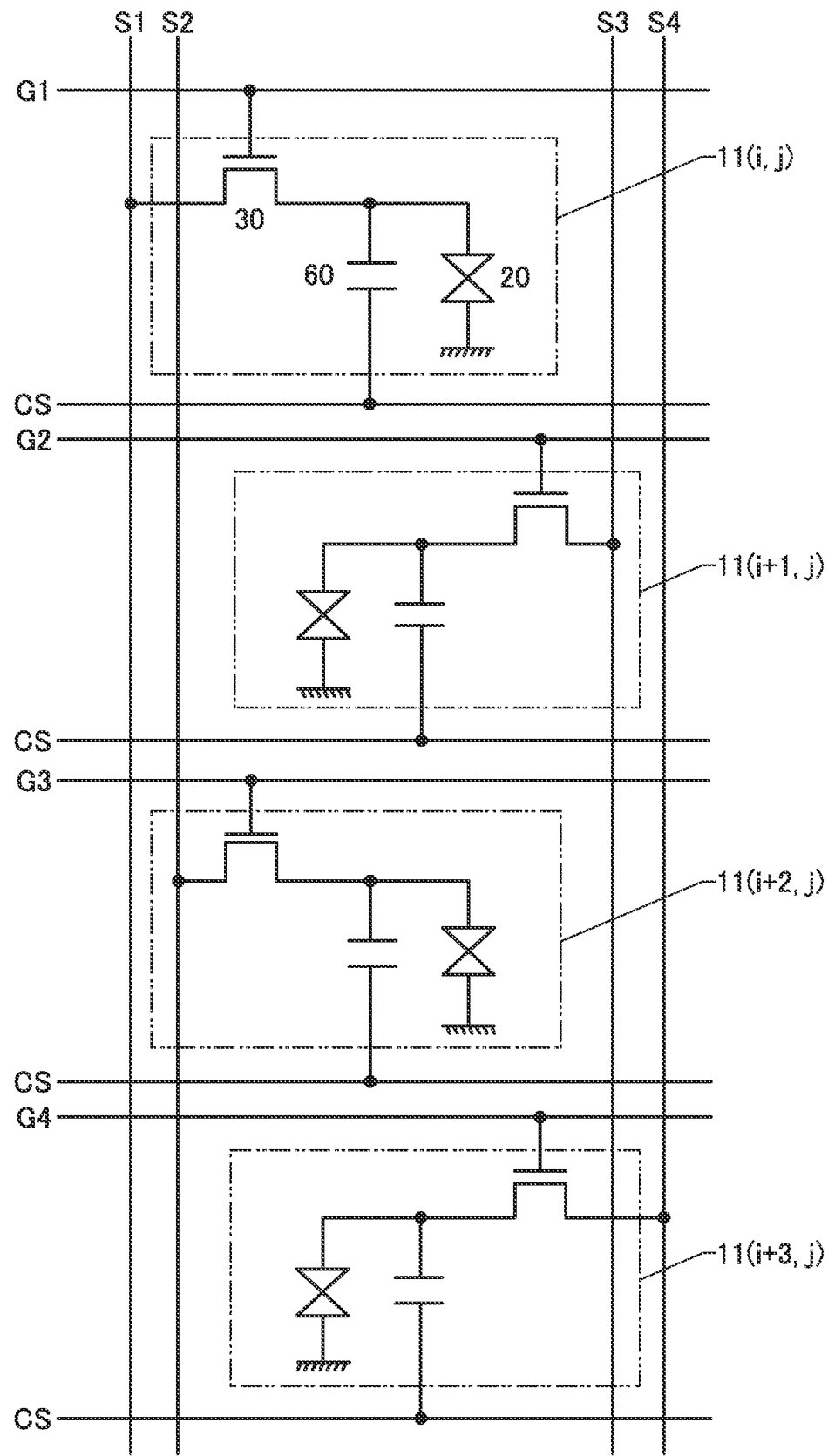
FIG. 10 illustrates a structural example of a display device.

FIG. 10 is a circuit diagram including four pixels, the pixel 11(i, j), a pixel 11(i+1, j), a pixel 11(i+2, j), and a pixel 11(i+3, j), arranged in the column direction.

Each pixel 11 includes a transistor 30, a liquid crystal element 20, and a capacitor 60.

Wirings S1 to S4 correspond to source lines, and wirings G1 to G4 correspond to gate lines. For example, the wirings S1, S2, S3, and S4 in FIG. 10 correspond to wirings $SL_1(i)$, $SL_2(j)$, $SL_3(j)$, and $SL_4(j)$, respectively. The wirings G1, G2, G3, and G4 in FIG. 10 correspond to wirings GL(i), GL(i+1), GL(i+2), and GL(i+3), respectively. A wiring CS is electrically connected to one electrode of the capacitor 60, and a certain potential is applied to the wiring CS.

The wiring S1 is electrically connected to one of a source and a drain of the transistor 30 included in the pixel 11(i, j), and the wiring G1 is electrically connected to a gate of the transistor 30 included in the pixel 11(i, j). The wiring S3 is electrically connected to one of the source and the drain of the transistor 30 included in the pixel 11(i+1, j), and the wiring G2 is electrically connected to the gate of the transistor 30 included in the pixel 11(i+1, j). The wiring S2 is electrically connected to one of the source and the drain of the transistor 30 included in the pixel 11(i+2, j), and the wiring G3 is electrically connected to the gate of the transistor 30 included in the pixel 11(i+2, j). The wiring S4 is electrically connected to one of the source and the drain of the transistor 30 included in the pixel 11(i+3, j), and the wiring G4 is electrically connected to the gate of the transistor 30 included in the pixel 11(i+3, j).

The other of the source and the drain of the transistor 30 is electrically connected to one electrode of the capacitor 60 and one electrode (pixel electrode) of the liquid crystal element 20. A common potential is supplied to the other electrode of the capacitor 60.

The transistor 30 has a function of controlling whether to write the signal supplied from the source line to the pixel 11 by switching the on and off states. Specifically, by turning on the transistor 30, charge corresponding to the signal supplied form the source line can be written to the capacitor 60 electrically connected to the transistor 30. By turning off the transistor 30, the charge written to the capacitor 60 can be held.

Figure 11A:
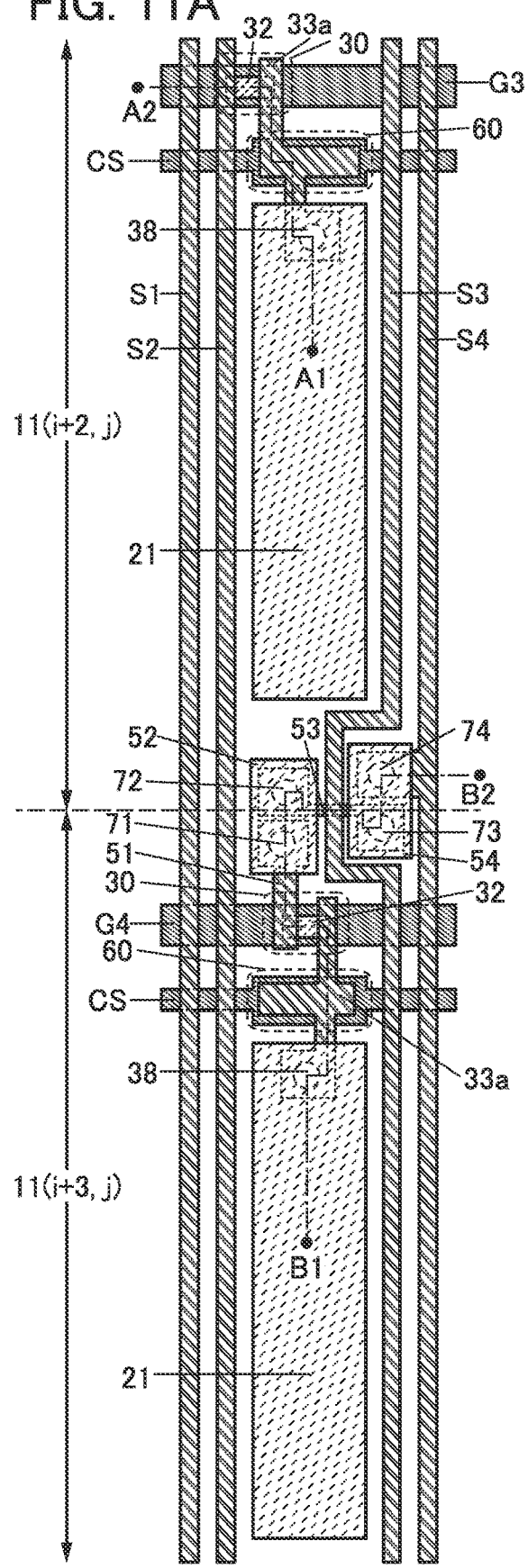
FIGS. 11A and 11B each illustrate a structural example of a display device.

FIG. 11A illustrates a layout example of the pixel 11 (i+2, j) and the pixel 11 (i+3, j).

In FIG. 11A and the like, the components provided in the same layer are illustrated with the same hatch pattern. Also in the drawings referred to below, the components provided in the same layer may be illustrated with the same hatch pattern.

As illustrated in FIG. 11A, the wiring G3, the wiring G4, and the wiring CS extend in the row direction (the lateral direction), and the wirings S1 to S4 extend in the column direction (the longitudinal direction).

Next, a structure of the pixel 11(i+2, j) is described. In the transistor 30 included in the pixel 11(i+2, j), a semiconductor layer 32 is provided over the wiring G3, and part of the wiring G3 has a function as a gate electrode. Part of the wiring S2 has a function as one of a source electrode and a drain electrode. The semiconductor layer 32 includes a region positioned between the wiring S2 and the wiring S3.

A conductive layer 33a having a function as the other of the source and the drain of the transistor 30 and as one electrode of the capacitor 60 is provided so as to be electrically connected to the semiconductor layer 32. A conductive layer 21 having a function as a pixel electrode is provided, and the conductive layer 33a and the conductive layer 21 are electrically connected to each other in an opening portion 38.

Next, a structure of the pixel 11(i+3,1) is described. In the transistor 30 included in the pixel 11(i+3, j), the semiconductor layer 32 is provided over the wiring G4, and part of the wiring G4 has a function as a gate electrode. The semiconductor layer 32 includes a region positioned between the wiring S2 and the wiring S3.

A conductive layer 51 having a function as one of the source and the drain of the transistor 30 is provided so as to be electrically connected to the semiconductor layer 32. In an opening portion 71, the conductive layer 51 is electrically connected to a conductive layer 52 formed in the same layer as the conductive layer 21. In an opening portion 72, the conductive layer 52 is electrically connected to a conductive layer 53 formed in the same layer as the wiring G4. In an opening portion 73, the conductive layer 53 is electrically connected to a conductive layer 54 formed in the same layer as the conductive layer 21. In an opening portion 74, the conductive layer 54 is electrically connected to the wiring S4.

Thus, in the pixel 11(i+3, j), the conductive layer 51 having a function as one of the source and the drain of the transistor 30 is electrically connected to the wiring S4 through the conductive layers 52, 53, and 54. In the case where the pixel 11(*i*+3, j) has a structure illustrated in FIG. 11A, the conductive layer 51 and the wirings S3 and S4 are provided in the same layer and the conductive layer 53 has a region overlapping with the wiring S3; however, a short-circuit between one of the source and the drain of the transistor 30 and the wiring S3 can be prevented. Furthermore, the conductive layers 52 and 54 can be formed in the same step as the conductive layer 21 having a function as a pixel electrode, and the conductive layer 53 can be formed in the same step as the wiring G4. Thus, even the structure including four source lines for each column can be obtained by steps the number of which is similar to that of the steps of obtaining the structure including one or two source lines for each column, or more specifically, the four source lines can be provided without increasing the number of photolithography steps.

That is, the four source lines can be provided without increasing the number of photomasks. Accordingly, an increase in the manufacturing cost of the display device can be suppressed.

Figure 11B:
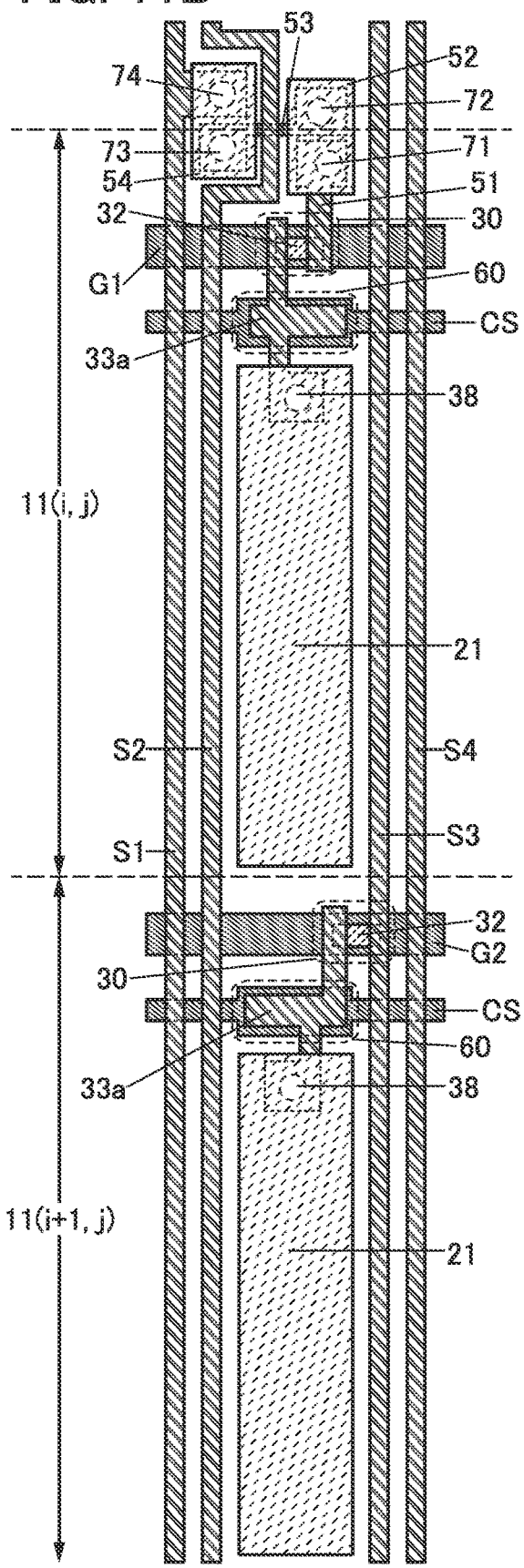

FIG. 11B illustrates a layout example of the pixel 11 (*i*, *j*) and the pixel 11 (i+1, j). As illustrated in FIG. 11B, the wiring G1 and the wiring G2 extend in the row direction.

In the pixel 11(*i*, *j*), the conductive layer 51 having a function as one of the source and the drain of the transistor 30 is electrically connected to the wiring S1 through the conductive layers 52, 53, and 54. Except for this, the structures of the pixel 11(*i*, *j*) and the pixel 11 (i+3, j) are the same.

In the pixel 11(*i*, *j*), part of the wiring S3 has a function as one of the source and the drain of the transistor 30. Except for this, the structures of the pixel 11(*i*+1, j) and the pixel 11(*i*+2, j) are the same.

The above is the description of plan-view structure examples of the pixels.

[Cross-Sectional Structure Examples of Pixels]

Cross-sectional structure examples of the pixels arranged in the display portion 17 of the display device 10 in FIG. 5 are described below.

[Cross-Sectional Structure Example 1]

Figure 12:
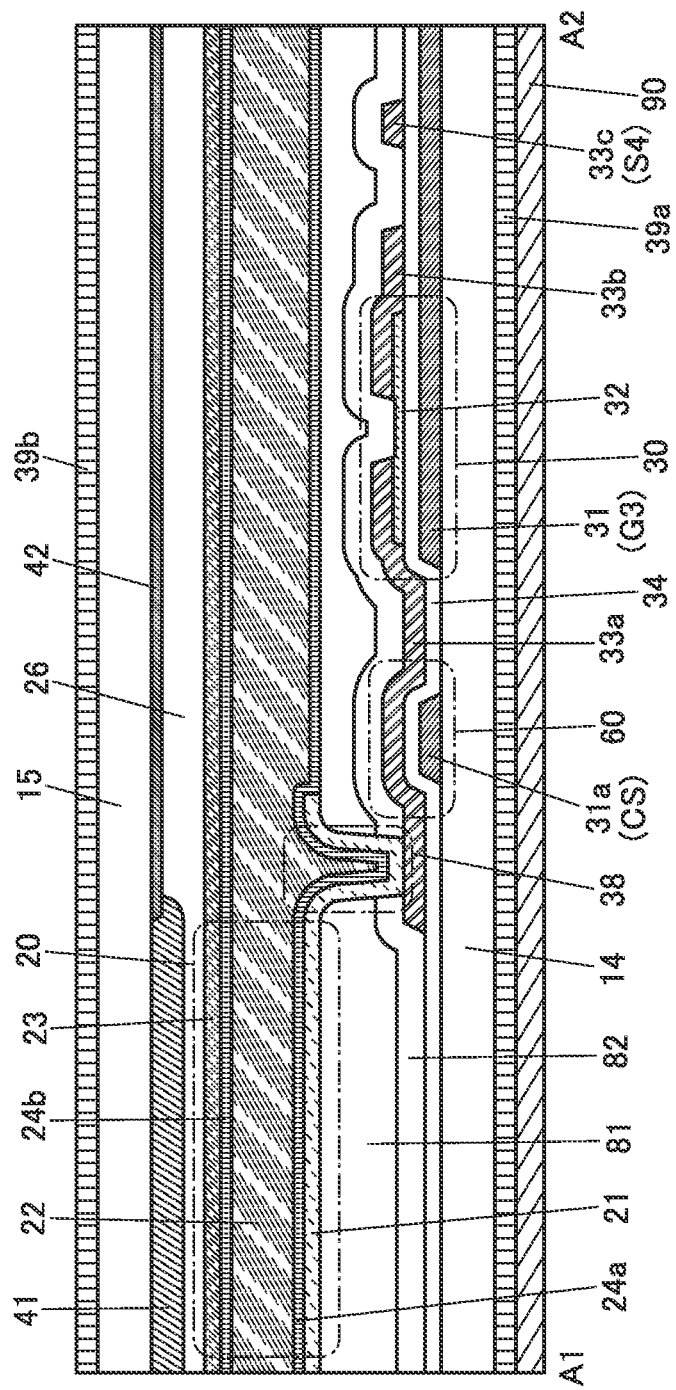
FIG. 12 illustrates a structural example of a display device.

FIG. 12 illustrates an example of a cross section along line A1-A2 in FIG. 11A. Here, an example where the transmissive liquid crystal element 20 is used as a display element is shown. In FIG. 12, a substrate 15 side is a display surface side.

In the display device 10, a liquid crystal 22 is provided between a substrate 14 and the substrate 15. The liquid crystal element 20 includes the conductive layer 21 provided on the substrate 14 side, a conductive layer 23 provided on the substrate 15 side, and the liquid crystal 22 provided between the conductive layers 21 and 23. Furthermore, an alignment film 24*a* is provided between the liquid crystal 22 and the conductive layer 21 and an alignment film 24*b* is provided between the liquid crystal 22 and the conductive layer 23.

The conductive layer 21 has a function as a pixel electrode. The conductive layer 23 has a function as a common electrode or the like. The conductive layer 21 and the conductive layer 23 each have a function of transmitting visible light. Thus, the liquid crystal element 20 is a transmissive liquid crystal element.

A coloring layer 41 and a light-blocking layer 42 are provided on a surface of the substrate 15 on the substrate 14 side. An insulating layer 26 is provided to cover the coloring layer 41 and the light-blocking layer 42, and the conductive layer 23 is provided to cover the insulating layer 26. The coloring layer 41 is provided in a region overlapping with the conductive layer 21. The light-blocking layer 42 is provided to cover the transistor 30, the opening portion 38, and the like.

A polarizing plate 39*a* is located outward from the substrate 14, and a polarizing plate 39*b* is located outward from the substrate 15. Furthermore, a backlight unit 90 is located outward from the polarizing plate 39*a*. The display surface of the display device 10 illustrated in FIG. 12 is on the substrate 15 side.

The transistor 30, the capacitor 60, and the like are provided over the substrate 14. The transistor 30 has a function as a selection transistor of the pixel 11. The transistor 30 is electrically connected to the liquid crystal element 20 in the opening portion 38.

The transistor 30 illustrated in FIG. 12 is what is called a channel-etched bottom-gate transistor. The transistor 30 includes a conductive layer 31 having a function as a gate, an insulating layer 34 functioning as a gate insulating layer, the semiconductor layer 32, and the pair of conductive layers 33*a* and 33*b* having a function as a source and a drain. A region of the semiconductor layer 32 overlapping with the conductive layer 31 has a function as a channel formation region.

Note that the conductive layer 31 corresponds to part of the wiring G3 in FIG. 11A, and the conductive layer 33*b* corresponds to part of the wiring S3. Furthermore, a conductive layer 31*a* and a conductive layer 33*c*, which are described later, are part of the wiring CS and part of the wiring S4, respectively.

A material that can be used for the semiconductor layer 32 will be described later. For example, a semiconductor including a metal oxide is used for the semiconductor layer 32: that is, a later-described OS transistor is used as the transistor 30, whereby charge corresponding to the signal supplied from the source line can be held in the capacitor 60 for a long period, as described above. Thus, the frequency of an operation of writing the charge to the capacitor 60, that is, a refresh operation can be reduced, leading to reduced power consumption of the display device 10.

The capacitor 60 includes the conductive layer 31*a*, the insulating layer 34, and the conductive layer 33*a*. Furthermore, the conductive layer 33*c* is provided over the conductive layer 31 with the insulating layer 34 provided therebetween.

An insulating layer 82 and an insulating layer 81 are stacked to cover the transistor 30 and the like. The conductive layer 21 having a function as a pixel electrode is provided over the insulating layer 81. The conductive layer 21 and the conductive layer 33*a* are electrically connected to each other in the opening portion 38 provided in the insulating layers 81 and 82. The insulating layer 81 preferably has a function as a planarization layer. The insulating layer 82 preferably has a function as a protective film that inhibits diffusion of impurities or the like to the transistor 30 and the like. The insulating layer 82 can be formed using an inorganic insulating material, and the insulating layer 81 can be formed using an organic insulating material, for example.

In this specification and the like, the insulating layer 82 and the insulating layer 81 may be collectively referred to as an insulating layer.

[Cross-Sectional Structure Example 2]

Figure 13:
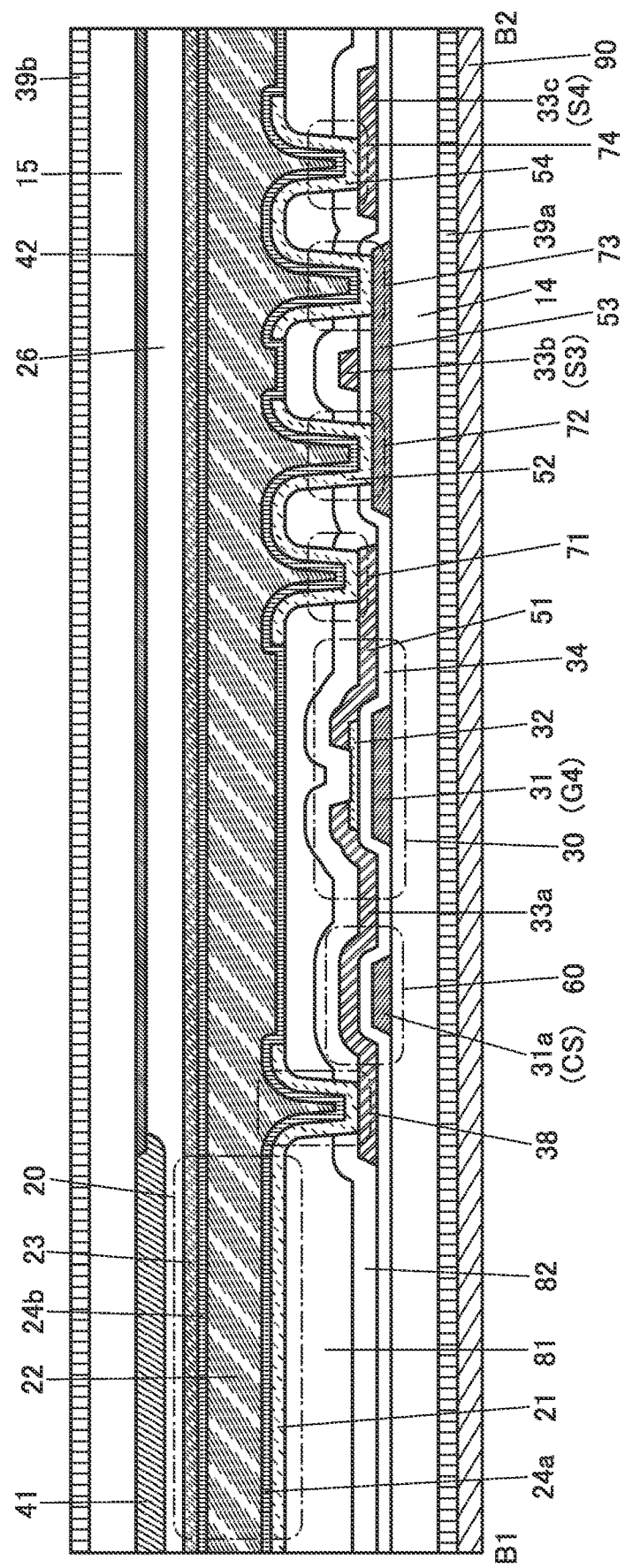
FIG. 13 illustrates a structural example of a display device.

FIG. 13 illustrates an example of a cross section along line B1-B2 in FIG. 11A. The transistor 30 illustrated in FIG. 13 includes the conductive layer 31 having a function as a gate electrode, the insulating layer 34 having a function as a gate insulating layer, the semiconductor layer 32, and the pair of conductive layers 33*a* and 51 having a function as a source and a drain. A region of the semiconductor layer 32 overlapping with the conductive layer 31 has a function as a channel formation region.

Note that the conductive layer 31 corresponds to part of the wiring G4 in FIG. 11A. As in the case in FIG. 12, the conductive layer 31*a*, the conductive layer 33*b*, and the conductive layer 33*c* correspond to part of the wiring CS, part of the wiring S3, and part of the wiring S4, respectively. The conductive layer 33*b* is provided so as to have a region overlapping with the conductive layer 53 with the insulating layer 34 provided therebetween.

As described above, the conductive layer 51 and the conductive layer 52 are electrically connected to each other in the opening portion 71 provided in the insulating layers 81 and 82. The conductive layer 52 and the conductive layer 53 are electrically connected to each other in the opening portion 72 provided in the insulating layers 81, 82, and 34. The conductive layer 53 and the conductive layer 54 are electrically connected to each other in the opening portion 73 provided in the insulating layers 81, 82, and 34. The conductive layer 54 and the conductive layer 33*c* are electrically connected to each other in the opening portion 74 provided in the insulating layers 81 and 82. Thus, as described above, the conductive layer 51 having a function as one of the source and the drain of the transistor 30 is electrically connected to the conductive layer 33*c* corresponding to part of the wiring S4 with the conductive layers 52, 53, and 54 provided between the conductive layers 51 and 33*c*. The opening portions 72 and 73 are formed with the conductive layer 33*b* provided therebetween. Accordingly, a short-circuit between the conductive layer 51 having a function as one of the source and the drain of the transistor 30 and the conductive layer 33*b* corresponding to part of the wiring S3 is suppressed. As illustrated in FIG. 13, the conductive layers 52 and 54 are formed in the same layer as the conductive layer 21, and the conductive layer 53 is formed in the same layer as the conductive layers 31 and 31*a*.

Note that the components formed in the same layer can include the same material. In other words, for example, the conductive layers 21, 52, and 54 can include the same material. For example, the conductive layers 31, 31*a*, and 53 can include the same material.

[Cross-Sectional Structure Example 3]

Figure 14:
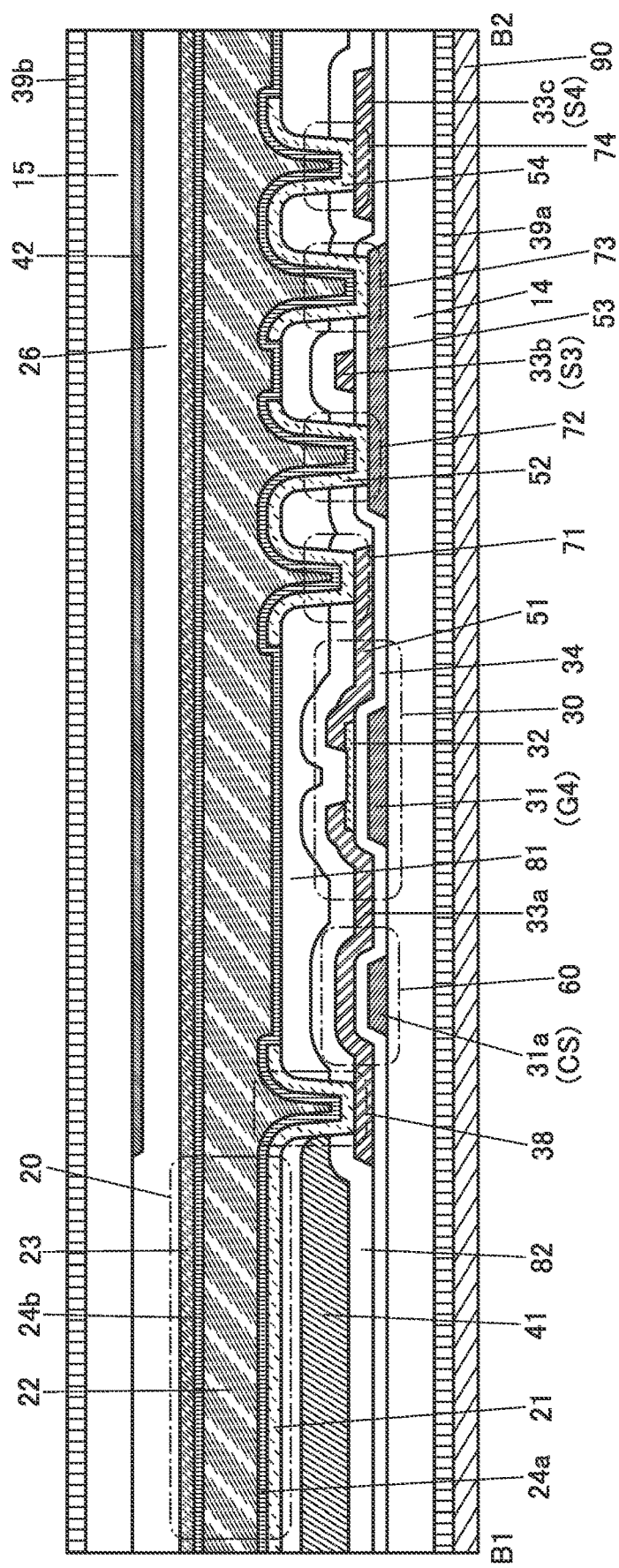
FIG. 14 illustrates a structural example of a display device.

FIG. 14 illustrates a modification example of the structure illustrated in FIG. 13. FIG. 14 illustrates an example where the coloring layer 41 is provided on the substrate 14 side. Thus, the structure on the substrate 15 side can be simplified.

Note that in the case where the coloring layer 41 is a planarization film, the insulating layer 81 is not necessarily provided. In this case, the number of manufacturing steps of the display device 10 and the manufacturing cost of the display device 10 can be reduced.

[Cross-Sectional Structural Example 4]

Figure 15:
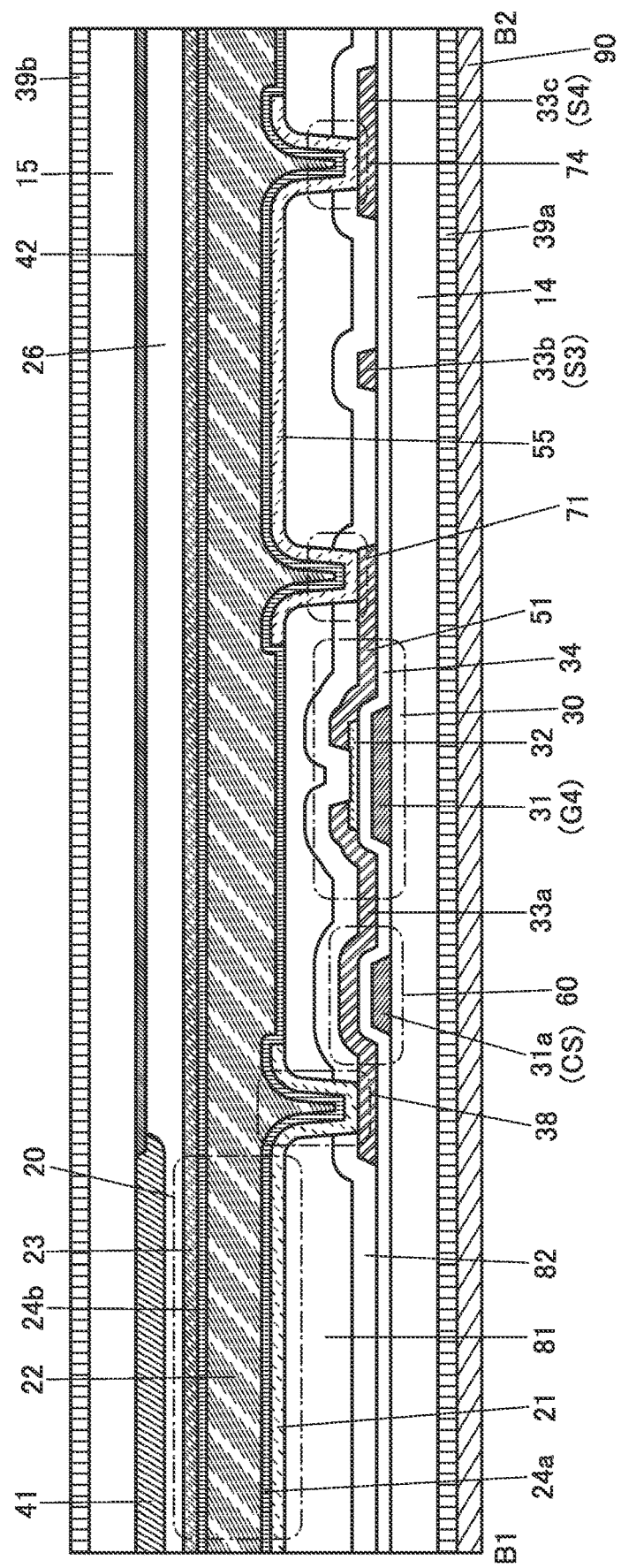
FIG. 15 illustrates a structural example of a display device.

FIG. 15 illustrates a modification example of the structure illustrated in FIG. 14. In the example in FIG. 15, the conductive layers 52, 53, and 54 and the opening portions 72 and 73 are omitted. In this case, the conductive layers 51 and 33*c* are electrically connected to each other with a conductive layer 55 provided therebetween, which is formed in the same layer as the conductive layer 21. Specifically, the conductive layers 51 and 55 are electrically connected to each other in the opening portion 71, and the conductive layers 33*c* and 55 are electrically connected to each other in the opening portion 74. The structure illustrated in FIG. 15 can also suppress a short-circuit between the conductive layers 51 and 33*b*.

[Cross-Sectional Structure Example 5]

Figure 16:
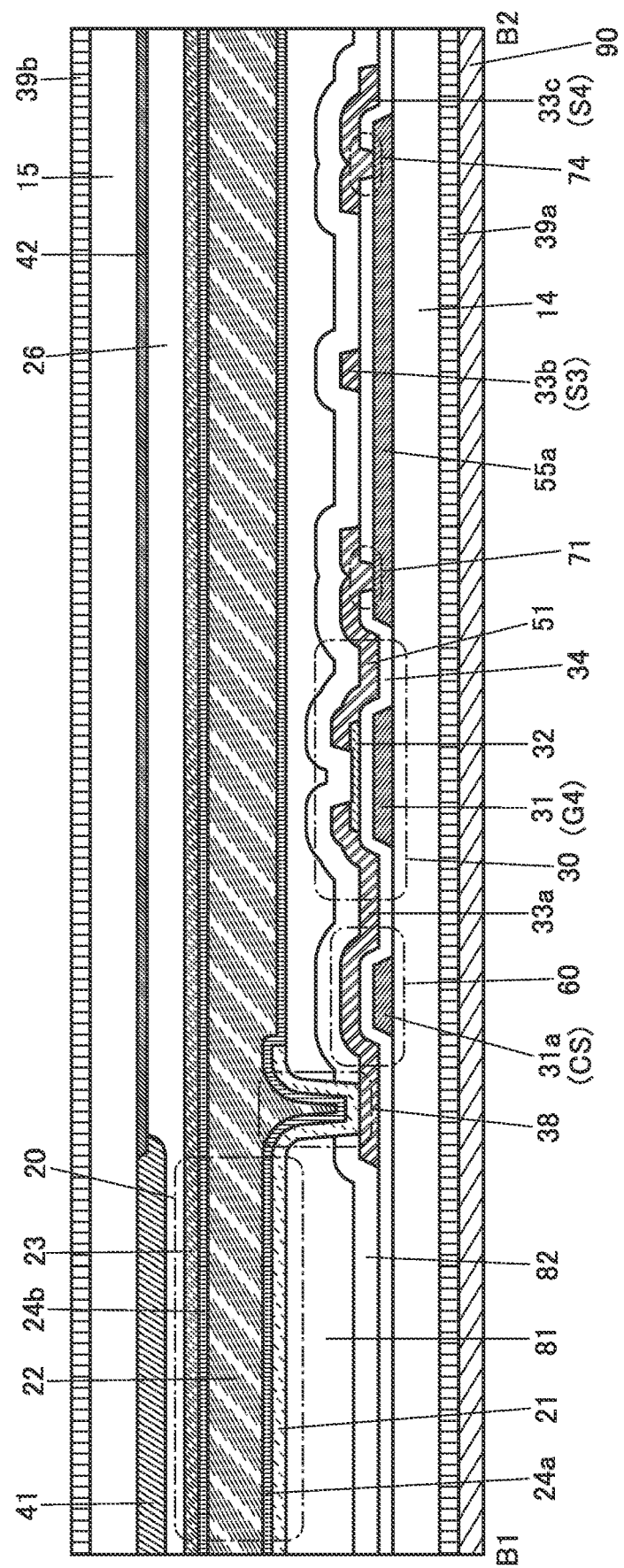
FIG. 16 illustrates a structural example of a display device.

FIG. 16 illustrates a modification example of the structure illustrated in FIG. 15. In FIG. 16, a conductive layer 55*a* is provided instead of the conductive layer 55. The conductive layer 55*a* is formed in the same layer as the conductive layers 31 and 31*a*. The conductive layers 51 and 55*a* are electrically connected to each other in the opening portion 71 provided in the insulating layer 34. The conductive layers 33*c* and 55*a* are electrically connected to each other in the opening portion 74 provided in the insulating layer 34.

[Cross-Sectional Structure Example 6]

Figure 17:
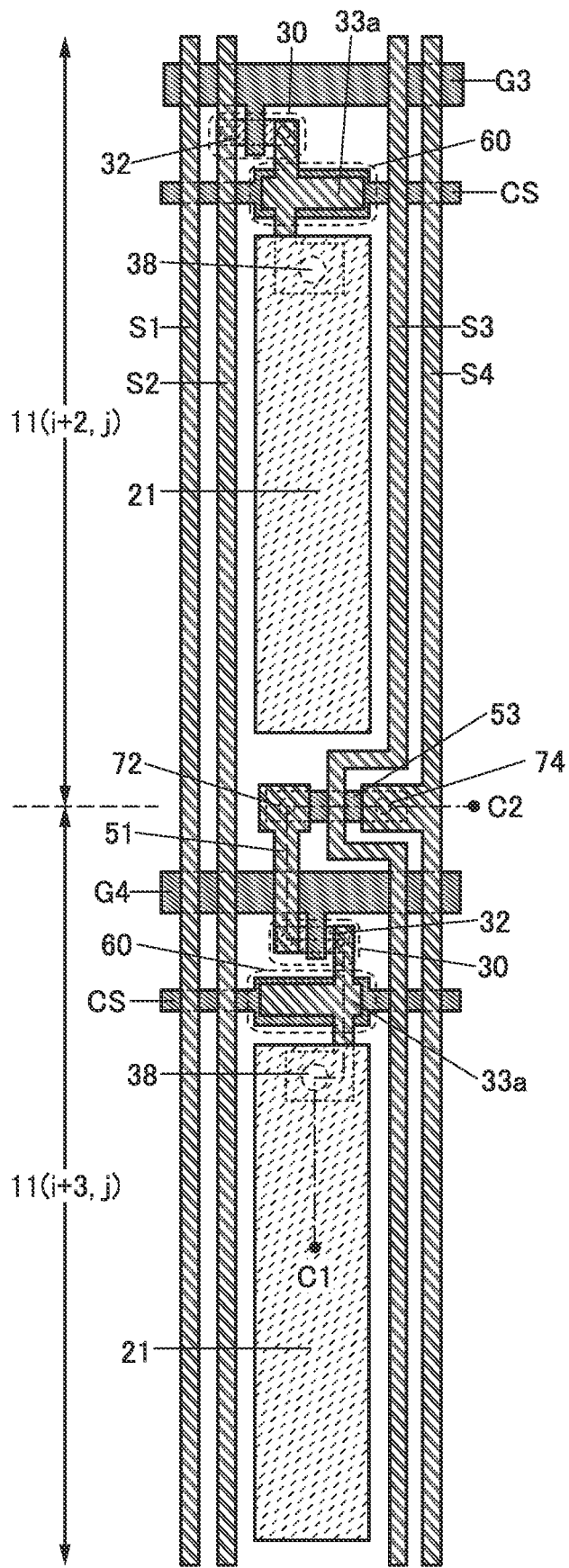
FIG. 17 illustrates a structural example of a display device.
Figure 18:
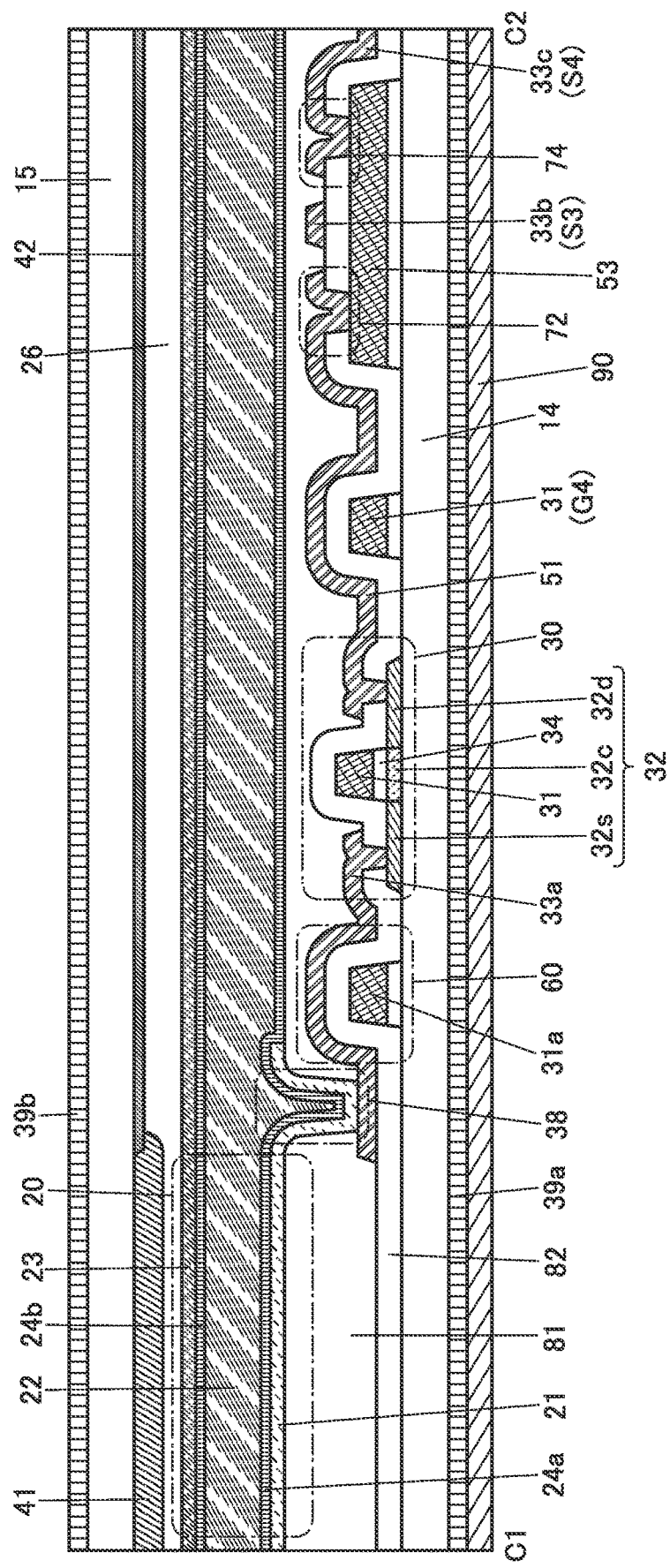
FIG. 18 illustrates a structural example of a display device.

FIG. 17 and FIG. 18 each illustrate a structural example of a top-gate transistor used as the transistor 30. FIG. 17 is a plan view corresponding to FIG. 11A. FIG. 18 shows an example of a cross section along line C1-C2 in FIG. 17. The cross section in FIG. 18 corresponds to the cross section in FIG. 15.

In FIG. 18, the transistor 30 is provided over the substrate 14. The semiconductor layer 32 included in the transistor 30 in FIG. 18 is provided over the substrate 14. The semiconductor layer 32 includes a source region 32*s*, a drain region 32*d*, and a channel formation region 32*c*. Over the channel formation region 32*c* in the semiconductor layer 32, the conductive layer 31 is provided with the insulating layer 34 provided therebetween. The channel formation region 32*c* and the conductive layer 31 include a region where they overlap with each other with the insulating layer 34 provided therebetween. The conductive layer 31 can function as a gate. The insulating layer 34 can function as a gate insulating layer.

In the cross-sectional structure illustrated in FIG. 18, the conductive layers 33*a*, 51, 33*b*, and 33*c* are provided over the insulating layer 82. The conductive layer 51 functions as one of the source and the drain of the transistor 30, and the conductive layer 33*a* has a function as the other of the source and the drain of the transistor 30 and as one electrode of the capacitor 60. In the cross-sectional structure illustrated in FIG. 18, a region where the conductive layers 31*a* and 33*a* overlap with each other with the insulating layer 82 provided therebetween functions as the capacitor 60.

The opening portion 38 is provided in part of the insulating layer 81. In the opening portion 38, the conductive layers 33*a* and 21 are electrically connected to each other. The opening portions 72 and 74 are provided in part of the insulating layer 82. In the opening portion 72, the conductive layers 53 and 51 are electrically connected to each other. In the opening portion 74, the conductive layers 53 and 33*c* are electrically connected to each other. The conductive layers 51 and 33*c* are electrically connected to each other with the conductive layer 53 provided therebetween.

The above is the description of cross-sectional structure example of the pixel.

[COMPONENTS]

The above-described components are described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate.

A flexible display panel can be obtained by using a substrate that is thin enough to have flexibility. Alternatively, glass or the like that is thin enough to have flexibility can be used as the substrate. Alternatively, a composite material where glass and a resin material are attached to each other with an adhesive layer may be used.

[Transistor]

The transistor includes a conductive layer having a function as a gate, a semiconductor layer, a conductive layer having a function as a source, a conductive layer having a function as a drain, and an insulating layer having a function as a gate insulating layer.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gates may be provided above and below a channel.

[Semiconductor Layer]

There is no particular limitation on the crystallinity of the semiconductor layer used for the transistor, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

For example, as a semiconductor material used for the transistor, a Group 14 element (e.g., silicon or germanium), a compound semiconductor such as a silicon carbide, a gallium arsenide, a metal oxide, or a nitride semiconductor, an organic semiconductor, or the like can be used.

For example, amorphous silicon can be used as the semiconductor material used for the transistor. In particular, amorphous silicon is easily mass-produced and provided over a large-sized substrate. Note that in general, amorphous silicon used for a transistor contains a large amount of hydrogen; hence, amorphous silicon containing a large amount of hydrogen is referred to as hydrogenated amorphous silicon or a-Si:H in some cases. Moreover, amorphous silicon can be formed at temperatures lower than temperatures at which polycrystalline silicon is formed, and thus, the highest temperature in the manufacturing process can be lowered.

Accordingly, low heat-resistance materials can be used for a substrate, a conductive layer, an insulating layer, and the like.

Furthermore, silicon having crystallinity such as microcrystalline silicon, polycrystalline silicon, or single crystal silicon can be used as the semiconductor material used for the transistor. In particular, polycrystalline silicon can be formed at a lower temperature than single crystal silicon and has higher field-effect mobility and higher reliability than amorphous silicon.

Furthermore, an oxide semiconductor, which is a kind of a metal oxide, can be used as the semiconductor material used for the transistor. As a typical example, an oxide semiconductor containing indium can be given. An oxide semiconductor enables higher field-effect mobility and higher reliability than those of amorphous silicon. Moreover, an oxide semiconductor is easily mass-produced and provided over a large-sized substrate.

An oxide semiconductor, which is a kind of a metal oxide, has a wider bandgap and lower carrier density than those of silicon; thus, an oxide semiconductor is preferably used for the semiconductor layer of the transistor. The use of an oxide semiconductor for the semiconductor layer of the transistor is preferable in terms of reducing current flowing between a source and a drain in an off state of the transistor.

An oxide semiconductor, which is a kind of a metal oxide, preferably has an energy gap of 2 eV or more, further preferably 2.5 eV or more, still further preferably 3 eV or more. The use of such an oxide semiconductor having a wide energy gap leads to a reduction in off-state current of the transistor. A transistor using an oxide semiconductor, which is a kind of a metal oxide, in a semiconductor layer where a channel is formed is also referred to as an OS transistor.

An OS transistor can hold charge stored in a capacitor that is series-connected to the transistor for a long time, owing to a low off-state current of the transistor. The use of such a transistor in pixels allows a driver circuit to stop while the gray level of an image displayed on display portions is maintained. As a result, a display device with extremely low power consumption can be obtained.

An oxide semiconductor, which is a kind of a metal oxide, preferably includes, for example, a material represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the semiconductor layer, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the atomic ratio of In:Ga:Zn. For example, the In:Ga:Zn ratio may be 1:1:1, 2:2:1, 3:1:2, 4:2:3, 5:1:6, or in the neighborhood thereof. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

In the case where the metal oxide contained in the semiconductor layer contains an In-M-Zn-based oxide, it is preferable that the atomic ratio of metal elements of a sputtering target used for forming a film of the In-M-Zn oxide satisfy In M. As the atomic ratio of metal elements of such a sputtering target, In:M:Zn=1:1:1, In:M:Zn=1:1:1.2, In:M:Zn=3:1:2, In:M:Zn=4:2:4.1, In:M:Zn=2:1:3, In:M:Zn=3:1:2, InM:Zn=5:1:6, In:M:Zn=5:1:7, In:M:Zn=5:1:8, In:M:Zn=6:1:6, In:M:Zn=5:2:5, and the like are preferable. Note that the atomic ratio of metal elements in the formed semiconductor layer varies from the above atomic ratio of metal elements of the sputtering target within a range of ±40% as an error.

The metal oxide included in the semiconductor layer is preferably a later-described CAC—OS or CAC-metal oxide. Thus, the field-effect mobility of the transistor can be increased.

A metal oxide with a low carrier density is preferably used for the semiconductor layer.

For example, the semiconductor layer is a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$. Such a semiconductor layer has a low impurity concentration and a low density of defect states and thus has stable characteristics. Note that when the semiconductor layer is the metal oxide, examples of impurities are water, hydrogen, and the like.

In this specification and the like, a metal oxide with a low impurity concentration and a low density of defect states is referred to as a highly purified intrinsic metal oxide or a substantially highly purified intrinsic metal oxide in some cases.

A highly purified intrinsic or substantially highly purified intrinsic metal oxide has few carrier generation sources, and thus has a low carrier density. Thus, a transistor including the metal oxide rarely has a negative threshold voltage (is rarely normally on). The highly purified intrinsic or substantially highly purified intrinsic metal oxide has a low density of defect states and accordingly has a low density of trap states in some cases. Furthermore, the highly purified intrinsic or substantially highly purified intrinsic metal oxide has an extremely low off-state current; even when an element has a channel width of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Note that although the semiconductor layer that can be used in one embodiment of the present invention is not limited to the compositions and materials described above, a material with an appropriate composition can be used depending on required semiconductor characteristics and electric characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of Group 14 elements is contained in the metal oxide contained in the semiconductor layer, oxygen vacancies are increased in the semiconductor layer, and the semiconductor layer might become n-type. Thus, the concentration of silicon or carbon (measured by secondary ion mass spectrometry) in the semiconductor layer is preferably lower than or equal to $2\times10^{18}$ atoms/cm$^3$, further preferably lower than or equal to $2\times10^{17}$ atoms/cm$^3$.

An alkali metal and an alkaline earth metal might generate carriers when bonded to a metal oxide, in which case the off-state current of the transistor might be increased. Therefore, the concentration of an alkali metal or alkaline earth metal of the semiconductor layer, which is measured by secondary ion mass spectrometry, is preferably lower than or equal to $1\times10^{18}$ atoms/cm$^3$, further preferably lower than or equal to $2\times10^{16}$ atoms/cm$^3$.

The semiconductor layer may have a non-single-crystal structure, for example.

Non-single-crystal structures include a polycrystalline structure, a microcrystalline structure, and an amorphous structure, for example. Among the non-single-crystal structures, the amorphous structure has the highest density of defect states.

A metal oxide having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, and a region having a single crystal structure. The mixed film has, for example, a single-layer structure or a stacked-layer structure including two or more of the above regions in some cases.

[Conductive Layer]

As materials that can be used for the gate, source, and drain of the transistor, and the conductive layers such as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases controllability of a shape by etching.

As a light-transmitting conductive material that can be used for the gate, source, and drain of the transistor and the conductive layers such as the wirings and electrodes included in the display device, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. In the case of using the metal material or the alloy material (or the nitride thereof), the thickness is set small enough to be able to transmit light. A stacked film of any of the above materials can be used for the conductive layers. For example, a stacked film of indium tin oxide and an alloy of silver and magnesium is preferably used because it can increase the conductivity. They can also be used for the conductive layers such as the wirings and electrodes included in the display device, and conductive layers (e.g., a conductive layer having a function as a pixel electrode or a common electrode) included in the display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

In the case where the semiconductor layer includes a metal oxide, an insulating layer including a region in contact with the semiconductor layer preferably includes a region containing oxygen in excess of the stoichiometric composition (an excess oxygen region). For example, the insulating layers 34 and 82 including a region in contact with the semiconductor layer 32 preferably include an excess oxygen region. Thus, oxygen can be supplied from the insulating layers to the semiconductor layer. In the case where the semiconductor layer 32 includes a metal oxide and oxygen vacancies are formed in the metal oxide, impurities such as hydrogen might enter the oxygen vacancies and generate an electron serving as a carrier. This might degrade the electrical characteristics of the transistor. In the case where the insulating layer including a region in contact with the semiconductor layer includes the excess oxygen region, oxygen can be supplied to the semiconductor layer from the insulating layer so that the oxygen vacancies can be filled. Thus, the degradation of the electrical characteristics of the transistor can be suppressed. In order to provide the excess oxygen region in the insulating layer, the insulating layer is formed in an oxygen atmosphere; alternatively, the formed insulating layer is subjected to heat treatment in an oxygen atmosphere.

[Display Element]

The display device of one embodiment of the present invention can employ various modes and include various display elements. The display element includes at least one of an electroluminescent (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), a plasma display panel (PDP), an electron emitter, a liquid crystal element, an electrophoretic element, a display element using micro electro mechanical systems (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, display media whose contrast, luminance, reflectivity, transmittance, or the like is changed by an electrical or magnetic effect may be included. Alternatively, quantum dots may be used as the display element.

Note that examples of display devices having EL elements include an EL display. Examples of a display device including an electron emitter include a field emission display (FED) and an SED-type flat panel display (SED: surface-conduction electron-emitter display). Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including an electrophoretic element include electronic paper. Examples of a display device including quantum dots include a quantum dot display.

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a VA-IPS mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

Note that when a guest-host mode liquid crystal material is used for the liquid crystal element, a functional member such as a light diffusion layer or a polarizing plate is not necessarily provided. Accordingly, the productivity of the display device can be improved. In addition, since a functional member such as a polarizing plate is unnecessary, the luminance of reflected light of the liquid crystal element can be increased. Accordingly, the visibility of the display device can be increased.

The on and off states (bright and dark states) of a reflective liquid crystal display device including a circularly polarizing plate are switched depending on the alignment direction of the major axes of liquid crystal molecules: a direction substantially perpendicular to a substrate or a direction substantially parallel to the substrate. In general, it is difficult to use a liquid crystal element that operates in a horizontal electric field mode such as an IPS mode in a reflective liquid crystal display device because the major axes of liquid crystal molecules in the liquid crystal element are aligned in a direction substantially parallel to a substrate in both of the on and off states.

The on and off states of a liquid crystal element that operates in a horizontal electric field mode such as a VA-IPS mode are switched depending on the alignment direction of the major axes of liquid crystal molecules: a direction substantially perpendicular to a substrate or a direction substantially parallel to the substrate. Thus, when a liquid crystal element that operates in a horizontal electric field mode is used in a reflective liquid crystal display device, the liquid crystal element preferably operates in a VA-IPS mode.

In one embodiment of the present invention, a transmissive liquid crystal element is particularly suitable.

In the case where a transmissive or semi-transmissive liquid crystal element is used, two polarizing plates are provided such that a pair of substrates are sandwiched therebetween. Furthermore, a backlight is provided on the outer side of the polarizing plate. The backlight may be a direct-below backlight or an edge-light backlight. The direct-below backlight including a light-emitting diode (LED) is preferably used because local dimming is easily performed to improve contrast. The edge-light backlight is preferably used because the thickness of a module including the backlight can be reduced.

When the edge-light backlight is turned off, see-through display can be performed.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure including a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the descriptions of the components.

[EXAMPLE OF METHOD OF MANUFACTURING PIXEL AND THE LIKE]

An example of a method of manufacturing the pixel 11($i$+3, j) having the structure illustrated in FIG. 13 and the like will be described below.

Thin films included in the display device (i.e., an insulating film, a semiconductor film, a conductive film, and the like) can be formed by any of a sputtering method, a chemical vapor deposition (CVD) method, a vacuum evaporation method, a pulsed laser deposition (PLD) method, an atomic layer deposition (ALD) method, and the like. As examples of the CVD method, a plasma-enhanced CVD (PECVD) method or a thermal CVD method can be given. As an example of the thermal CVD method, a metal organic CVD (MOCVD) method can be given.

Alternatively, the thin films included in the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

The thin films included in the display device can be processed using a lithography method or the like. Alternatively, island-shaped thin films may be formed by a film formation method using a blocking mask. Alternatively, the thin films may be processed by a nano-imprinting method, a sandblasting method, a lift-off method, or the like.

In the case of processing by a photolithography method, light with an i-line (with a wavelength of 365 nm), light with a g-line (with a wavelength of 436 nm), light with an h-line (with a wavelength of 405 nm), and light in which the i-line, the g-line, and the h-line are mixed can be used. Alternatively, ultraviolet light, KrF laser light, ArF laser light, or the like can be used. Exposure may be performed by liquid immersion exposure technique. As light used in exposure, extreme ultra-violet light (EUV), X-rays, or the like can be given. An electron beam can be used instead of a light used in exposure. It is preferable to use extreme ultra-violet light, X-rays, or an electron beam because extremely minute processing can be performed. Note that when exposure is performed by scanning of a beam such as an electron beam, a photomask is not needed.

For etching of the thin films, dry etching, wet etching, a sandblast method, or the like can be used.

To manufacture the display device 10, first, a conductive layer is formed over the substrate 14. Next, patterning is performed by a photolithography method or the like and the conductive layer is processed by an etching method or the like, whereby the conductive layer 31, the conductive layer 31a, and the conductive layer 53 are formed (FIG. 19A). As described above, the conductive layer 31 corresponds to part of the wiring G3, and the conductive layer 31a corresponds to part of the wiring CS.

Next, the insulating layer 34 is formed. As described above, the insulating layer 34 has a function as the gate insulating layer of the transistor provided in the display device 10.

Next, the semiconductor layer is formed over the insulating layer 34. For example, in the case where a metal oxide is used for the semiconductor layer, the formation can be performed by a sputtering method. For example, in the case where an In—Ga—Zn-based oxide is used for the semiconductor layer, the formation can be performed by a sputtering method using an In—Ga—Zn-based oxide as a target.

Then, patterning is performed by a photolithography method or the like and the formed semiconductor layer is processed by an etching method or the like, whereby the semiconductor layer 32 is formed (FIG. 19B).

Next, a conductive layer is formed over the insulating layer 34 and over the semiconductor layer 32. After that, patterning is performed by a photolithography method or the like and the conductive layer is processed by an etching method or the like, whereby the conductive layers 51, 33a, 33b, and 33c are formed (FIG. 19C). As described above, the conductive layer 51 functions as one of the source and the drain of the transistor 30, and the conductive layer 33a has a function as the other of the source and the drain of the transistor 30 and as one electrode of the capacitor 60. Furthermore, the conductive layer 33b and the conductive layer 33c correspond to part of the wiring S3 and part of the wiring S4, respectively. The conductive layer 33b is provided so as to have a region overlapping with the conductive layer 53.

Next, the insulating layer 82 is formed, and then the insulating layer 81 is formed. After the insulating layer 81 is formed, planarization treatment is performed on the insulating layer 81 by a chemical mechanical polishing (CMP) method or the like.

Next, patterning is performed by a photolithography method or the like. Then, the insulating layers 81 and 82 are processed by an etching method or the like, whereby the opening portion 71 reaching the conductive layer 51, the opening portion 38 reaching the conductive layer 33a, and the opening portion 74 reaching the conductive layer 33c are formed. Furthermore, the insulating layers 81, 82, and 34 are processed by an etching method or the like, whereby the opening portions 72 and 73 reaching the conductive layer 53 are formed with the conductive layer 33b provided between the opening portions 72 and 73 (FIG. 20A). Thus, the opening portions 38 and 71 to 74 are formed.

Next, a conductive layer is formed over the insulating layer 81 and in the opening portions 38 and 71 to 74. After that, patterning is performed by a photolithography method or the like and the conductive layer is processed by an etching method or the like, whereby the conductive layers 21, 52, and 54 are formed (FIG. 20B). The conductive layer 21 is electrically connected to the conductive layer 33a in the opening portion 38. The conductive layer 52 is electrically connected to the conductive layer 51 in the opening portion 71 and electrically connected to the conductive layer 53 in the opening portion 72. The conductive layer 54 is electrically connected to the conductive layer 53 in the opening portion 73 and electrically connected to the conductive layer 33c in the opening portion 74. As described above, the conductive layer 21 functions as the pixel electrode of the liquid crystal element provided in the display device 10. In addition, the conductive layer 51 having a function as one of the source and the drain of the transistor 30 is electrically connected to the conductive layer 33c corresponding to part of the wiring S4 with the conductive layers 52, 53, and 54 provided between the conductive layer 51 and the conductive layer 33c.

Next, the alignment film 24a is formed (FIG. 21A). After that, the light-blocking layer 42, the coloring layer 41, the insulating layer 26, the conductive layer 23, and the alignment film 24b are formed over the substrate 15 (FIG. 21B). The coloring layer 41 can be formed by a photolithography method, a printing method, or an inkjet method. By using an inkjet method, for example, the coloring layer can be formed at room temperature, formed at a low vacuum, or formed over a large substrate. Thus, the coloring layer 41 can be formed even in a significantly high-resolution display device such as a 4K display or an 8K display. The coloring layer 41 can also be formed in a large display device with a diagonal screen size of 50 inches or larger, 60 inches or larger, or 70 inches or larger. Since the coloring layer 41 can be formed without a resist mask, the number of manufacturing steps of the display device 10 and the manufacturing cost of the display device 10 can be reduced.

Next, the liquid crystal 22 is sealed with the substrate 14 illustrated in FIG. 21A, the substrate 15 illustrated in FIG. 21B, and an adhesive layer (not illustrated). Then, the polarizing plate 39a, the polarizing plate 39b, and the backlight unit 90 are formed. Through the above steps, the display device 10 having the structure in FIG. 13 can be manufactured.

Here, the smaller the number of photolithography steps in a manufacturing process of a display device is, i.e., the smaller the number of photomasks is, the lower the manufacturing cost can be.

For example, the structure on the substrate 14 side can be manufactured through five photolithography steps: a formation step of the conductive layer 31 and the like (FIG. 19A), a formation step of the semiconductor layer 32 (FIG. 19B), a formation step of the conductive layer 33a and the like (FIG. 19C), a formation step of the opening portion 38 and the like (FIG. 20A), and a formation step of the conductive layer 21 and the like (FIG. 20B), among the steps illustrated in FIGS. 19A to 20B (the steps of forming the structure on the substrate 14 side).

That is, a back plane substrate can be manufactured with five photomasks.

In the case where the display device has a structure in which one or two source lines are provided for each pixel column, the pixel 11 having the structure illustrated in FIG. 13 is not necessarily provided and all the pixels 11 can have the structure illustrated in FIG. 12, for example. Even in this case, the manufacture of the backplane substrate needs five photolithography steps in total: that is, five photomasks are necessary. Thus, in the case where four source lines are provided for each pixel column, the display device can be manufactured with the same number of photomasks as that in the case where one or two source lines are provided for each pixel column. Accordingly, the manufacturing cost of the display device having a structure in which four source lines are provided for each pixel column can be prevented from exceeding that of the display device having a structure in which one or two source lines are provided for each pixel column.

The above is the description of an example of a method of manufacturing the pixel and the like.

[Shape of Conductive Layer]

For a conductive film which can be used as a wiring such as a gate line or a source line, a low-resistance material such as metal or an alloy is preferably used because it can reduce the wiring resistance. In the case where a display device having a large screen is manufactured, increasing the width of a wiring is also effective. However, such a conductive film does not transmit visible light, and in a transmissive liquid crystal display device, the following problems occur in some cases: the width of a wiring itself is large; and the aperture ratio is decreased owing to an increase in the number of wirings.

The shape of an end portion of the conductive film is devised, whereby light from a backlight unit can be extracted efficiently.

Figure 22A:
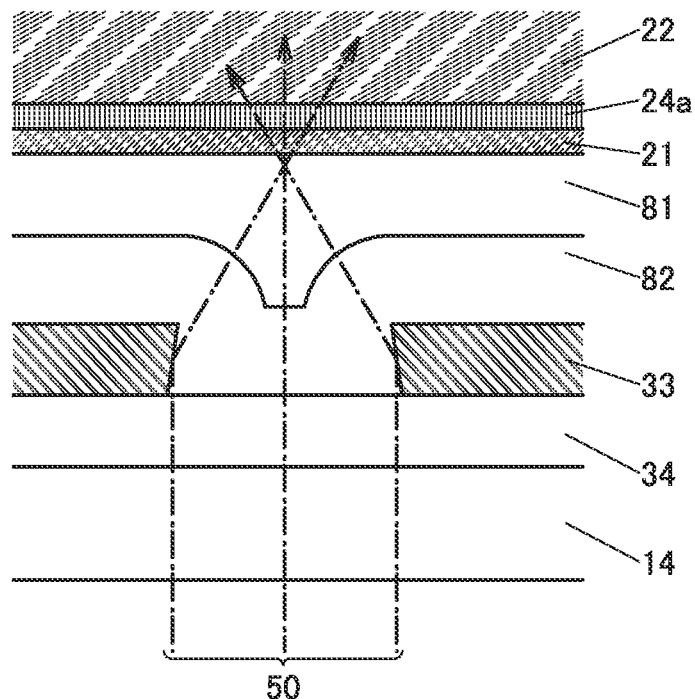
FIGS. 22A and 22B each illustrate a structural example of a display device.

FIG. 22A is a cross-sectional view of the conductive layer 33 forming a source line or the like and the vicinity thereof. The conductive layer 33 has an inverse tapered end portion. The conductive layer 33 can be the conductive layers 33a, 33b, and 33c, for example. The conductive layer 33 can be the conductive layer 51, for example.

Here, a taper angle refers to an angle between a bottom surface (a surface in contact with a surface where a thin film is formed) and a side surface at an end portion of the thin film. The taper angle is greater than 0° and less than 180°. A taper with an angle less than 90° is referred to as a forward taper whereas a taper with an angle greater than 90° is referred to as an inverse taper.

As illustrated in FIG. 22A, when the conductive layer 33 has an inverse tapered shape, part of light 50 from the backlight unit is reflected by a side surface of the conductive layer 33 and reaches the liquid crystal 22. Consequently, the light extraction efficiency can be increased compared with the case where the conductive layer 33 has a perpendicular side surface or a tapered side surface.

Here, the taper angle of the conductive layer 33 is preferably greater than 90° and less than 135°, further preferably greater than or equal to 91° and less than or equal to 120°, still further preferably greater than or equal to 95° and less than or equal to 110°.

Figure 22B:
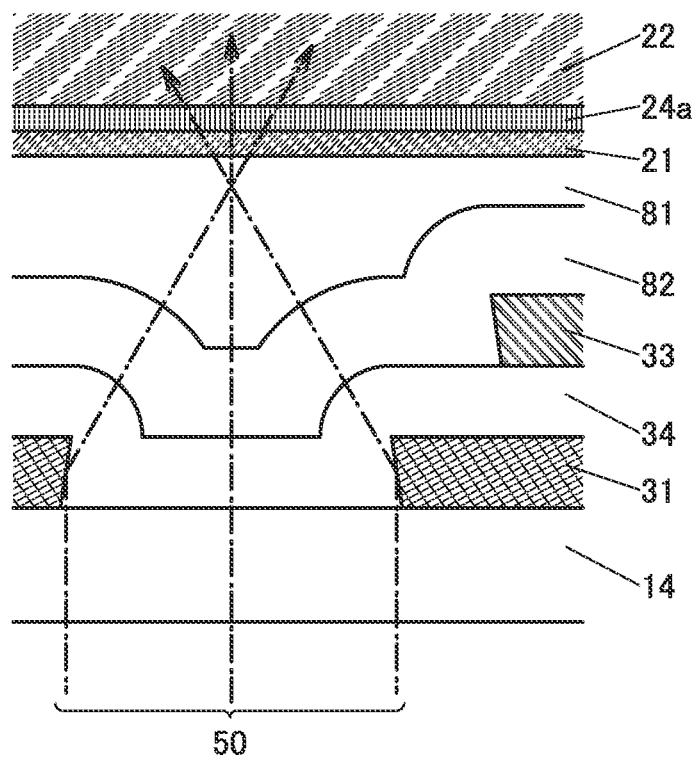

FIG. 22B illustrates an example where the conductive layer 31 forming a gate line or the like has an inverse tapered shape. When the conductive layer 31 has an inverse tapered shape as well as the conductive layer 33, the light extraction efficiency can be increased more efficiently.

The above is the description of the wiring shape.

At least part of this embodiment can be implemented in combination with any of the other embodiments described in this specification as appropriate.

Embodiment 2

In this embodiment, a connection relationship between the wiring SL and the pixel 11 in the display portion 17 is described. As an example, the case where a liquid crystal element is used as the display element is described. FIGS. 23A and 23B, FIG. 24, FIG. 25, FIG. 27, FIG. 28, and FIG. 29 are block diagrams each illustrating part of the display portion 17. In FIGS. 23A and 23B, FIG. 24, FIG. 25, FIG. 27, FIG. 28, and FIG. 29, "+" and "−" indicate the polarities of signals supplied to the pixels 11.

<Driving Methods>

In general, a liquid crystal element tends to deteriorate when a DC voltage is continuously applied. Thus, for a display device including liquid crystal elements as display elements, a driving method in which the polarity of signals applied to the liquid crystal elements is inverted every frame period (the driving method is also referred to as "frame inversion driving") is used. For example, positive signals are supplied to all the pixels during an odd-numbered frame and negative signals are supplied to all the pixels during an even-numbered frame. The polarity is not necessarily inverted every frame but may be inverted every specified number of frames in some liquid crystal elements.

In frame inversion driving in which potentials having the same polarity are supplied to all the pixels, a phenomenon such as a flicker or crosstalk is likely to occur at the time of image display and might degrade the display quality of the display device. To suppress such a phenomenon, driving methods such as source line inversion driving, gate line inversion driving, and dot inversion driving have been proposed.

[Source Line Inversion Driving]

Source line inversion driving (also referred to as "column inversion driving" or the like) is a driving method in which the polarity of the signals supplied to the pixels is inverted every specified number of frames and every specified number of signal lines (source lines).

[Gate Line Inversion Driving]

Gate line inversion driving (also referred to as "row inversion driving" or the like) is a driving method in which the polarity of the signals supplied to the pixels is inverted every specified number of frames and every specified number of scan lines (gate lines).

[DOT INVERSION DRIVING]

Dot inversion driving (also referred to as "row inversion driving" or the like) is a driving method in which the polarity of the signals supplied to the pixels adjacent in the row and column directions is inverted every specified number of frames. In the dot inversion driving, the polarity of the signals can be inverted every specified number of pixels. For example, the polarity of the supplied signals may be inverted every pixel or every plurality of pixels.

Dot inversion driving is more effective in suppressing the phenomenon such as a flicker or crosstalk than source line inversion driving and gate line inversion driving. Thus, dot inversion driving is often used as a driving method of a liquid crystal display device.

<Connection Relationship Between Wiring SL and Pixel 11>

Next, a connection relationship between the wiring SL and the pixel 11 in the display portion 17 is described. First, the connection relationship for dot inversion driving performed every pixel is described.

[CONNECTION RELATIONSHIP FOR DOT INVERSION DRIVING]

[Display Portion Including Two Source Lines for Each Column]

Figure 23A:
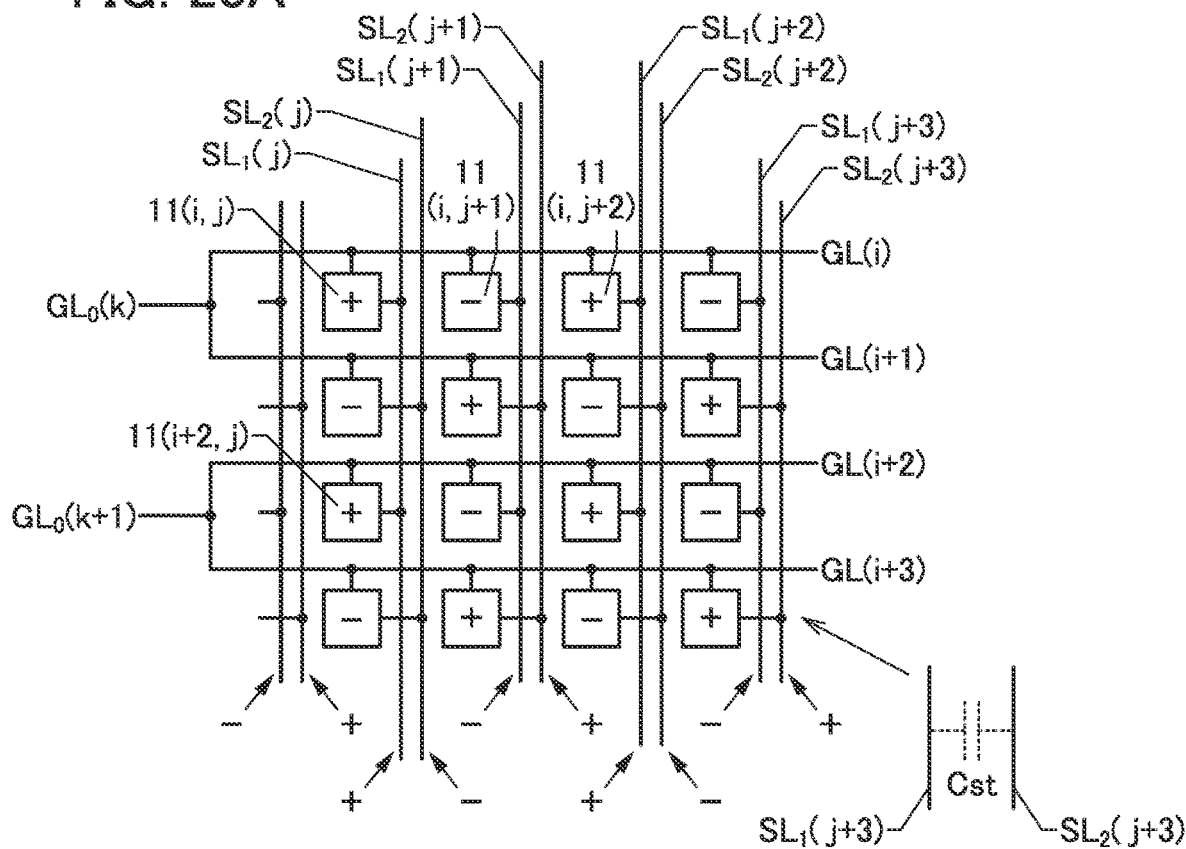
FIGS. 23A and 23B each illustrate a structural example of a display portion.
Figure 23B:
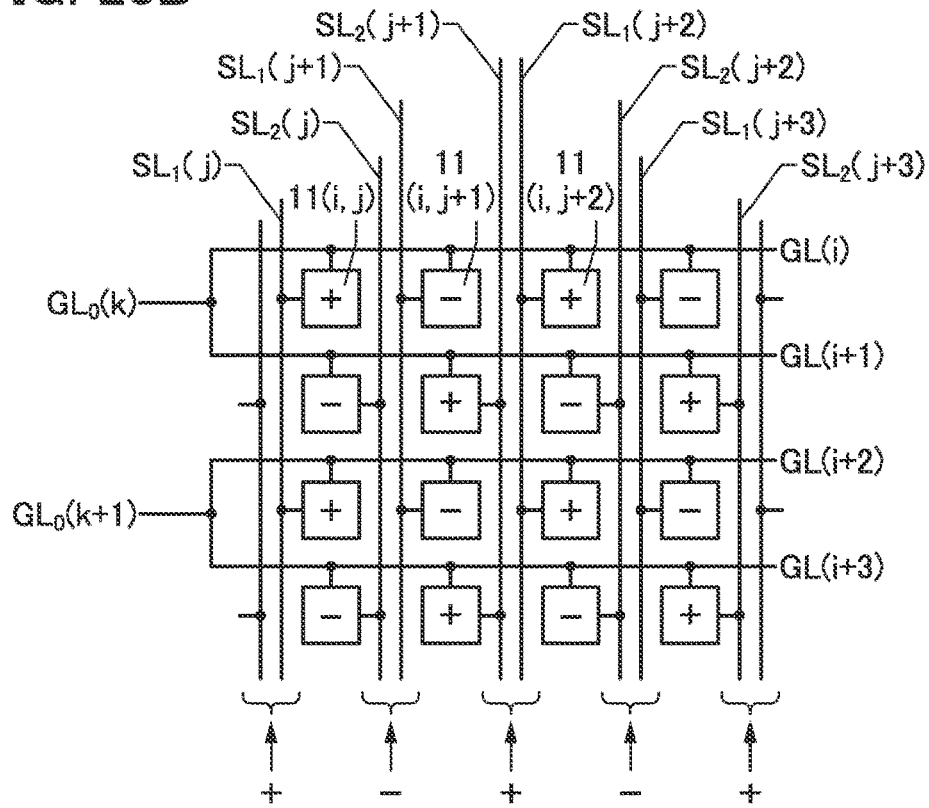

FIGS. 23A and 23B illustrate part of the display portion 17 in which two source lines are provided for each column. In FIG. 23A, the wiring $SL_1(j)$ and the wiring $SL_2(j)$ are provided between pixels 11 in the j-th column and the pixels 11 in the j+1-th column.

In FIG. 23A, the pixel 11(i, j) and the pixel 11(i+2, j) are electrically connected to the wiring $SL_1(j)$, and the pixel 11(i+1, j) and the pixel 11(i+3, j) are electrically connected to the wiring $SL_2(j)$.

Thus, in FIG. 23A, the pixel 11 provided in the j-th column and an i+2x row (x is an integer greater than or equal to 0) is electrically connected to the wiring $SL_1(j)$. The pixel 11 provided in the j-th column and an i+2x+1-th row is electrically connected to the wiring $SL_2(j)$.

For dot inversion driving in the connection illustrated in FIG. 23A, signals having different polarities need to be supplied to the adjacent wirings $SL_1(j)$ and $SL_2(j)$. Because of parasitic capacitance Cst generated between the wirings $SL_1(j)$ and $SL_2(j)$, a large potential difference between the wirings $SL_1(j)$ and $SL_2(j)$ increases the load of the source driver and is likely to increase power consumption.

In view of the above, the wirings SL and the pixels 11 are preferably arranged as illustrated in FIG. 23B. In FIG. 23B, the pixels 11 in the j-th column are provided between the wiring $SL_1(j)$ and the wiring $SL_2(j)$. In FIG. 23B, the wiring $SL_2(j)$ and the wiring $SL_1(j+1)$ are provided between pixels 11 in the j-th column and the pixels 11 in the j+1-th column.

Note that the pixel 11 provided in the j-th column and the i+2x row is electrically connected to the wiring $SL_1(j)$. The pixel 11 provided in the j-th column and the i+2x+1-th row is electrically connected to the wiring $SL_2(j)$.

For dot inversion driving in the connection illustrated in FIG. 23B, signals having the same polarity are supplied to the adjacent wirings $SL_2(j)$ and $SL_1(j+1)$. Signals having the same polarity are also supplied to adjacent wirings $SL_2(j+1)$ and $SL_1(j+2)$. When the signals having the same polarity are supplied to adjacent wirings SL, a potential difference between these wirings can be reduced. Accordingly, the load of the source driver at the time of signal rewriting is reduced and power consumption can be reduced.

[Display Portion Including Three Source Lines for Each Column]

Figure 24:
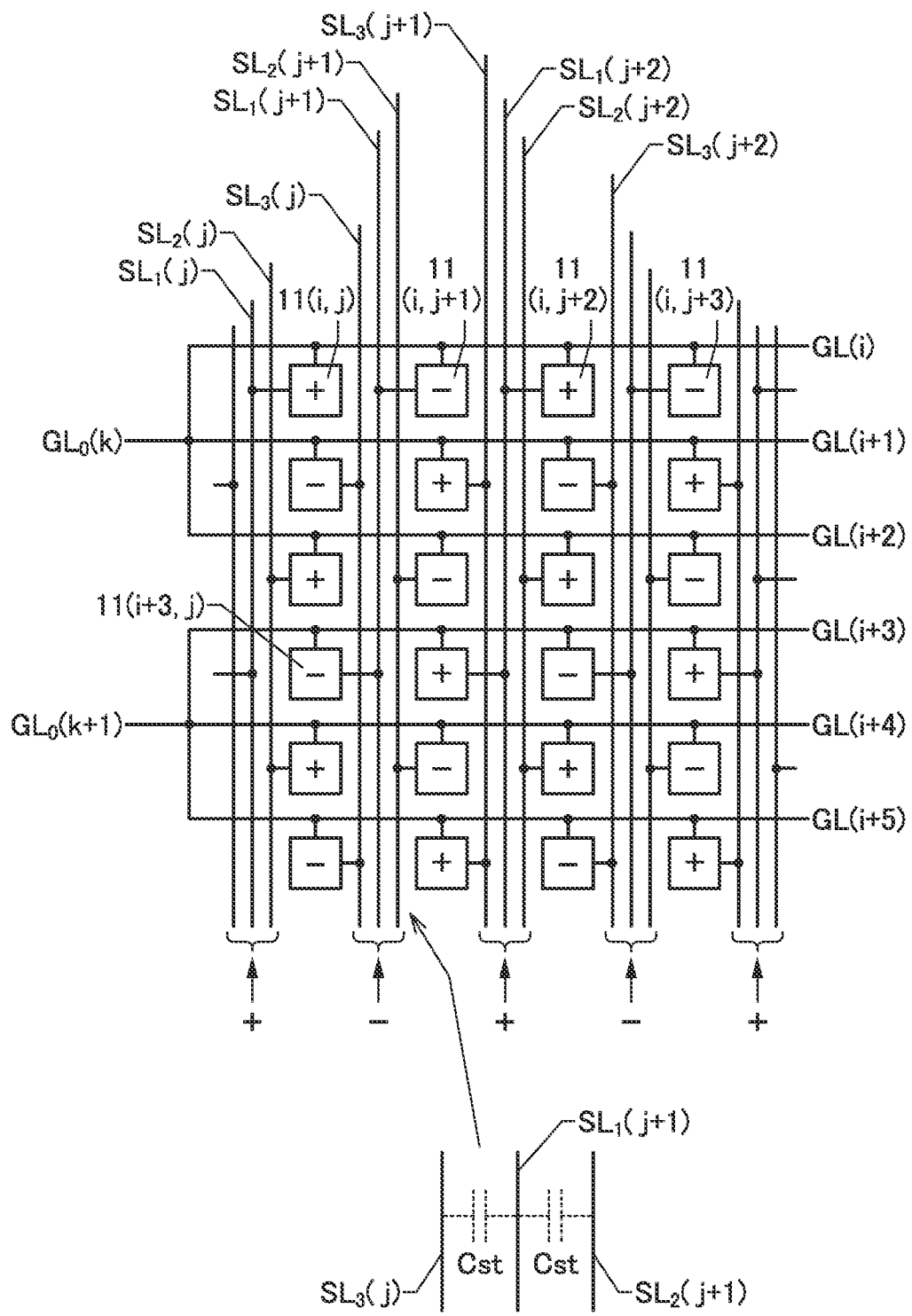
FIG. 24 illustrates a structural example of a display portion.
Figure 25:
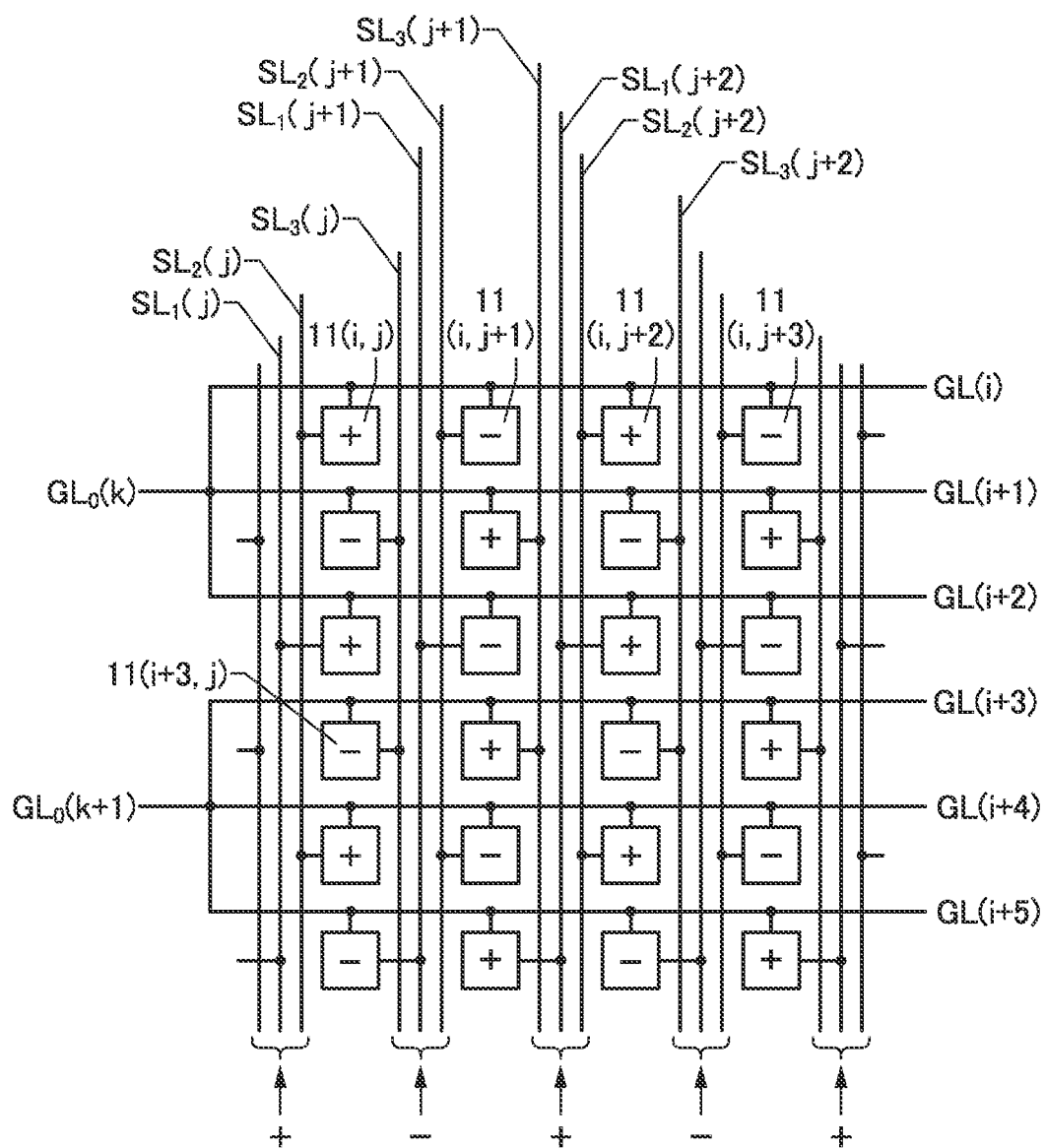
FIG. 25 illustrates a structural example of a display portion.

FIG. 24 and FIG. 25 illustrate part of the display portion 17 in which three source lines are provided for each column. In FIG. 24 and FIG. 25, the pixels 11 in the j-th column are provided between the wiring $SL_2(j)$ and the wiring $SL_3(j)$. The wiring $SL_1(j)$ is provided adjacent to the wiring $SL_2(j)$.

In FIG. 24, the pixel 11($i, j$) is electrically connected to the wiring $SL_1(j)$, the pixel 11($i+1, j$) and a pixel 11($i+5, j$) are electrically connected to the wiring $SL_3(j)$, the pixel 11($i+2, j$) and a pixel 11($i+4, j$) are electrically connected to the wiring $SL_2(j)$, and the pixel 11($i+3, j$) is electrically connected to the wiring $SL_1(j+1)$.

Thus, in FIG. 24, the pixel 11 provided in the j-th column and an i+6x row (x is an integer greater than or equal to 0) is electrically connected to the wiring $SL_1(j)$. The pixel 11 provided in the j-th column and an i+6x+1-th row and the pixel 11 provided in the j-th column and an i+6x+5-th row are electrically connected to the wiring $SL_3(j)$. The pixel 11 provided in the j-th column and an i+6x+2-th row and the pixel 11 provided in the j-th column and an i+6x+4-th row are electrically connected to the wiring $SL_2(j)$. The pixel 11 provided in the j-th column and an i+6x+3-th row is electrically connected to the wiring $SL_1(j+1)$.

The wirings SL and the pixels 11 may be connected as illustrated in FIG. 25. In FIG. 25, the pixel 11($i, j$) and the pixel 11($i+4, j$) are electrically connected to the wiring $SL_2(j)$, the pixel 11($i+1, j$) and the pixel 11($i+3, j$) are electrically connected to the wiring $SL_3(j)$, the pixel 11($i+2, j$) is electrically connected to the wiring $SL_1(j)$, and the pixel 11($i+5, j$) is electrically connected to the wiring $SL_1(j+1)$.

Thus, in FIG. 25, the pixel 11 provided in the j-th column and the i+6x-th row (x is an integer greater than or equal to 0) and the pixel 11 provided in the j-th column and the i+6x+4-th row are electrically connected to the wiring $SL_2(j)$. The pixel 11 provided in the j-th column and the i+6x+1-th row and the pixel 11 provided in the j-th column and the i+6x+3-th row are electrically connected to the wiring $SL_3(j)$. The pixel 11 provided in the j-th column and the i+6x+2-th row is electrically connected to the wiring $SL_1(j)$. The pixel 11 provided in the j-th column and the i+6x+5-th row is electrically connected to the wiring $SL_1(j+1)$.

In FIG. 24 and FIG. 25, the wiring $SL_3(j)$, the wiring $SL_1(j+1)$, and the wiring $SL_2(j+1)$ are provided between the pixels 11 in the j-th column and the pixels 11 in the j+1-th column. In addition, parasitic capacitance Cst is generated between the wirings $SL_3(j)$, $SL_1(j+1)$, and $SL_2(j+1)$.

In particular, parasitic capacitance Cst between the wirings $SL_3(j)$ and $SL_1(j+1)$ and parasitic capacitance Cst between the wirings $SL_2(j+1)$ and $SL_1(j+1)$ are added to the wiring $SL_1(j+1)$ provided between the wiring $SL_3(j)$ and the wiring $SL_2(j+1)$, which is likely to increase the load of the source driver. Therefore, signals having the same polarity are preferably supplied to the wirings $SL_3(j)$, $SL_1(j+1)$, and $SL_2(j+1)$.

As described above, one embodiment of the present invention is particularly effective when the number of source lines for each column is greater than or equal to three. In other words, when g wirings GL are provided for each pixel column, g is preferably greater than or equal to three. Similarly, when the wiring $GL_0$ is electrically connected to f wirings GL, f is preferably greater than or equal to three.

For dot inversion driving in the connection illustrated in FIG. 24 and FIG. 25, signals having the same polarity are supplied to the wirings $SL_3(j)$, $SL_1(j+1)$, and $SL_2(j+1)$. Signals having the same polarity are also supplied to the wirings $SL_3(j+1)$, $SL_1(j+2)$, and $SL_2(j+2)$.

When the signals having the same polarity are supplied to adjacent wirings SL, a potential difference between these wirings can be reduced. Accordingly, the load of the source driver at the time of signal rewriting is reduced and power consumption can be reduced.

[Driving Waveform]

Figure 26:
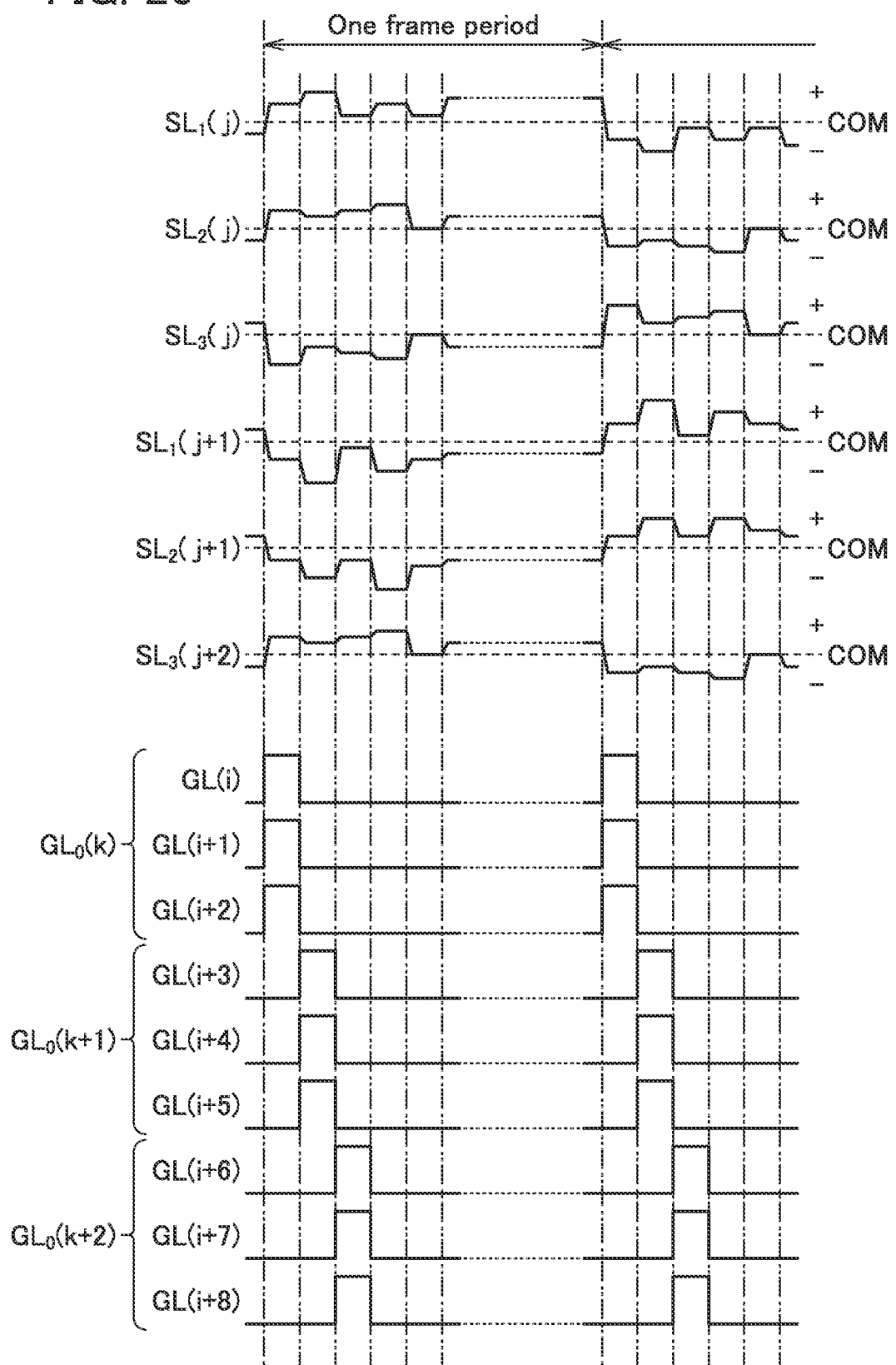
FIG. 26 illustrates a structural example of a display portion.

FIG. 26 shows an example of a driving waveform for the dot inversion driving of the display portion 17 illustrated in FIG. 24. During a certain frame period, positive signals are supplied to the wirings $SL_1(j)$ and $SL_2(j)$, and a negative signal is supplied to the wiring $SL_3(j)$.

Also during this frame period, pulsed selection signals are sequentially supplied to all the wirings $GL_0$. For example, when a selection signal is supplied to the wiring $GL_0(k)$, the selection signal is supplied to three wirings GL (the wirings GL(i), GL(i+1), and GL(i+2)) at one time. Then, a positive signal is supplied, through the wiring $SL_1(j)$, to the pixels to which the wiring GL(i) is connected. Then, a negative signal is supplied, through the wiring $SL_3(j)$, to the pixels to which the wiring GL(i+1) is connected. Then, a positive signal is supplied, through the wiring $SL_2(j)$, to the pixels to which the wiring GL(i+2) is connected.

All the wirings $GL_0$ are sequentially selected, whereby signals can be supplied to all the pixels 11. During the next frame period, negative signals are supplied to the wirings $SL_1(j)$ and $SL_2(j)$, and a positive signal is supplied to the wiring $SL_3(j)$. In this manner, signals having different polarities can be supplied to pixels adjacent in the row, and column directions every frame.

In the dot inversion driving, for example, if the polarity of the signals supplied to the wirings SL is inverted every row, the voltage amplitude supplied to the wirings SL is increased, which increases the load of the source driver and power consumption. In the display device of one embodiment of the present invention, even in the dot inversion driving, signals having the same polarity can be supplied to the wirings SL during one frame period. Thus, the voltage amplitude supplied to the wirings SL can be small, so that the load of the source driver at the time of signal rewriting and power consumption can be reduced.

In the structure in FIG. 24, each row selection step enables signals to be supplied to the pixels 11 for three rows. Thus, a selection period for one row can be extended. According to one embodiment of the present invention, signals can be reliably written to the pixels 11, and the display quality of the display device can be improved.

[Display Portion Including Four Source Lines for Each Column]

Figure 27:
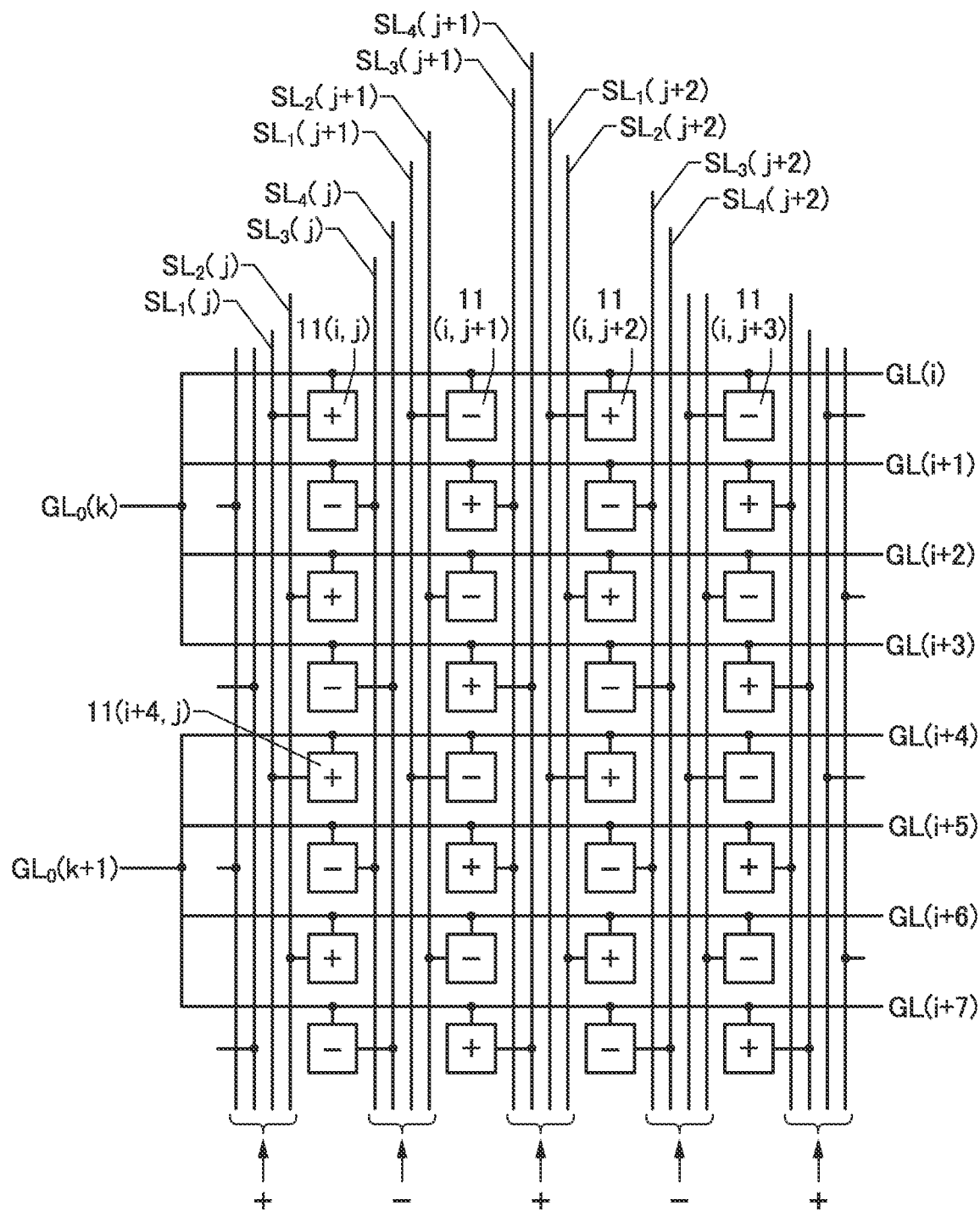
FIG. 27 illustrates a structural example of a display portion.
Figure 28:
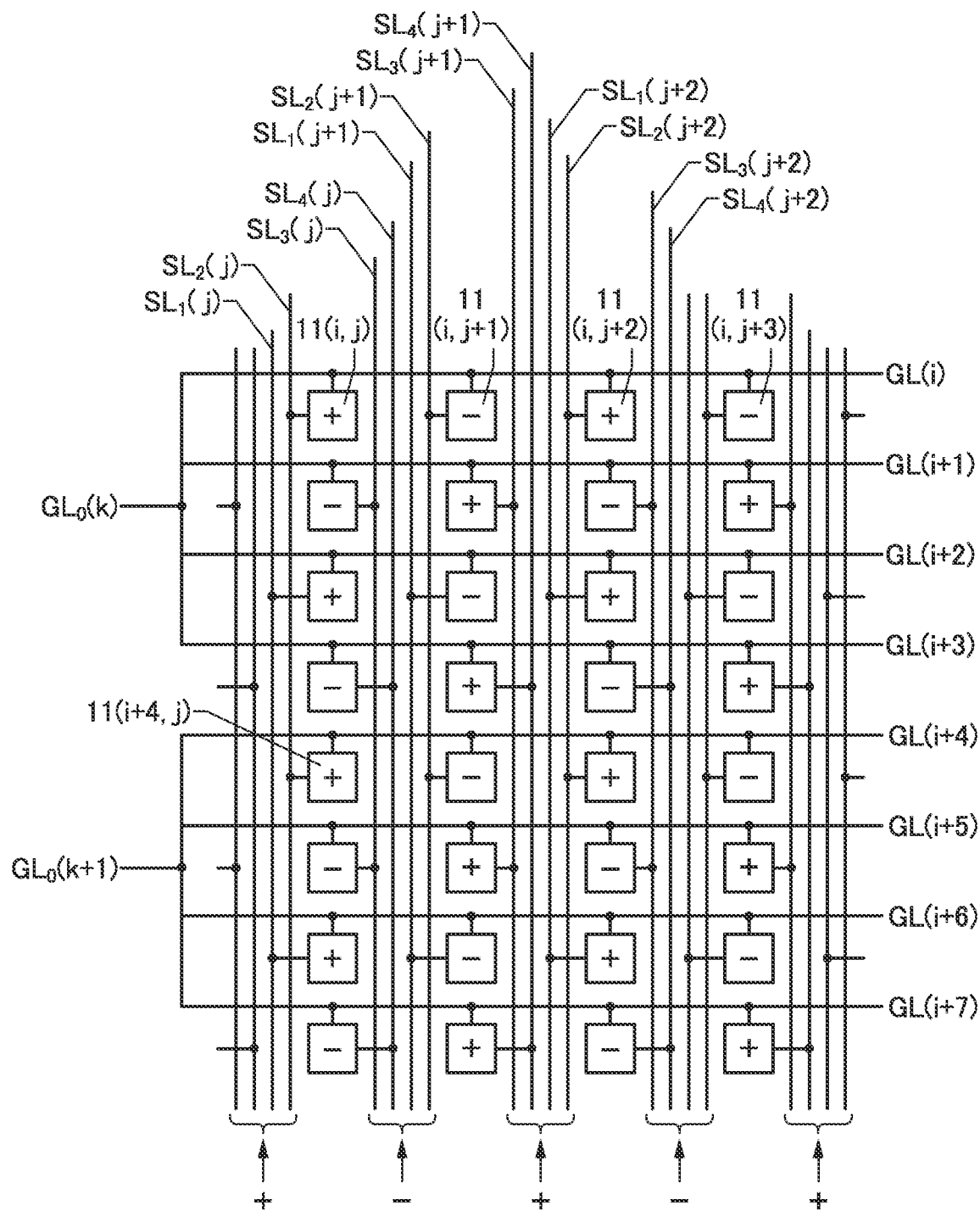
FIG. 28 illustrates a structural example of a display portion.

FIG. 27 and FIG. 28 illustrate part of the display portion 17 in which four source lines are provided for each column. In FIG. 27 and FIG. 28, the pixels 11 in the j-th column are provided between the wirings $SL_1(j)$ and $SL_2(j)$ and the wirings $SL_3(j)$ and $SL_4(j)$.

In FIG. 27, the pixel $11(i, j)$ and the pixel $11(i+4, j)$ are electrically connected to the wiring $SL_1(j)$, the pixel $11(i+1, j)$ and the pixel $11(i+5, j)$ are electrically connected to the wiring $SL_3(j)$, the pixel $11(i+2, j)$ and the pixel $11(i+6, j)$ are electrically connected to the wiring $SL_2(j)$, and the pixel $11(i+3, j)$ and the pixel $11(i+7, j)$ are electrically connected to the wiring $SL_4(j)$.

Thus, in FIG. 27, the pixel 11 provided in the j-th column and an i+4x row (x is an integer greater than or equal to 0) is electrically connected to the wiring $SL_1(j)$. The pixel 11 provided in the j-th column and an i+4x+1-th row is electrically connected to the wiring $SL_3(j)$. The pixel 11 provided in the j-th column and an i+4x+2-th row is electrically connected to the wiring $SL_2(j)$. The pixel 11 provided in the j-th column and an i+4x+3-th row is electrically connected to the wiring $SL_4(j)$.

In FIG. 28, the pixel $11(i, j)$ and the pixel $11(i+4, j)$ are electrically connected to the wiring $SL_2(j)$, the pixel $11(i+1, j)$ and the pixel $11(i+5, j)$ are electrically connected to the wiring $SL_3(j)$, the pixel $11(i+2, j)$ and the pixel $11(i+6, j)$ are electrically connected to the wiring $SL_1(j)$, and the pixel $11(i+3, j)$ and the pixel $11(i+7, j)$ are electrically connected to the wiring $SL_4(j)$.

In FIG. 27 and FIG. 28, the wiring $SL_3(j)$, the wiring $SL_4(j)$, the wiring $SL_1(j+1)$, and the wiring $SL_2(j+1)$ are provided between the pixels 11 in the j-th column and the pixels 11 in the j+1-th column. In addition, parasitic capacitance Cst is generated between the wirings $SL_3(j)$, $SL_4(j)$, $SL_1(j+1)$, and $SL_2(j+1)$.

For dot inversion driving in the connection illustrated in FIG. 27 and FIG. 28, signals having the same polarity are supplied to the wirings $SL_3(j)$, $SL_4(j)$, $SL_1(j+1)$, and $SL_2(j+1)$. Signals having the same polarity are also supplied to the wirings $SL_3(j+1)$, $SL_4(j+1)$, $SL_1(j+2)$, and $SL_2(j+2)$. When the signals having the same polarity are supplied to adjacent wirings SL, a potential difference between these wirings can be reduced. Accordingly, the load of the source driver at the time of signal rewriting is reduced and power consumption can be reduced.

[Display Portion Including Five Source Lines for Each Column]

Figure 29:
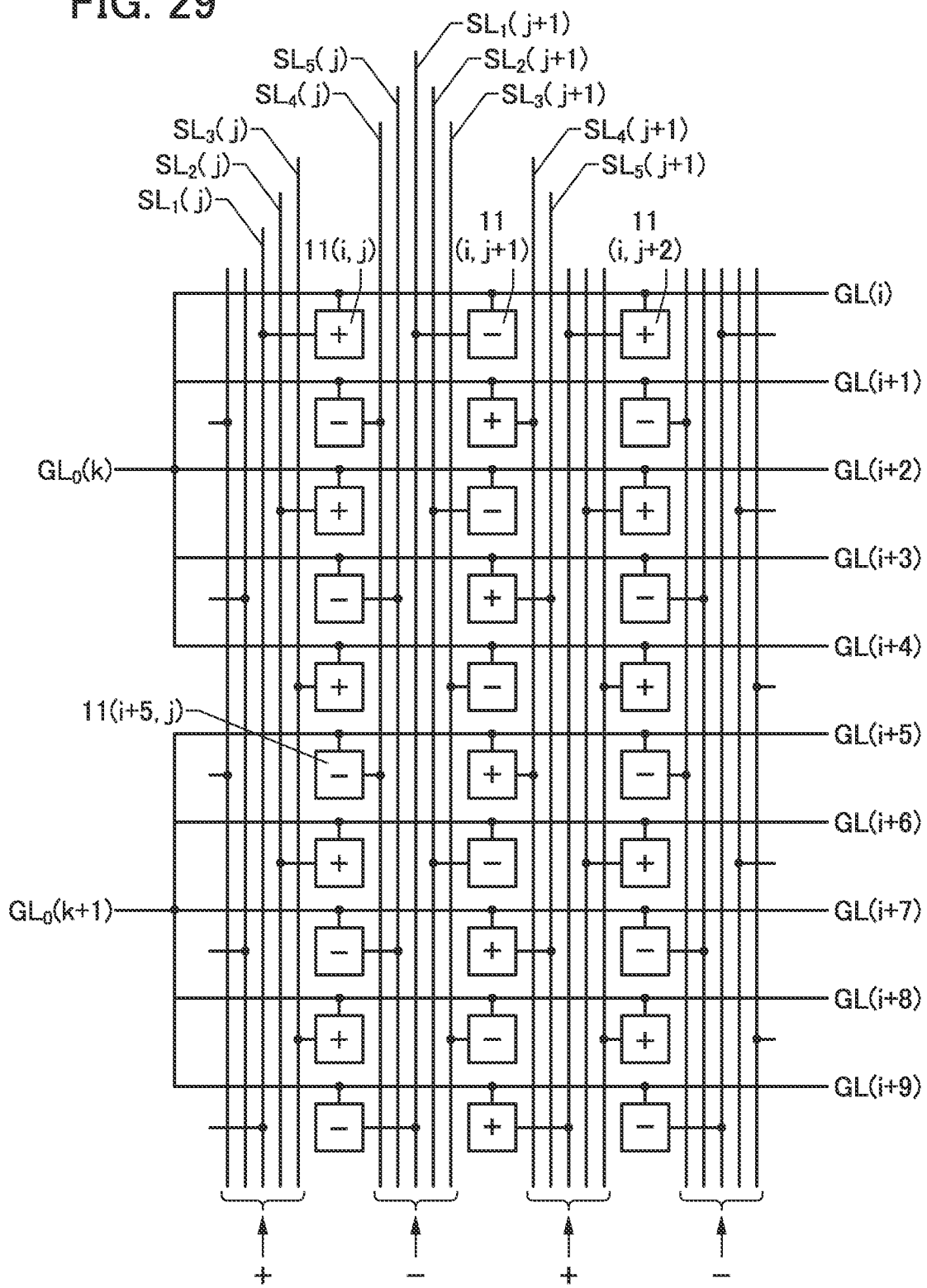
FIG. 29 illustrates a structural example of a display portion.

FIG. 29 illustrates part of the display portion 17 in which five source lines are provided for each column. In FIG. 29, the pixels 11 in the j-th column are provided between the wirings $SL_1(j)$, $SL_2(j)$, $SL_3(j)$ and the wirings $SL_4(j)$ and $SL_5(j)$.

In FIG. 29, the pixel $11(i, j)$ is electrically connected to the wiring $SL_1(j)$, the pixel $11(i+1, j)$ and the pixel $11(i+5, j)$ are electrically connected to the wiring $SL_4(j)$, the pixel $11(i+2, j)$ and the pixel $11(i+6, j)$ are electrically connected to the wiring $SL_2(j)$, the pixel $11(i+3, j)$ and the pixel $11(i+7, j)$ are electrically connected to the wiring $SL_5(j)$, the pixel $11(i+4, j)$ and the pixel $11(i+8, j)$ are electrically connected to the wiring $SL_3(j)$, and the pixel $11(i+9, j)$ is electrically connected to the wiring $SL_1(j+1)$.

Thus, in FIG. 29, the pixel 11 provided in the j-th column and an i+10x row (x is an integer greater than or equal to 0) is electrically connected to the wiring $SL_1(j)$. The pixel 11 provided in the j-th column and an i+10x+1-th row and the pixel 11 provided in the j-th column and an i+10x+5-th row are electrically connected to the wiring $SL_4(j)$. The pixel 11 provided in the j-th column and an i+6x+2-th row and the pixel 11 provided in the j-th column and an i+6x+6-th row are electrically connected to the wiring $SL_2(j)$. The pixel 11 provided in the j-th column and an i+6x+3-th row and the pixel 11 provided in the j-th column and an i+6x+7-th row are electrically connected to the wiring $SL_5(j)$. The pixel 11 provided in the j-th column and an i+6x+4-th row and the pixel 11 provided in the j-th column and an i+6x+8-th row are electrically connected to the wiring $SL_3(j)$. The pixel 11 provided in the j-th column and an i+6x+9-th row is electrically connected to the wiring $SL_1(j+1)$.

In FIG. 29, the wiring $SL_4(j)$, the wiring $SL_5(j)$, the wiring $SL_1(j+1)$, the wiring $SL_2(j+1)$, and the wiring $SL_3(j+1)$ are provided between the pixels 11 in the j-th column and the pixels 11 in the j+1-th column.

For dot inversion driving in the connection illustrated in FIG. 29, signals having the same polarity are supplied to the wirings $SL_4(j)$, $SL_5(j)$, $SL_1(j+1)$, $SL_2(j+1)$, and $SL_3(j+1)$. Signals having the same polarity are also supplied to the wirings $SL_4(j+1)$, $SL_5(j+1)$, $SL_1(j+2)$, $SL_2(j+2)$, and $SL_3(j+2)$. When the signals having the same polarity are supplied to adjacent wirings SL, a potential difference between these wirings can be reduced. Accordingly, the load of the source driver at the time of signal rewriting is reduced and power consumption can be reduced.

[Display Portion Including Six Source Lines for Each Column]

Figure 30:
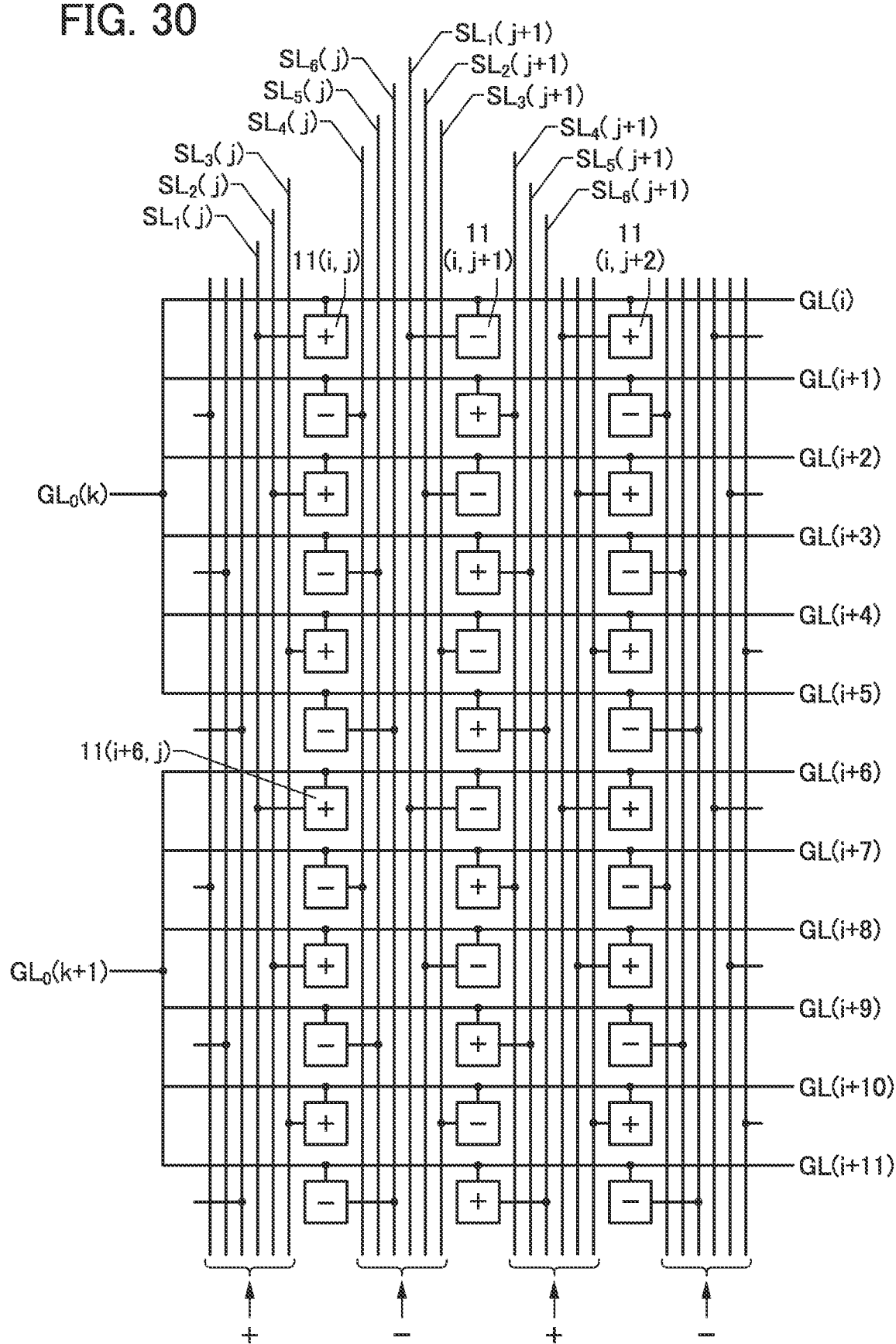
FIG. 30 illustrates a structural example of a display portion.

FIG. 30 illustrates part of the display portion 17 in which six source lines are provided for each column. In FIG. 30, the pixels 11 in the j-th column are provided between the wirings $SL_1(j)$ to $SL_3(j)$ and the wirings $SL_4(j)$ to $SL_6(j)$.

In FIG. 30, the pixel $11(i, j)$ and the pixel $11(i+6, j)$ are electrically connected to the wiring $SL_1(j)$, the pixel $11(i+1, j)$ and the pixel $11(i+7, j)$ are electrically connected to the wiring $SL_4(j)$, the pixel $11(i+2, j)$ and the pixel $11(i+8, j)$ are electrically connected to the wiring $SL_2(j)$, the pixel $11(i+3, j)$ and the pixel $11(i+9, j)$ are electrically connected to the wiring $SL_5(j)$, the pixel $11(i+4, j)$ and the pixel $11(i+10, j)$ are electrically connected to the wiring $SL_3(j)$, and the pixel $11(i+5, j)$ and the pixel $11(i+11, j)$ are electrically connected to the wiring $SL_6(j)$.

Thus, in FIG. 30, the pixel 11 provided in the j-th column and the i+6x row (x is an integer greater than or equal to 0) is electrically connected to the wiring $SL_1(j)$. The pixel 11 provided in the j-th column and the i+6x+1-th row is electrically connected to the wiring $SL_4(j)$. The pixel 11 provided in the j-th column and the i+6x+2-th row is electrically connected to the wiring $SL_2(j)$. The pixel 11 provided in the j-th column and the i+6x+3-th row is electrically connected to the wiring $SL_5(j)$. The pixel 11 provided in the j-th column and the i+6x+4-th row is electrically connected to the wiring $SL_3(j)$. The pixel 11 provided in the j-th column and the i+6x+5-th row is electrically connected to the wiring $SL_6(j)$.

In FIG. 30, the wirings $SL_4(j)$, $SL_5(j)$, $SL_6(j)$, $SL_1(j+1)$, $SL_2(j+1)$, and $SL_3(j+1)$ are provided between the pixels 11 in the j-th column and the pixels 11 in the j+1-th column.

For dot inversion driving in the connection illustrated in FIG. 30, signals having the same polarity are supplied to the wirings $SL_4(j)$, $SL_5(j)$, $SL_6(j)$, $SL_1(j+1)$, $SL_2(j+1)$, and $SL_3(j+1)$. Signals having the same polarity are also supplied to the wirings $SL_4(j+1)$, $SL_5(j+1)$, $SL_6(j+1)$, $SL_1(j+2)$, $SL_2(j+2)$, and $SL_3(j+2)$. When the signals having the same polarity are supplied to adjacent wirings SL, a potential difference between these wirings can be reduced. Accordingly, the load of the source driver at the time of signal rewriting is reduced and power consumption can be reduced.

[Connection Relationship for Source Line Inversion Driving]
[Display Portion Including Two Source Lines for Each Column]

Figure 31A:
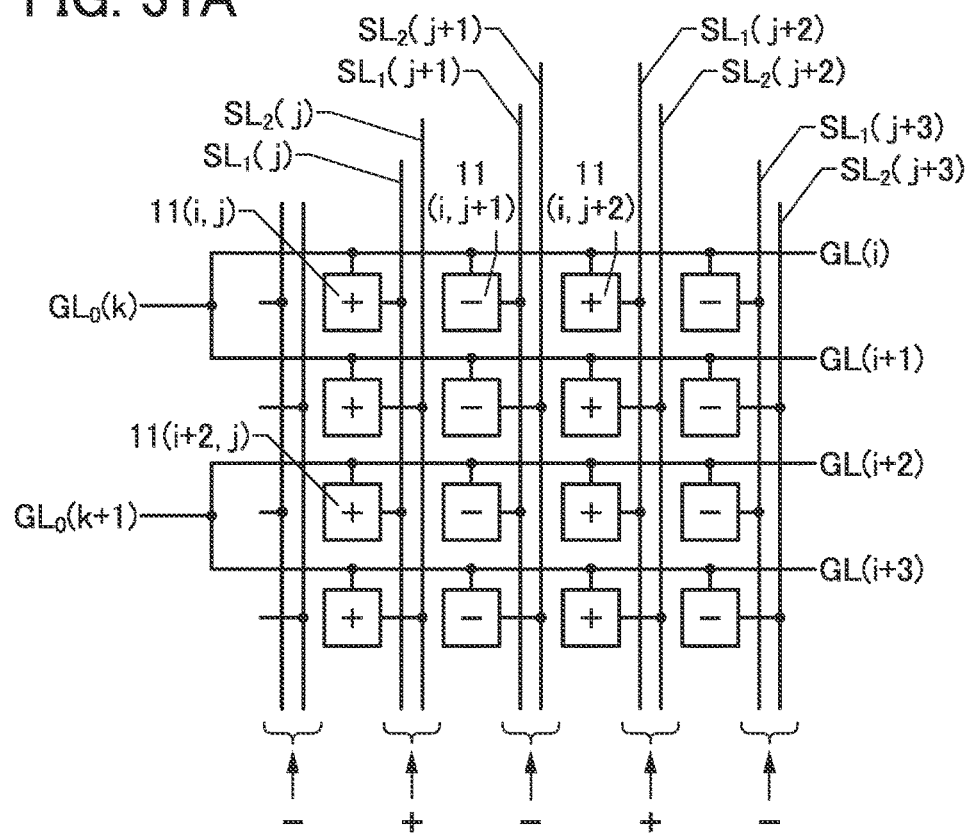
FIGS. 31A and 31B each illustrate a structural example of a display portion.

FIG. 31A illustrates part of the display portion 17 in which two source lines are provided for each column. In FIG. 31A, the wiring $SL_1(j)$ and the wiring $SL_2(j)$ are provided between pixels 11 in the j-th column and the pixels 11 in the j+1-th column.

In FIG. 31A, the pixel 11(i, j) and the pixel 11(i+2, j) are electrically connected to the wiring $SL_1(j)$, and the pixel 11(i+1, j) and the pixel 11(i+3, j) are electrically connected to the wiring $SL_2(j)$.

Thus, in FIG. 31A, the pixel 11 provided in the j-th column and the i+2x row (x is an integer greater than or equal to 0) is electrically connected to the wiring $SL_1(j)$. The pixel 11 provided in the j-th column and the i+2x+1-th row is electrically connected to the wiring $SL_2(j)$.

For source line inversion driving in the connection illustrated in FIG. 31A, signals having the same polarity are supplied to the adjacent wirings $SL_1(j)$ and $SL_2(j)$. Signals having the same polarity are also supplied to the adjacent wirings $SL_1(j+1)$ and $SL_2(j+1)$. When the signals having the same polarity are supplied to adjacent wirings SL, a potential difference between these wirings can be reduced. Accordingly, the load of the source driver at the time of signal rewriting is reduced and power consumption can be reduced.

[Connection Relationship for Gate Line Inversion Driving]
[Display Portion Including Two Source Lines for Each Column]

Figure 31B:
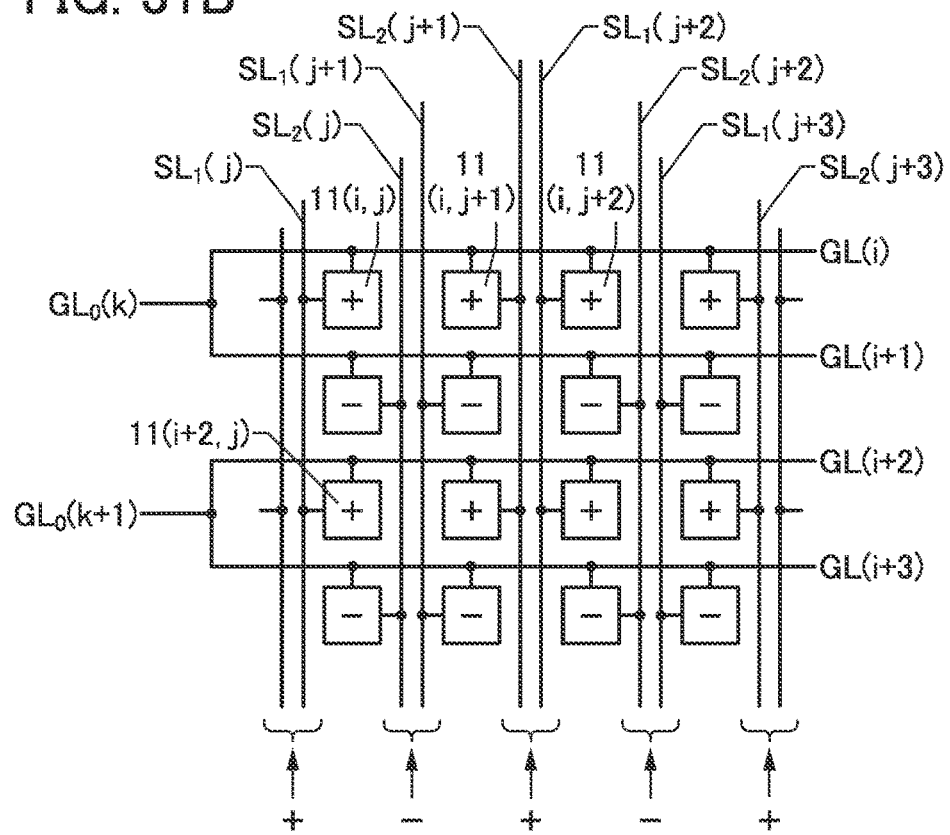

FIG. 31B illustrates part of the display portion 17 in which two source lines are provided for each column. In FIG. 31B, the pixels 11 in the j-th column are provided between the wiring $SL_1(j)$ and the wiring $SL_2(j)$. In FIG. 31B, the wiring $SL_2(j)$ and the wiring $SL_1(j+1)$ are provided between pixels 11 in the j-th column and the pixels 11 in the j+1-th column.

In FIG. 31B, the pixel 11 provided in the j-th column and the i+2x row is electrically connected to the wiring $SL_1(j)$. The pixel 11 provided in the j-th column and the i+2x+1-th row is electrically connected to the wiring $SL_2(j)$. The pixel 11 provided in the j+1-th column and the i+2x row is electrically connected to the wiring $SL_2(j+1)$. The pixel 11 provided in the j+1-th column and the i+2x+1 row is electrically connected to the wiring $SL_1(j+1)$.

For gate line inversion driving in the connection illustrated in FIG. 31B, signals having the same polarity are supplied to the adjacent wirings $SL_2(j)$ and $SL_1(j+1)$. Signals having the same polarity are also supplied to adjacent wirings $SL_2(j+1)$ and $SL_1(j+2)$. When the signals having the same polarity are supplied to adjacent wirings SL, a potential difference between these wirings can be reduced. Accordingly, the load of the source driver at the time of signal rewriting is reduced and power consumption can be reduced.

At least part of this embodiment can be implemented in combination with any of the other embodiments described in this specification as appropriate.

Embodiment 3

In this embodiment, structural examples of the gate driver 12a and the source driver 13a are described.

[STRUCTURAL EXAMPLE OF GATE DRIVER]

Figure 32A:
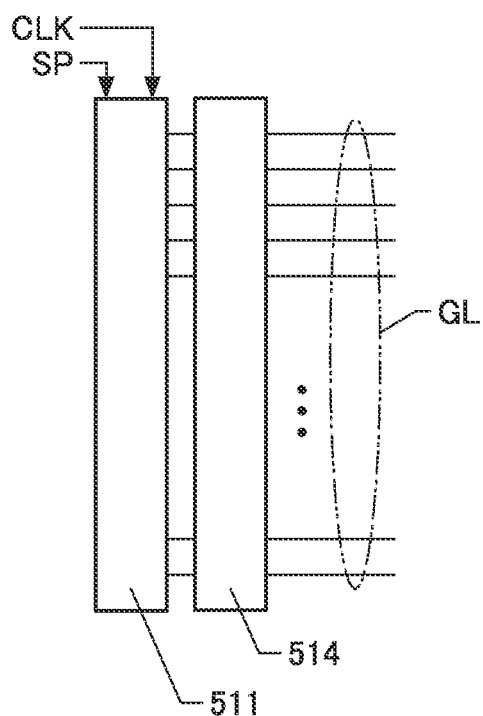
FIGS. 32A and 32B each illustrate a structural example of a driver circuit.

FIG. 32A illustrates a structural example of the gate driver 12a. The gate driver 12a includes a shift register 511 and a buffer amplifier 514. The gate driver 12a is electrically connected to the plurality of wirings GL (or the plurality of wirings $GL_0$).

A start pulse SP, a clock signal CLK, and the like are input to the shift register 511.

The shift register 511 has a function of selecting a wiring GL to which a selection signal is supplied in synchronization with the clock signal CLK. The selection signal is amplified by the buffer amplifier 514 and supplied to the wiring GL. The buffer amplifier 514 has a function of increasing current supply capability (a function of amplifying electricity). In addition, to increase the voltage amplitude of the selection signal, a level shifter that changes a power supply voltage may be included. Note that the gate driver 12b can have a structure similar to that of the gate driver 12a.

[STRUCTURAL EXAMPLE OF SOURCE DRIVER]

Figure 32B:
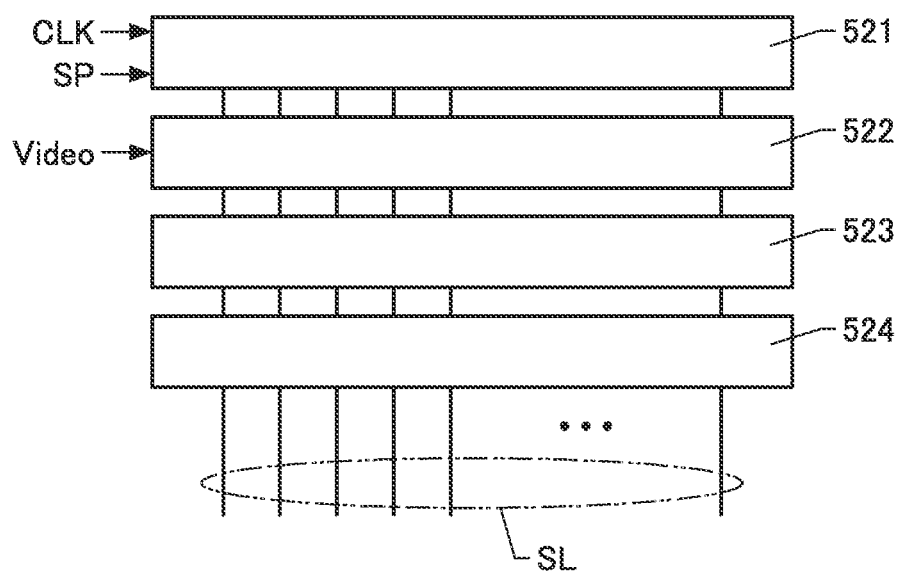

FIG. 32B illustrates a structural example of the source driver 13a. The source driver 13a includes a shift register 521, a latch 522, a DA converter 523, and a buffer amplifier 524. The source driver 13a is electrically connected to the plurality of wirings SL.

A start pulse SP, a clock signal CLK, and the like are input to the shift register 521. A digital image data Video is supplied to the latch 522. The latch 522 has a function of storing the image data Video. The DA converter 523 has a function of generating an analog image signal (video signal) by using the image data Video stored in the latch 522. Note that when a video signal is generated in the DA converter 523, gamma correction or the like may be performed.

The shift register 521 has a function of selecting a wiring SL to which the video signal is supplied in synchronization with the clock signal CLK. The video signal is amplified by the buffer amplifier 524 and supplied to the wiring SL. The buffer amplifier 524 has a function of increasing current supply capability. In addition, to increase the voltage amplitude of the video signal, a level shifter that changes a power supply voltage may be included. Note that the source driver 13b can have a structure similar to that of the source driver 13a.

Figure 33A:
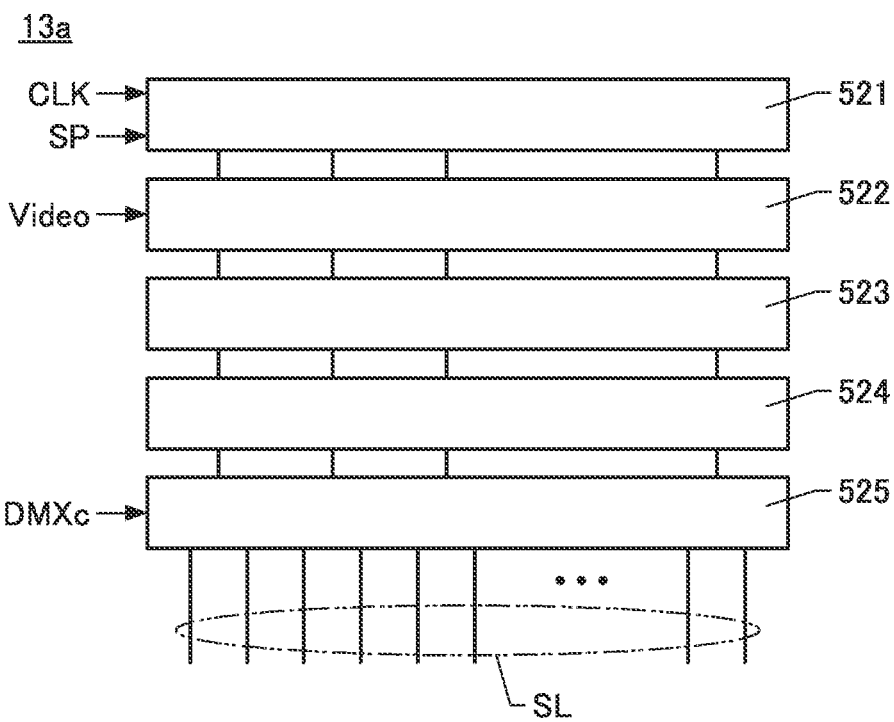
FIGS. 33A and 33B each illustrate a structural example of a driver circuit.

As illustrated in FIG. 33A, a demultiplexer 525 may be provided between the buffer amplifier 524 and the wirings SL. The demultiplexer 525 has a function of supplying an input signal to any of a plurality of outputs depending on a control signal DMXc.

With the demultiplexer 525, the number of signal lines for input to the source driver 13a can be reduced. This reduces the number of connection terminals of the display device and can improve the reliability of the display device.

Figure 33B:
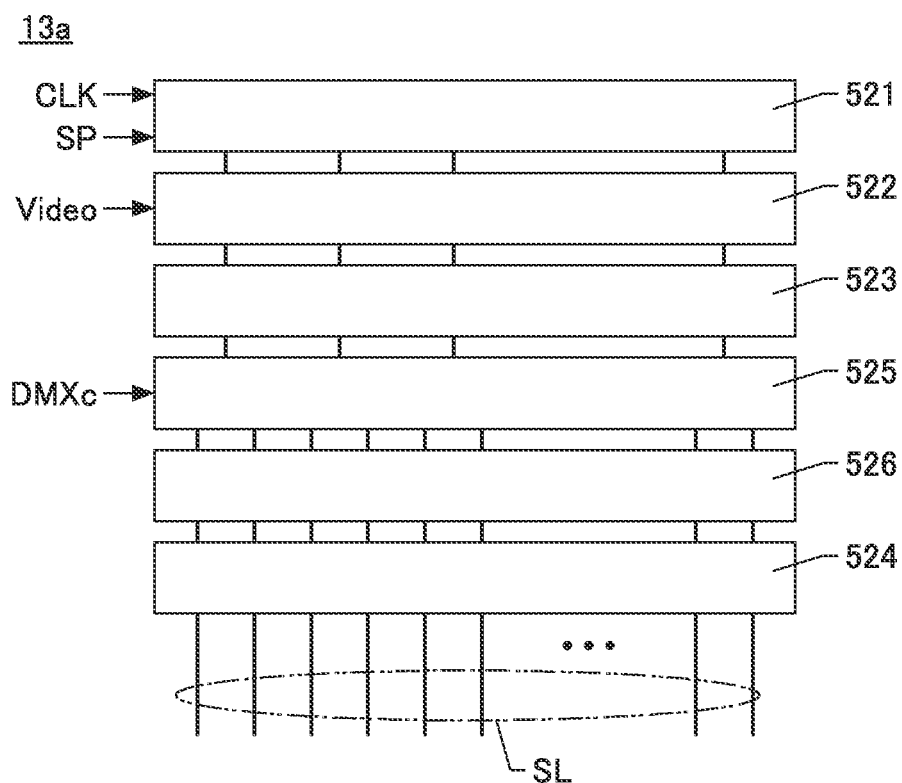

As illustrated in FIG. 33B, the demultiplexer 525 and an analog latch 526 may be provided between the DA converter 523 and the buffer amplifier 524. In the structure in FIG. 33B, the video signal supplied from the demultiplexer 525 are stored in the analog latch 526. After that, the video signal is amplified by the buffer amplifier 524 and output to the wiring SL. When the analog latch 526 is provided, output from the buffer amplifier 524 can be stabilized. Accordingly, an unintentional change in the potential of the wiring SL is prevented, and the display quality of the display device can be improved.

Figure 34:
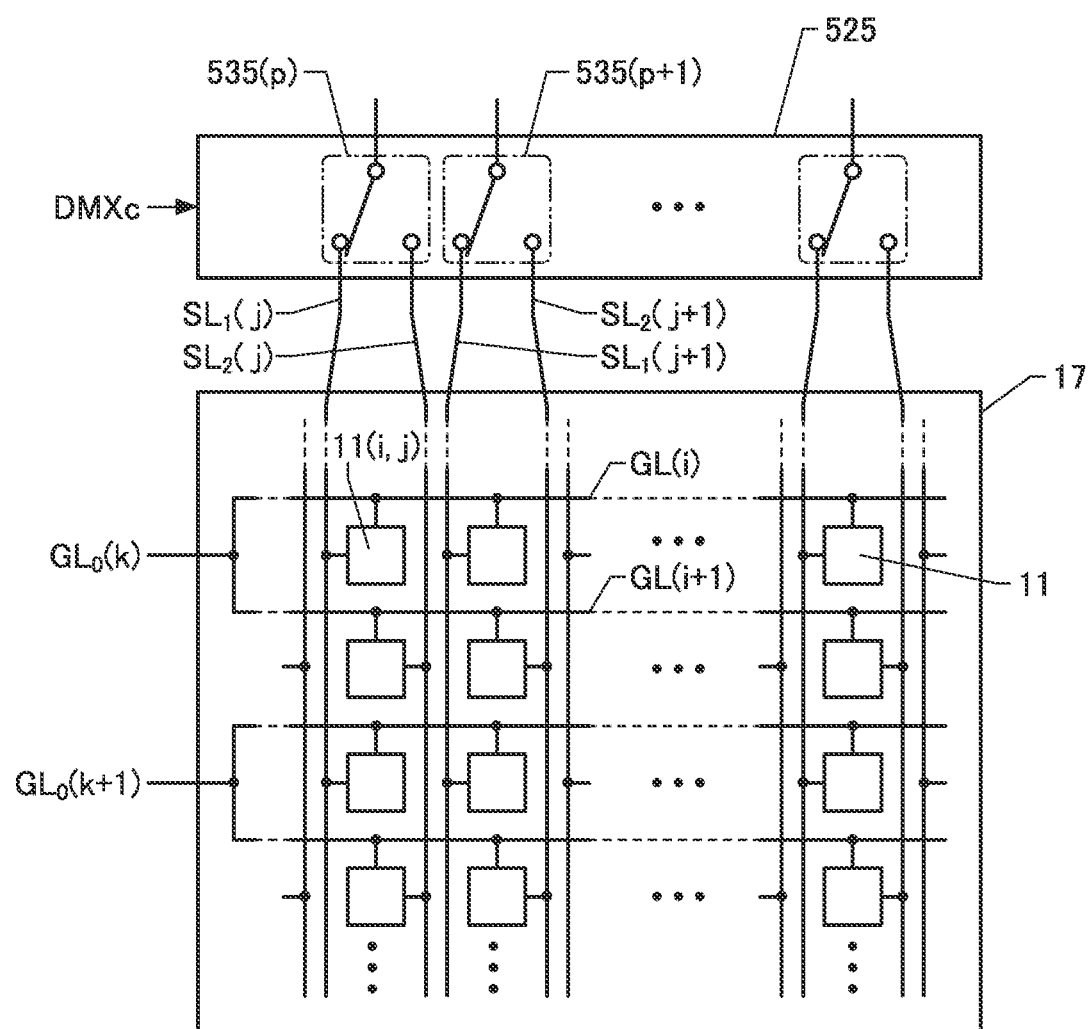
FIG. 34 illustrates an example of a connection between a demultiplexer and a display portion.
Figure 35:
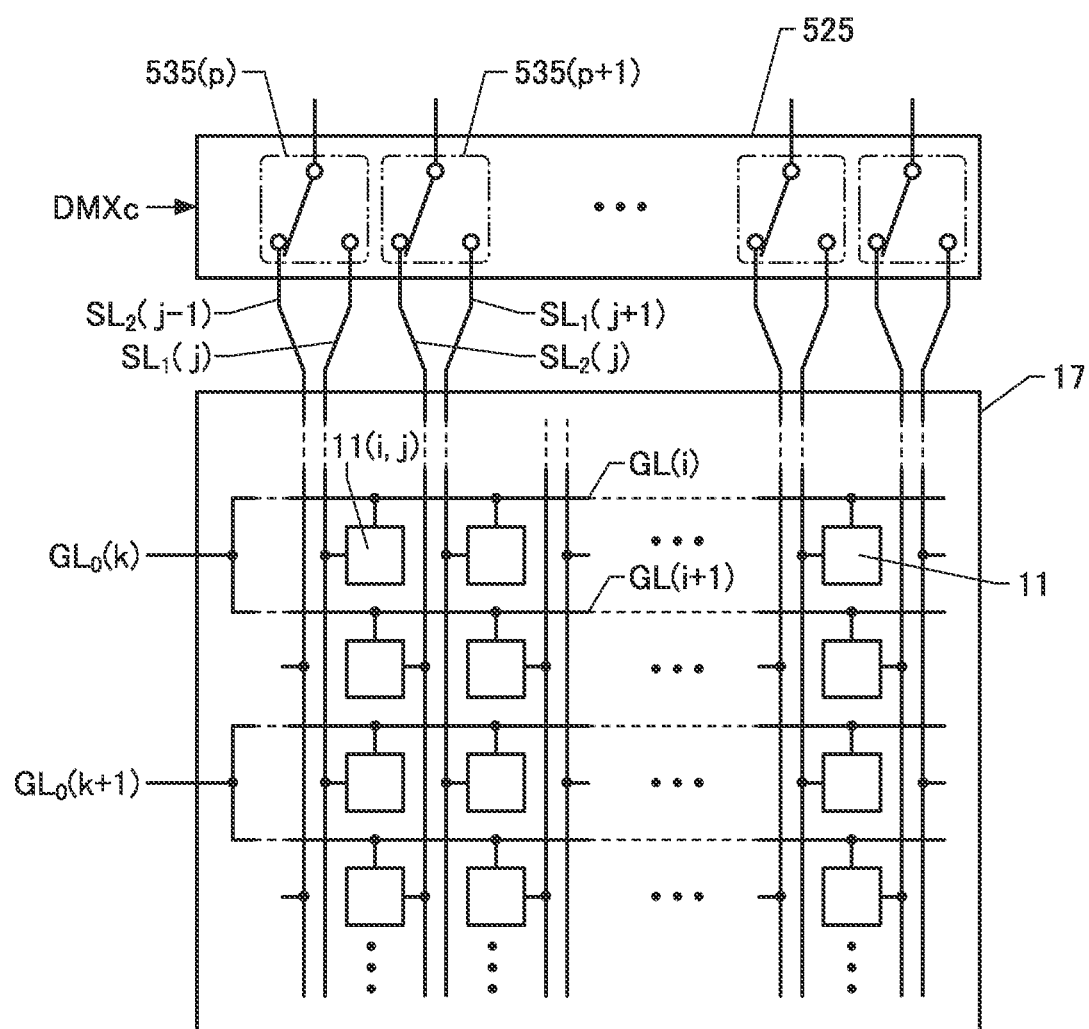
FIG. 35 illustrates an example of a connection between a demultiplexer and a display portion.
Figure 36:
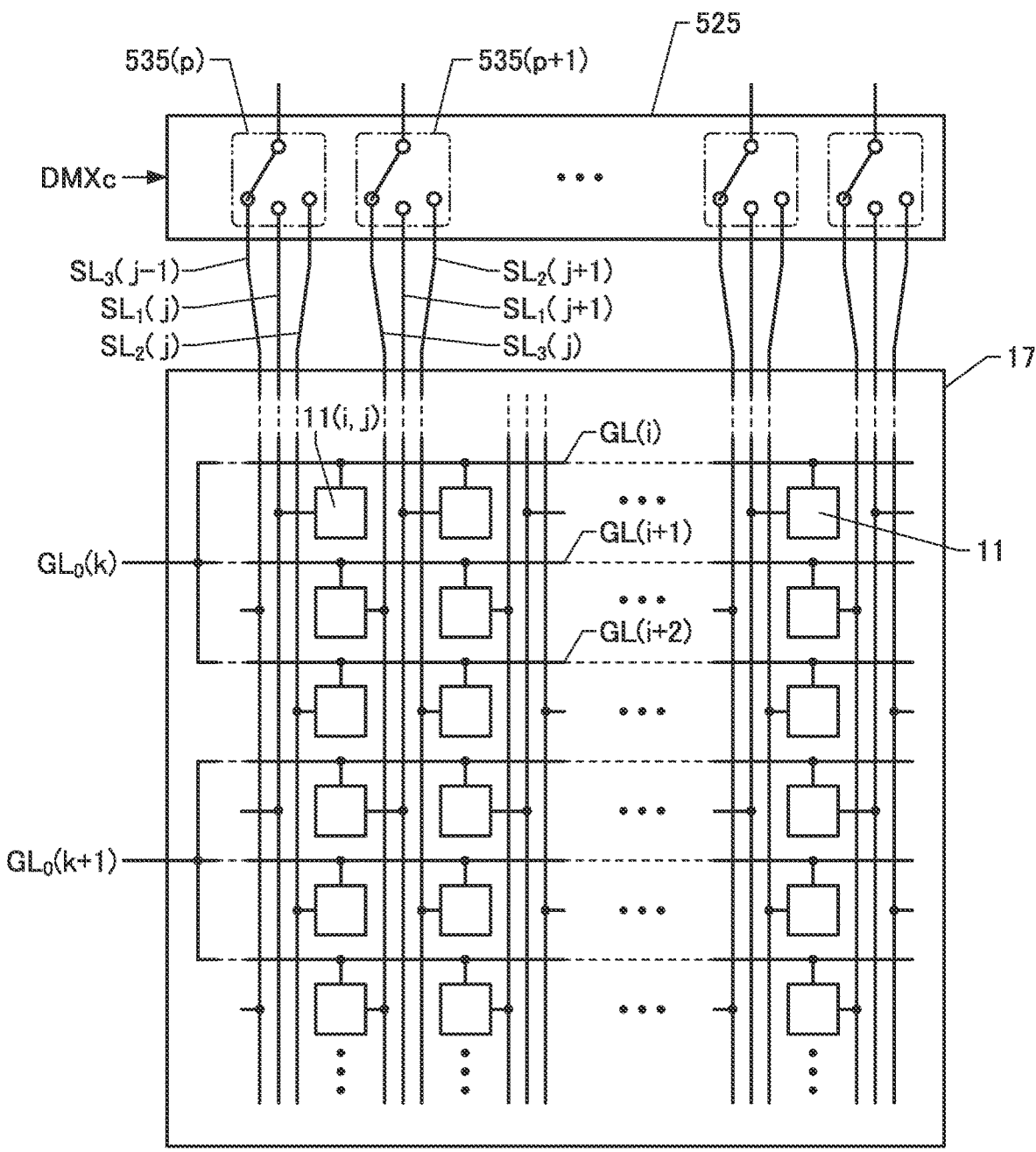
FIG. 36 illustrates an example of a connection between a demultiplexer and a display portion.

FIG. 34, FIG. 35, and FIG. 36 each illustrate an example of a connection between the demultiplexer 525 in the source driver 13a in FIG. 33A and the display portion 17. The demultiplexer 525 includes a plurality of demultiplexers 535. Thus, the demultiplexer 525 can be referred to as a "demultiplexer group". In FIG. 34 to FIG. 36, a p-th demultiplexer 535 is denoted as a demultiplexer 535(p) (p is an integer greater than or equal to 1).

FIG. 34 and FIG. 35 each illustrate an example of a connection between the display portion 17 including two source lines for each column and the demultiplexer 525 including the 1-input 2-output demultiplexers 535.

In the example shown in FIG. 34, one of output terminals of the demultiplexer 535(p) is electrically connected to the wiring $SL_1(j)$ and the other is electrically connected to the wiring $SL_2(j)$. In a similar manner, one of output terminals of a demultiplexer 535(p+1) is electrically connected to the wiring $SL_1(j+1)$ and the other is electrically connected to the wiring $SL_2(j+1)$.

In the example shown in FIG. 35, one of output terminals of the demultiplexer 535(p) is electrically connected to the wiring $SL_2(j-1)$ and the other is electrically connected to the wiring $SL_1(j)$. In a similar manner, one of output terminals of the demultiplexer 535(p+1) is electrically connected to the wiring $SL_2(j)$ and the other is electrically connected to the wiring $SL_1(j+1)$.

As described in the above embodiment, making the polarity of adjacent wirings SL the same can reduce the load of the source driver at the time of signal rewriting and reduce the power consumption. Therefore, in the case where the source driver 13a illustrated in FIG. 33A is connected to the display portion 17, the connection method illustrated in FIG. 35 is preferably used.

FIG. 36 illustrates an example of a connection between the display portion 17 including three source lines for each column and the demultiplexer 525 including the 1-input 3-output demultiplexers 535.

In the example shown in FIG. 36, a first output terminal, a second output terminal, and a third output terminal among the output terminals of the demultiplexer 535(p) are electrically connected to the wiring $SL_3(j-1)$, the wiring $SL_1(j)$, and the wiring $SL_2(j)$, respectively. In a similar manner, a first output terminal, a second output terminal, and a third output terminal among the output terminals of the demultiplexer 535(p+1) are electrically connected to the wiring $SL_3(j)$, the wiring $SL_1(j+1)$, and the wiring $SL_2(j+1)$, respectively.

Figure 37:
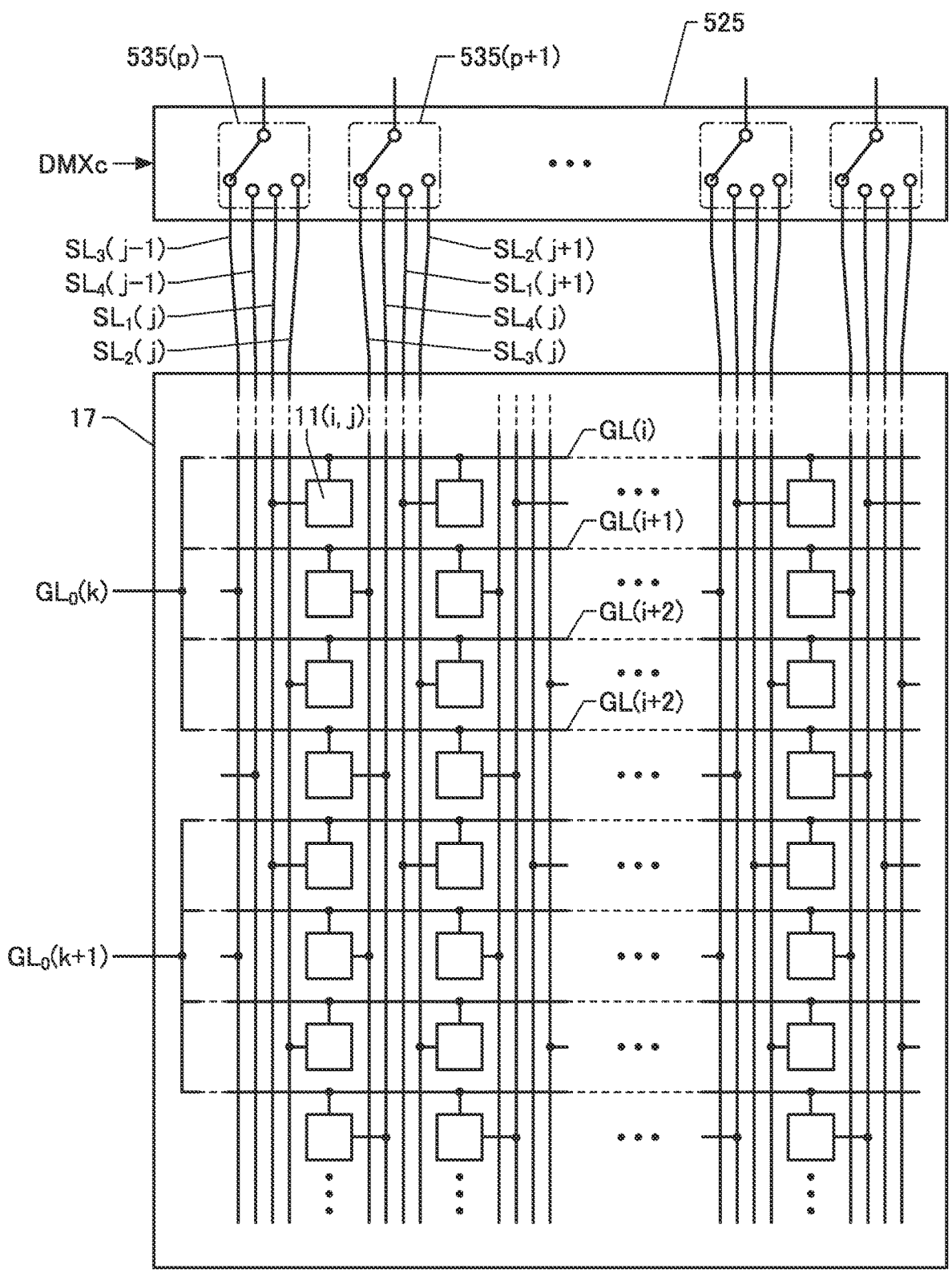
FIG. 37 illustrates an example of a connection between a demultiplexer and a display portion.

FIG. 37 illustrates an example of a connection between the display portion 17 including four source lines for each column and the demultiplexer 525 including the 1-input 4-output demultiplexers 535.

In the example shown in FIG. 37, a first output terminal, a second output terminal, a third output terminal, and a fourth output terminal among the output terminals of the demultiplexer 535(p) are electrically connected to the wiring $SL_3(j-1)$, the wiring $SL_4(j-1)$, the wiring $SL_1(j)$, and the wiring $SL_2(j)$, respectively. In a similar manner, a first output terminal, a second output terminal, a third output terminal, and a fourth output terminal among the output terminals of the demultiplexer 535(p+1) are electrically connected to the wiring $SL_3(j)$, the wiring $SL_4(j)$, the wiring $SL_1(j+1)$, and the wiring $SL_2(j+1)$, respectively.

[ANALOG LATCH]

Here, an example of a semiconductor circuit that can be used for the analog latch 526 is described.

Figure 38A:
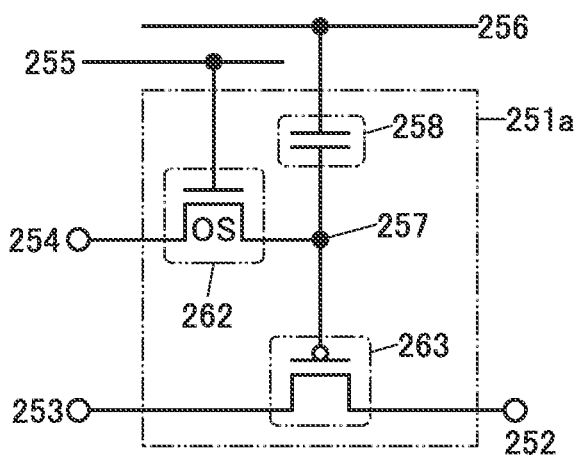
FIGS. 38A to 38D each illustrate an example of a memory circuit.

A semiconductor circuit illustrated in FIG. 38A has a structure of a memory circuit 251a in which one of a source and a drain of a transistor 262 is connected to a gate of a transistor 263 and one electrode of a capacitor 258. The circuit illustrated in FIG. 38B has a structure of a memory circuit 261a in which one of the source and the drain of the transistor 262 is connected to one electrode of the capacitor 258.

The analog latch 526 includes a plurality of latch circuits. As the latch circuits, the memory circuit 251a and the memory circuit 261a can be used.

In each of the memory circuits 251a and 261a, charge injected through a terminal 254 and the transistor 262 can be held at a node 257. The node 257 can hold a given potential (a given amount of charge).

The memory circuit 251a includes the transistor 263. Although the transistor 263 is a p-channel transistor in FIG. 38A, an n-channel transistor may be used as the transistor 263. An OS transistor may also be used as the transistor 263.

Figure 38B:
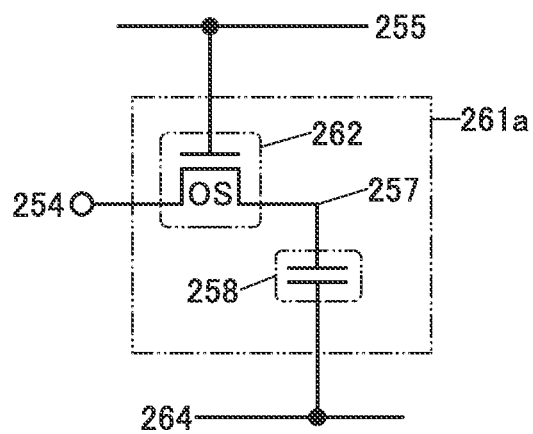

The memory circuit 251a and the memory circuit 261a can each hold an analog signal. The memory circuit 251a illustrated in FIG. 38A and the memory circuit 261a illustrated in FIG. 38B are described in detail.

The memory circuit 251a includes the transistor 263 using a first semiconductor, the transistor 262 using a second semiconductor, and the capacitor 258.

As the transistor 262, an OS transistor is preferably used. By using a transistor with a low off-state current as the transistor 262, a change in the amount of charge held at the node 257 can be suppressed. Thus, data can be more accurately stored.

In FIG. 38A, a terminal 252 is electrically connected to one of a source and a drain of the transistor 263, and a terminal 253 is electrically connected to the other of the source and the drain of the transistor 263. A wiring 255 is electrically connected to a gate of the transistor 262, one of the source and the drain of the transistor 262 is electrically connected to the node 257, and the other of the source and the drain of the transistor 262 is electrically connected to the terminal 254. The gate of the transistor 263 and one electrode of the capacitor 258 are electrically connected to the node 257. A wiring 256 is electrically connected to the other electrode of the capacitor 258.

In the memory circuit 251a, the terminal 254 functions as an input terminal and the terminal 253 functions as an output terminal. In the memory circuit 261a, the terminal 254 functions as an input/output terminal.

The memory circuit 251a and the memory circuit 261a have a feature that the charge supplied to the node 257 can be held, and thus enables writing, retaining, and reading of data as follows.

[Writing Operation and Retaining Operation]

Data writing and retaining operations of the memory circuit 251a and the memory circuit 261a will be described. First, the potential of the wiring 255 is set to a potential at which the transistor 262 is on. Accordingly, the potential of the terminal 254 is supplied to the node 257. That is, a predetermined charge is supplied to the node 257 (writing). Here, a charge corresponding to a given potential is supplied. After that, the potential of the wiring 255 is set to a potential at which the transistor 262 is off. Thus, the charge is held at the node 257 (retaining operation).

In the memory circuit 251a, when a p-channel transistor is used as the transistor 263, the given potential is set to a potential higher than the threshold voltage of the transistor 263. In the case where an n-channel transistor is used as the transistor 263, the given potential is set to a potential lower than the threshold voltage of the transistor 263. In other words, each of the given potentials is a potential at which the transistor 263 is turned off.

The memory circuit 261a illustrated in FIG. 38B is different from the memory circuit 251a in that the transistor 263 is not provided. The other electrode of the capacitor 258 is electrically connected to a wiring 264. The potential of the wiring 264 may be any potential as long as it is a fixed potential. For example, the wiring 264 is supplied with GND. Data can be written to the memory circuit 261a in a manner similar to that of the memory circuit 251a.

[READING OPERATION IN MEMORY CIRCUIT 251A]

An operation of reading data retained in the memory circuit 251a is described. While a predetermined potential (a constant potential) is supplied to the terminal 252, a reading potential VR is supplied to the wiring 256, whereby the potential retained at the node 257 can be read. In other words, the potential supplied to the terminal 252 and the reading potential VR are set as appropriate, a potential equal to the potential held at the node 257 can be output to the terminal 253.

[READING OPERATION IN MEMORY CIRCUIT 261A]

An operation of reading data retained in the memory circuit 261a is described. When a potential at which the transistor 262 is turned on is supplied to the wiring 255, the terminal 254 is electrically connected to the node 257, and the potential held at the node 257 is supplied to the terminal 254. Here, the larger the capacitance value of the capacitor 258 is, the more preferred it is. The larger the capacitance value of the capacitor 258 is, the written potential can be more accurately supplied to the terminal 254.

In the memory circuits 251a and 261a, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Figure 38C:
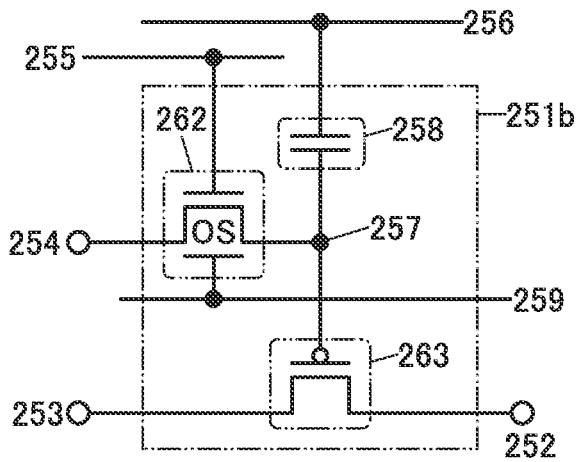
Figure 38D:
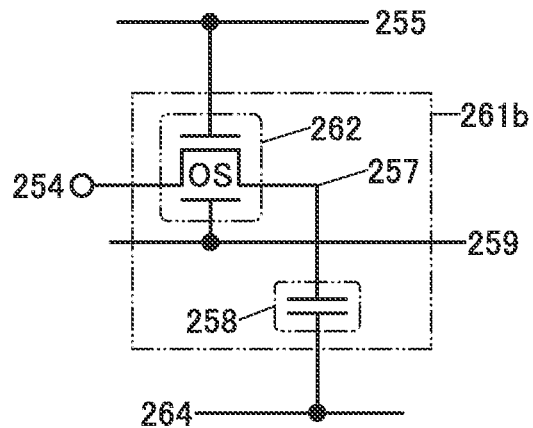

The transistor 262 may be a transistor including a back gate. By controlling the potential supplied to the back gate, the threshold voltage of the transistor 262 can be appropriately changed. The memory circuit 251b illustrated in FIG. 38C is different from the memory circuit 251a in that a transistor including a back gate is used as the transistor 262. The memory circuit 261b illustrated in FIG. 38D is different from the memory element 261a in that a transistor including a back gate is used as the transistor 262.

In each of the memory circuits 251b and 261b, the back gate of the transistor 262 is electrically connected to a wiring 259. By controlling the potential supplied to the wiring 259, the threshold voltage of the transistor 262 can be appropriately changed.

At least part of this embodiment can be implemented in combination with any of the other embodiments described in this specification as appropriate.

Embodiment 4

In this embodiment, an example of a transistor which can be used for the display device and the like described in the above embodiments is described with reference to drawings.

Figure 39A:
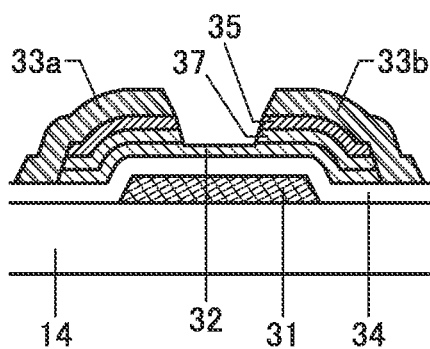
FIGS. 39A to 39F each illustrate an structural example of a transistor

A transistor illustrated in FIG. 39A includes a semiconductor layer 37 between the semiconductor layer 32 and the impurity semiconductor layer 35.

The semiconductor layer 37 may be formed using the same semiconductor film as the semiconductor layer 32. The semiconductor layer 37 can function as an etching stopper for preventing the semiconductor layer 32 from being removed at the time of etching of the impurity semiconductor layer 35. Although FIG. 39A illustrates an example where the semiconductor layer 37 is divided into a right portion and a left portion, part of the semiconductor layer 37 may cover a channel formation region of the semiconductor layer 32.

Furthermore, the semiconductor layer 37 may contain an impurity at a concentration lower than that in the impurity semiconductor layer 35. Thus, the semiconductor layer 37 can function as a lightly doped drain (LDD) region and can suppress a hot carrier effect produced when the transistor is driven.

Figure 39B:
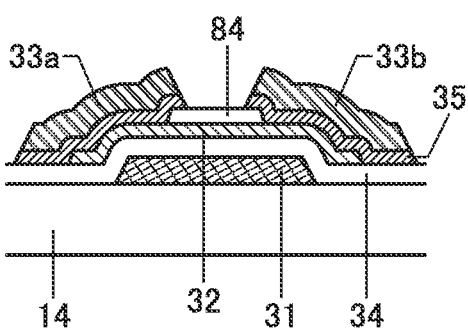

In a transistor illustrated in FIG. 39B, an insulating layer 84 is provided over a channel formation region of the semiconductor layer 32. The insulating layer 84 functions as an etching stopper at the time of etching of the conductive layers 33a and 33b.

Figure 39C:
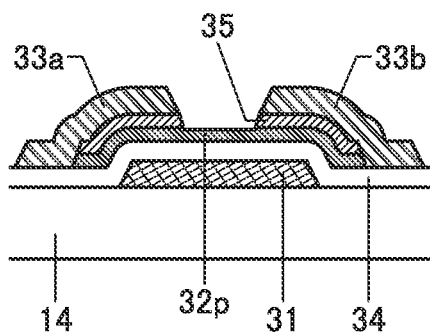

A transistor illustrated in FIG. 39C includes a semiconductor layer 32p instead of the semiconductor layer 32. The semiconductor layer 32p includes a semiconductor film having high crystallinity. For example, the semiconductor layer 32p includes a polycrystalline semiconductor or a single crystal semiconductor. Thus, a transistor having a high field-effect mobility can be provided.

Figure 39D:
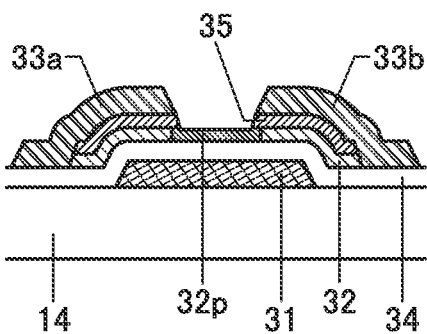

A transistor illustrated in FIG. 39D includes the semiconductor layer 32p in a channel formation region of the semiconductor layer 32. For example, the transistor illustrated in FIG. 39D can be formed by irradiating a semiconductor film to be the semiconductor layer 32 with laser light or the like so that crystallization is caused locally. Thus, a transistor having a high field-effect mobility can be provided.

Figure 39E:
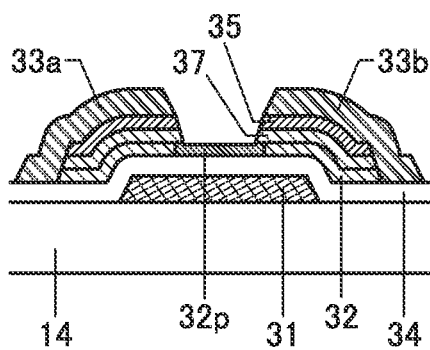

A transistor illustrated in FIG. 39E includes the semiconductor layer 32p having crystallinity in a channel formation region of the semiconductor layer 32 of the transistor illustrated in FIG. 39A.

Figure 39F:
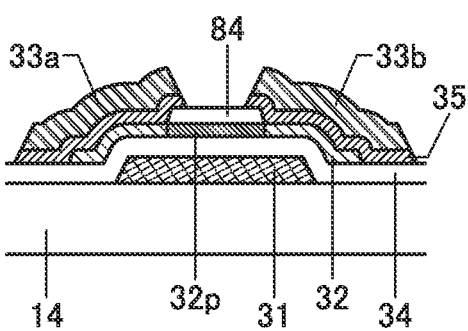

A transistor illustrated in FIG. 39F includes the semiconductor layer 32p having crystallinity in a channel formation region of the semiconductor layer 32 of the transistor illustrated in FIG. 39B.

At least part of this embodiment can be implemented in combination with any of the other embodiments described in this specification as appropriate.

Embodiment 5

In this embodiment, an example of a transistor which can be used for the display device and the like described in the above embodiments is described with reference to drawings. Specifically, structural examples of a transistor that can be preferably used as an OS transistor will be described.

Structural Examples of Transistor

[STRUCTURAL EXAMPLE 1]

Figure 40A:
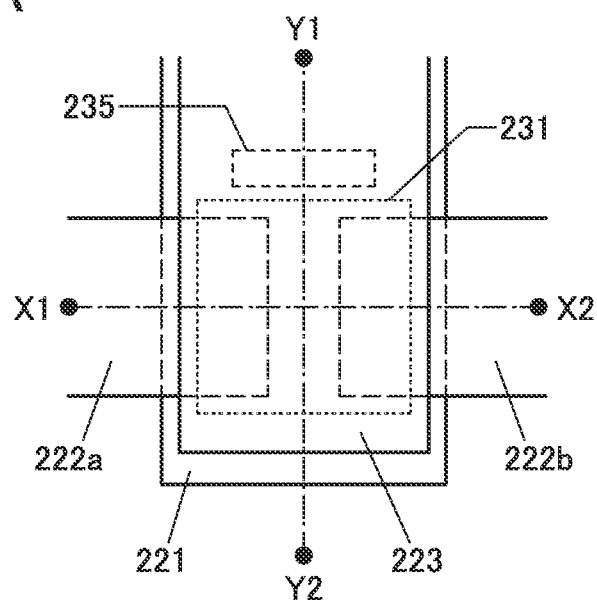
FIGS. 40A to 40C illustrate a structural example of a transistor.
Figure 40B:
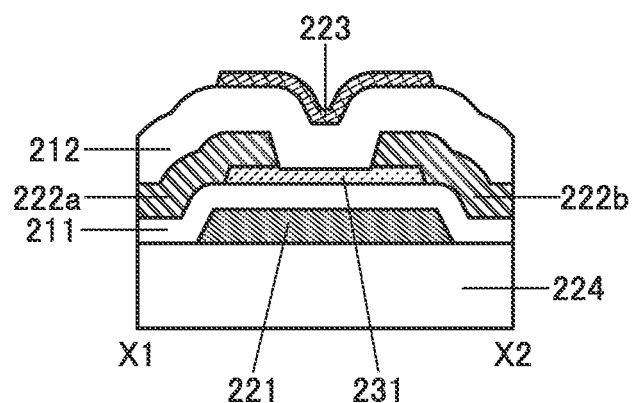
Figure 40C:
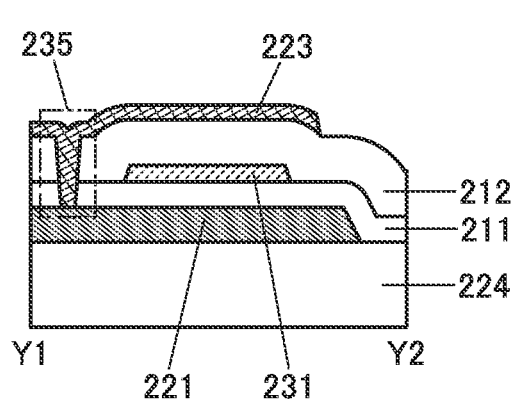

To show a structural example of the transistor, a transistor 200a is described with reference to FIGS. 40A to 40C. FIG. 40A is a top view of the transistor 200a. FIG. 40B is a cross-sectional view taken along dashed-dotted line X1-X2 in FIG. 40A, and FIG. 40C is a cross-sectional view taken along dashed-dotted line Y1-Y2 in FIG. 40A. Note that in FIG. 40A, some components of the transistor 200a (e.g., an insulating layer having a function as a gate insulating layer) are not illustrated to avoid complexity. Note that hereinafter, the direction of the dashed-dotted line X1-X2 may be called the channel length direction, and the direction of the dashed-dotted line Y1-Y2 may be called the channel width direction. As in FIG. 40A, some components might not be illustrated in some top views of transistors described below.

The transistor 200a includes a conductive layer 221 over an insulating layer 224, an insulating layer 211 over the insulating layer 224 and over the conductive layer 221, a semiconductor layer 231 over the insulating layer 211, a conductive layer 222a over the semiconductor layer 231 and over the insulating layer 211, a conductive layer 222b over the semiconductor layer 231 and over the insulating layer 211, an insulating layer 212 over the semiconductor layer 231 and over the conductive layers 222a and 222b, and a conductive layer 223 over the insulating layer 212.

Note that the insulating layer 224 may be a substrate. When the insulating layer 224 is a substrate, the substrate can include a material similar to that of the substrate 14 described in Embodiment 1.

The conductive layer 221 and the conductive layer 223 can include a material similar to that of the conductive layer 31 described in Embodiment 1, for example. The insulating layer 211 can include a material similar to that of the insulating layer 34 described in Embodiment 1, for example. The conductive layer 222a and the conductive layer 222b can include a material similar to that of the conductive layers 33 and 51 described in Embodiment 1, for example. The insulating layer 212 can include a material similar to that of the insulating layer 82 described in Embodiment 1.

The semiconductor layer 231 can include a material similar to that of the semiconductor layer 32 described in Embodiment 1, for example. In this embodiment, the case where the semiconductor layer 231 is a semiconductor layer including a metal oxide is described.

The insulating layer 211 and the insulating layer 212 have an opening portion 235. The conductive layer 223 is electrically connected to the conductive layer 221 through the opening portion 235.

The insulating layer 211 has a function as a first gate insulating layer of the transistor 200a, and the insulating layer 212 has a function as a second gate insulating layer of the transistor 200a. In the transistor 200a, the conductive layer 221 has a function as a first gate. The conductive layer 222a has a function as one of a source and a drain and the conductive layer 222b has a function as the other of the source and the drain. In the transistor 200a, the conductive layer 223 has a function as a second gate.

Note that the transistor 200a is a channel-etched transistor, and has a dual-gate structure.

In the transistor 200a, the conductive layer 223 may be omitted. In that case, the transistor 200a is a channel-etched transistor, and has a bottom-gate structure.

As illustrated in FIGS. 40B and 40C, the semiconductor layer 231 faces the conductive layer 221 and the conductive layer 223, and is between the conductive layers having a function as the two gates. The length of the conductive layer 223 in the channel length direction is longer than the length of the semiconductor layer 231 in the channel length direction. The length of the conductive layer 223 in the channel width direction is longer than the length of the semiconductor layer 231 in the channel width direction. The whole semiconductor layer 231 is covered with the conductive layer 223 with the insulating layer 212 positioned therebetween.

In other words, the conductive layers 221 and 223 are connected to each other in the opening portion 235 provided in the insulating layers 211 and 212, and have a region located outside a side end portion of the semiconductor layer 231.

With this structure, the semiconductor layer 231 included in the transistor 200a can be electrically surrounded by electric fields of the conductive layers 221 and 223. A device structure of a transistor in which electric fields of a first gate and a second gate electrically surround a semiconductor layer where a channel formation region is formed, like in the transistor 200a, can be referred to as a surrounded channel (S-channel) structure.

Since the transistor 200a has the S-channel structure, an electric field for inducing a channel can be effectively applied to the semiconductor layer 231 by the conductive layer 221 having a function as the first gate; therefore, the current drive capability of the transistor 200a can be improved and high on-state current characteristics can be obtained. Since the on-state current can be increased, it is possible to reduce the size of the transistor 200a. In addition, since the transistor 200a has a structure in which the semiconductor layer 231 is surrounded by the conductive layer 221 having a function as a first gate and the conductive layer 223 having a function as a second gate, the mechanical strength of the transistor 200a can be increased.

Since the transistor 200a having the S-channel structure has high field-effect mobility and high driving capability, the use of the transistor 200a in a driver circuit, a typical example of which is a gate driver, allows the display device to have a narrow bezel.

Structural Example 2

Figure 41A:
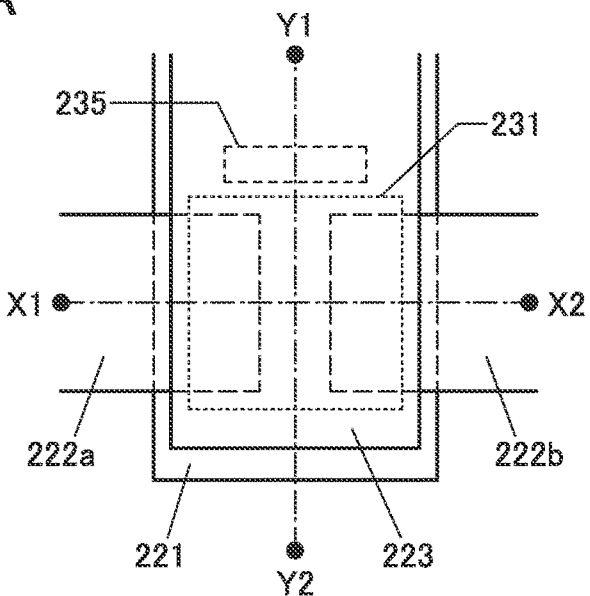
FIGS. 41A to 41C illustrate a structural example of a transistor.
Figure 41B:
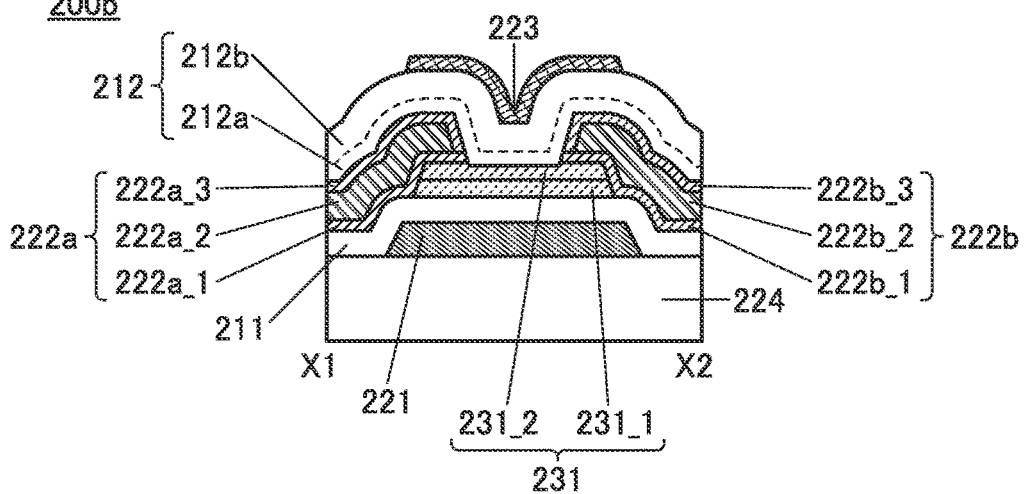
Figure 41C:
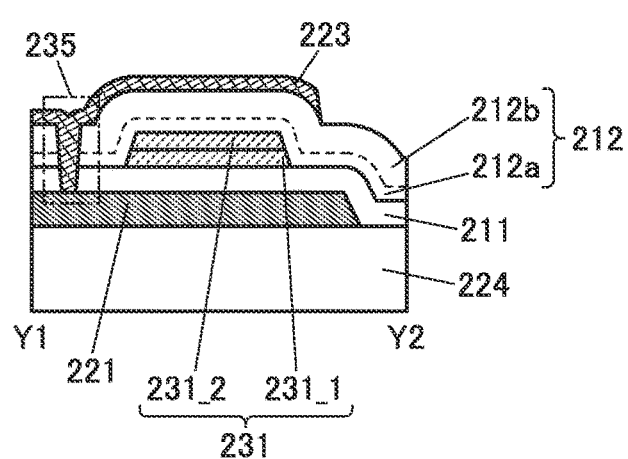

Next, to show a structural example of a transistor, a transistor 200b is described with reference to FIGS. 41A to 41C. FIG. 41A is a top view of the transistor 200b. FIG. 41B is a cross-sectional view taken along dashed-dotted line X1-X2 in FIG. 41A, and FIG. 41C is a cross-sectional view taken along dashed-dotted line Y1-Y2 in FIG. 41A.

The transistor 200b is different from the transistor 200a in that the semiconductor layer 231, the conductive layer 222a, the conductive layer 222b, and the insulating layer 212 each have a multi-layer structure.

The insulating layer 212 includes an insulating layer 212a over the semiconductor layer 231 and over the conductive layers 222a and 222b and an insulating layer 212b over the insulating layer 212a. The insulating layer 212 has a function of supplying oxygen to the semiconductor layer 231. That is, the insulating layer 212 contains oxygen. The insulating layer 212a is an insulating layer that allows oxygen to pass therethrough. Note that the insulating layer 212a also functions as a film that relieves damage to the semiconductor layer 231 at the time of forming the insulating layer 212b in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating layer 212a.

In addition, it is preferable that the number of defects in the insulating layer 212a be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating layer 212a is high, oxygen is bonded to the defects and the property of transmitting oxygen of the insulating layer 212a is lowered.

Note that all oxygen entering the insulating layer 212a from the outside does not move to the outside of the insulating layer 212a and some oxygen remains in the insulating layer 212a. Furthermore, movement of oxygen occurs in the insulating layer 212a in some cases in such a manner that oxygen enters the insulating layer 212a and oxygen included in the insulating layer 212a moves to the outside of the insulating layer 212a. When an oxide insulating layer that can transmit oxygen is formed as the insulating layer 212a, oxygen released from the insulating layer 212b provided over the insulating layer 212a can be moved to the semiconductor layer 231 through the insulating layer 212a.

Note that the insulating layer 212a can be formed using an oxide insulating layer having a low density of states due to nitrogen oxide. Note that the density of states due to nitrogen oxide can be formed between the energy of the valence band maximum and the energy of the conduction band minimum of the metal oxide layer. A silicon oxynitride film that releases less nitrogen oxide, an aluminum oxynitride film that releases less nitrogen oxide, or the like can be used as the above oxide insulating layer.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating layer 212a, for example. The level is positioned in the energy gap of the semiconductor layer 231. Therefore, when nitrogen oxide is diffused to the interface between the insulating layer 212a and the semiconductor layer 231, an electron is in some cases trapped by the level on the insulating layer 212a side. As a result, the trapped electron remains in the vicinity of the interface between the insulating layer 212a and the semiconductor layer 231; thus, the threshold voltage of the transistor is shifted in the positive direction.

Nitrogen oxide reacts with ammonia and oxygen in heat treatment. Since nitrogen oxide included in the insulating layer 212a reacts with ammonia included in the insulating layer 212b in heat treatment, nitrogen oxide included in the insulating layer 212a is reduced. Therefore, an electron is hardly trapped at the interface between the insulating layer 212a and the semiconductor layer 231.

By using such an oxide insulating layer for the insulating layer 212a, the shift in the threshold voltage of the transistor can be reduced, which leads to a smaller change in the electrical characteristics of the transistor.

The concentration of nitrogen of the above oxide insulating layer measured by SIMS is lower than or equal to $6 \times 10^{20}$ atoms/cm$^3$.

The above oxide insulating layer is formed by a PECVD method at a substrate temperature higher than or equal to 220° C. and lower than or equal to 350° C. using silane and dinitrogen monoxide, whereby a dense and hard film can be formed.

The insulating layer 212b is an oxide insulating layer which contains oxygen at a higher proportion than the stoichiometric composition. Part of oxygen is released from the above oxide insulating layer by heating. The amount of oxygen released from the oxide insulating layer in TDS is greater than or equal to $1.0 \times 10^{19}$ atoms/cm$^3$, preferably greater than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating layer 212b.

It is preferable that the number of defects in the insulating layer 212b be small and typically, the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating layer 212b is provided more apart from the semiconductor layer 231 than the insulating layer 212a is; thus, the insulating layer 212b may have higher density of defects than the insulating layer 212a.

Furthermore, the insulating layer 212 can be formed using insulating layers formed of the same kinds of materials; thus, a boundary between the insulating layers 212a and 212b cannot be clearly observed in some cases. Thus, in this embodiment, the boundary between the insulating layers 212a and 212b is shown by a dashed line. Although a two-layer structure of the insulating layers 212a and 212b is described in this embodiment, the present invention is not limited to this. For example, a single-layer structure of only the insulating layer 212a or a layered structure of three or more layers may be employed.

The semiconductor layer 231 in the transistor 200b includes a semiconductor layer 231_1 over the insulating layer 211 and a semiconductor layer 231_2 over the semiconductor layer 231_1. The semiconductor layers 231_1 and 231_2 contain the same kind of element. For example, it is preferable that the semiconductor layers 231_1 and 231_2 each independently contain the same element as the element in the semiconductor layer 231 described above.

Each of the semiconductor layers 231_1 and 231_2 preferably contains a region where the atomic proportion of In is higher than the atomic proportion of M. For example, the atomic ratio of In to M and Zn in each of the semiconductor layers 231_1 and 231_2 is preferably In:M:Zn=4:2:3 or in the neighborhood thereof. As for the range expressed by the term "neighborhood" here, when In is 4, M ranges from 1.5 to 2.5 and Zn ranges from 2 to 4. Alternatively, the atomic ratio of In to M and Zn in each of the semiconductor layers 231_1 and 231_2 is preferably In:M:Zn=5:1:6 or in the neighborhood thereof. The semiconductor layers 231_1 and 231_2 having substantially the same composition as described above can be formed using the same sputtering target; thus, the manufacturing cost can be reduced. When the same sputtering target is used, the semiconductor layers 231_1 and 231_2 can be formed successively in the same vacuum chamber. This can suppress entry of impurities into the interface between the semiconductor layers 231_1 and 231_2.

Here, the semiconductor layer 231_1 may include a region whose crystallinity is lower than that of the semiconductor layer 231_2. Note that the crystallinity of the semiconductor layers 231_1 and 231_2 can be determined by analysis by X-ray diffraction (XRD) or with a transmission electron microscope (TEM), for example.

The region with low crystallinity in the semiconductor layer 231_1 serves as a diffusion path of excess oxygen, through which excess oxygen can be diffused into the semiconductor layer 231_2 having higher crystallinity than the semiconductor layer 231_1. When a multi-layer structure including the semiconductor layers having different crystal structures is employed and the region with low crystallinity is used as a diffusion path of excess oxygen as described above, the transistor can be highly reliable.

The semiconductor layer 231_2 having a region with higher crystallinity than the semiconductor layer 231_1 can prevent impurities from entering the semiconductor layer 231. In particular, the increased crystallinity of the semiconductor layer 231_2 can reduce damage at the time of processing into the conductive layers 222a and 222b. The surface of the semiconductor layer 231, i.e., the surface of the semiconductor layer 231_2 is exposed to an etchant or an etching gas at the time of processing into the conductive layers 222a and 222b. However, when the semiconductor layer 231_2 has a region with high crystallinity, the semiconductor layer 231_2 has higher etching resistance than the semiconductor layer 231_1. Thus, the semiconductor layer 231_2 has a function as an etching stopper.

By including a region having lower crystallinity than the semiconductor layer 231_2, the semiconductor layer 231_1 sometimes has a high carrier density.

When the semiconductor layer 231_1 has a high carrier density, the Fermi level is sometimes high relative to the conduction band of the semiconductor layer 231_1. This lowers the conduction band minimum of the semiconductor layer 231_1, so that the energy difference between the conduction band minimum of the semiconductor layer 231_1 and the trap level, which might be formed in a gate insulating layer (here, the insulating layer 211), is increased in some cases. The increase of the energy difference can reduce trap of charges in the gate insulating layer and reduce variation in the threshold voltage of the transistor, in some cases. In addition, when the semiconductor layer 231_1 has a high carrier density, the semiconductor layer 231 can have high field-effect mobility.

Although the semiconductor layer 231 in the transistor 200b has a multi-layer structure including two layers in this example, the structure is not limited thereto, and the semiconductor layer 231 may have a multi-layer structure including three or more layers.

The conductive layer 222a in the transistor 200b includes a conductive layer 222a_1, a conductive layer 222a_2 over the conductive layer 222a_1, and a conductive layer 222a_3 over the conductive layer 222a_2. The conductive layer 222b in the transistor 200b includes a conductive layer 222b_1, a conductive layer 222b_2 over the conductive layer 222b_1, and a conductive layer 222b_3 over the conductive layer 222b_2.

For example, it is preferable that the conductive layers 222a_1, 222b_1, 222a_3, and 222b_3 contain one or more elements selected from titanium, tungsten, tantalum, molybdenum, indium, gallium, tin, and zinc. Furthermore, it is preferable that the conductive layers 222a_2 and 222b_2 contain one or more elements selected from copper, aluminum, and silver.

Specifically, the conductive layers 222a_1, 222b_1, 222a_3, and 222b_3 can contain an In—Sn oxide or an In—Zn oxide and the conductive layers 222a_2 and 222b_2 can contain copper.

An end portion of the conductive layer 222a_1 has a region located outside an end portion of the conductive layer 222a_2. The conductive layer 222a_3 covers a top surface and a side surface of the conductive layer 222a_2 and has a region that is in contact with the conductive layer 222a_1. An end portion of the conductive layer 222b_1 has a region located outside an end portion of the conductive layer 222b_2. The conductive layer 222b_3 covers a top surface and a side surface of the conductive layer 222b_2 and has a region that is in contact with the conductive layer 222b_1.

The above structure is preferred because the structure can reduce the wiring resistance of the conductive layers 222a and 222b and inhibit diffusion of copper to the semiconductor layer 231.

[STRUCTURAL EXAMPLE 3]

Figure 42A:
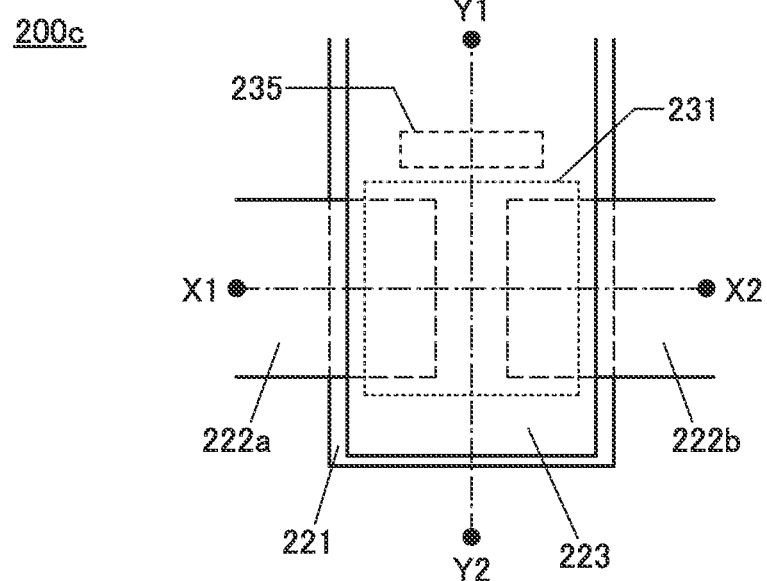
FIGS. 42A to 42C illustrate a structural example of a transistor.
Figure 42B:
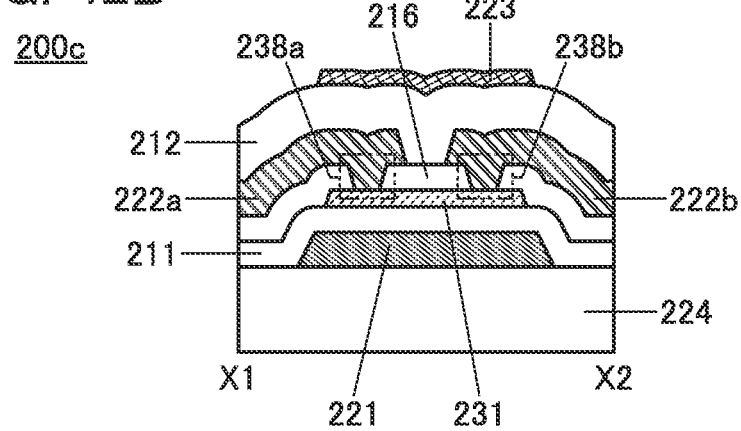
Figure 42C:
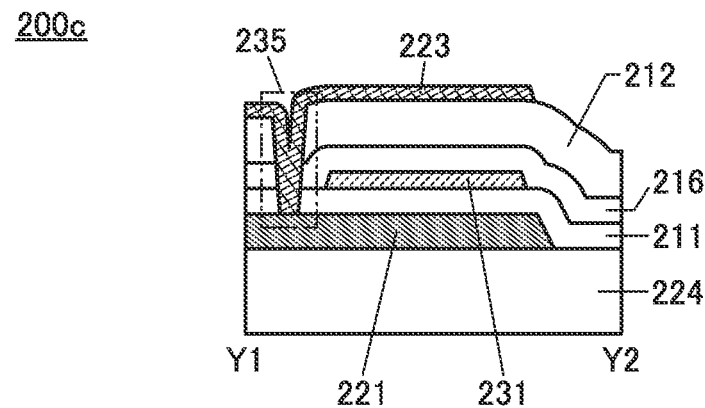

To show a structural example of a transistor, a transistor 200c is described with reference to FIGS. 42A to 42C. FIG. 42A is a top view of the transistor 200c. FIG. 42B is a cross-sectional view taken along dashed-dotted line X1-X2 in FIG. 42A, and FIG. 42C is a cross-sectional view taken along dashed-dotted line Y1-Y2 in FIG. 42A.

The transistor 200c includes the conductive layer 221 over the insulating layer 224, the insulating layer 211 over the conductive layer 221 and over the insulating layer 224, the semiconductor layer 231 over the insulating layer 211, an insulating layer 216 over the semiconductor layer 231 and over the insulating layer 211, the conductive layer 222a over the semiconductor layer 231 and over the insulating layer 216, the conductive layer 222b over the semiconductor layer 231 and over the insulating layer 216, the insulating layer 212 over the insulating layer 216 and over the conductive layers 222a and 222b, and the conductive layer 223 over the insulating layer 212.

The insulating layers 211, 216, and 212 have the opening portion 235. The conductive layer 221 having a function as the first gate of the transistor 200c is electrically connected to the conductive layer 223 having a function as the second gate of the transistor 200c through the opening portion 235. The insulating layer 216 has an opening portion 238a and an opening portion 238b. The conductive layer 222a having a function as one of a source and a drain of the transistor 200c is electrically connected to the semiconductor layer 231 through the opening portion 238a. The conductive layer 222b having a function as the other of the source and the drain of the transistor 200c is electrically connected to the semiconductor layer 231 through the opening portion 238b.

The insulating layer 216 has a function as a channel protective layer of the transistor 200c. Without the insulating layer 216, a channel formation region of the semiconductor layer 231 might be damaged by an etching method or the like at the time of the formation of the conductive layers 222a and 222b. This might make the electrical characteristics of the transistor unstable. The damage to the channel formation region of the semiconductor layer 231 can be prevented when the insulating layer 216 is formed, the opening portions 238a and 238b are provided, and a conductive layer is then formed and processed to form the conductive layers 222a and 222b by an etching method or the like. Accordingly, the electrical characteristics of the transistor can be stabilized to achieve high reliability of the transistor.

The insulating layer 216 can include a material similar to that of the insulating layer 212, for example.

The insulating layer 216 preferably includes an excess oxygen region. When the insulating layer 216 includes an excess oxygen region, oxygen can be supplied to the channel formation region in the semiconductor layer 231. As a result, oxygen vacancies formed in the channel formation region can be filled with excess oxygen, which can provide a highly reliable display device.

After the opening portions 238a and 238b are formed, an impurity element is preferably added to the semiconductor layer 231. Specifically, an element that forms an oxygen vacancy or an element that is bonded to an oxygen vacancy is preferably added. This can increase the conductivity of a region of the semiconductor layer 231 which overlaps with the conductive layer 222a (one of a source region and a drain region) and a region of the semiconductor layer 231 which overlaps with the conductive layer 222b (the other of the source region and the drain region), as described in detail later. Accordingly, the current drive capability of the transistor 200c is improved, so that a high on-state current can be obtained.

Note that the transistor 200c is a channel-protective transistor, and has a dual-gate structure.

As with the transistors 200a and 200b, the transistor 200c has the S-channel structure. With this structure, the semiconductor layer 231 included in the transistor 200c can be electrically surrounded by electric fields of the conductive layers 221 and 223.

Since the transistor 200c has the S-channel structure, an electric field for inducing a channel can be effectively applied to the semiconductor layer 231 by the conductive layer 221 or 223. Thus, the current drive capability of the transistor 200c can be improved and high on-state current characteristics can be obtained. As a result of the high on-state current, it is possible to reduce the size of the transistor 200c. Furthermore, since the transistor 200c has a structure in which the semiconductor layer 231 is surrounded by the conductive layers 221 and 223, the mechanical strength of the transistor 200c can be increased.

In the transistor 200c, the conductive layer 223 may be omitted. In that case, the transistor 200c is a channel-protective transistor, and has a bottom-gate structure.

[STRUCTURAL EXAMPLE 4]

Next, an example of a transistor is described with reference to FIGS. 43A to 43D.

Figure 43A:
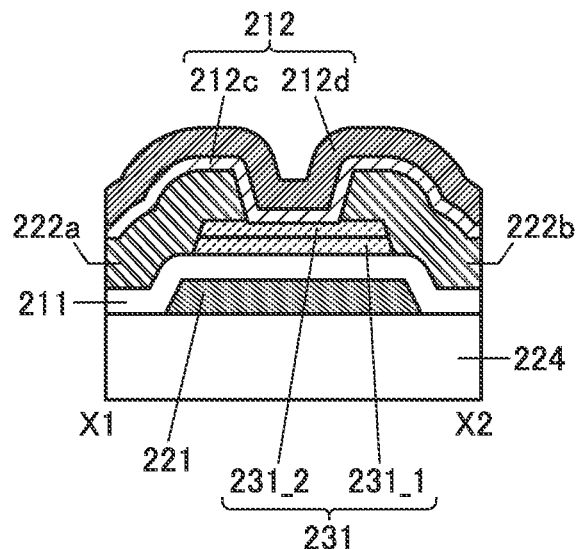
FIGS. 43A to 43D illustrate structural examples of transistors.
Figure 43B:
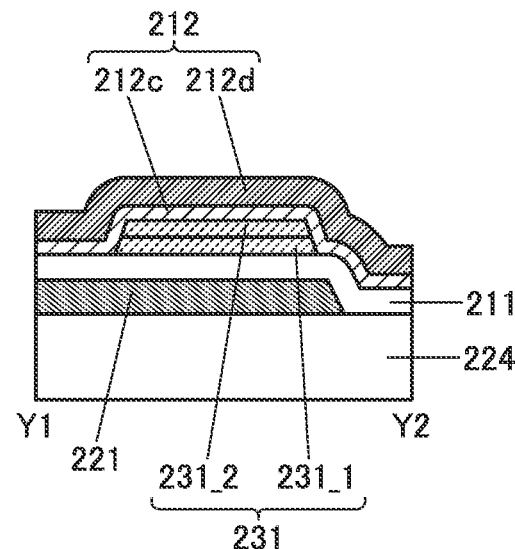
Figure 43C:
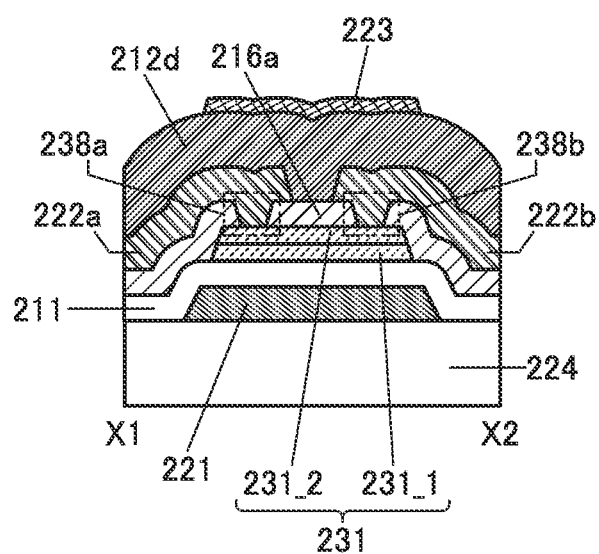
Figure 43D:
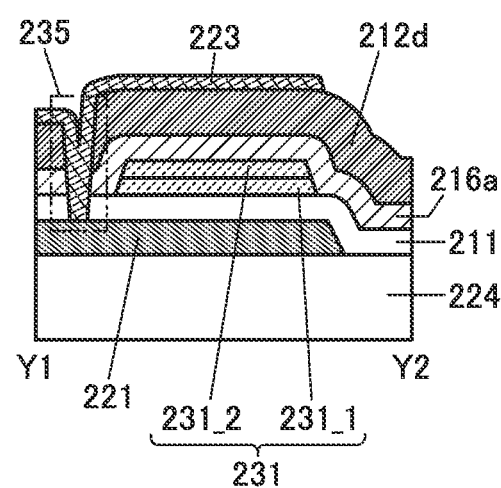

FIGS. 43A and 43B are cross-sectional views of a transistor 200d and FIGS. 43C and 43D are cross-sectional views of a transistor 200e. The transistor 200d is a modification example of the transistor 200b described above and the transistor 200e is a modification example of the transistor 200c described above. In FIGS. 43A to 43D, therefore, common reference numerals are used for the components having functions similar to those in the transistor 200b and the transistor 200c, and a detailed description of the components is omitted.

FIG. 43A is a cross-sectional view of the transistor 200d in the channel length direction, and FIG. 43B is a cross-sectional view of the transistor 200d in the channel width direction. FIG. 43C is a cross-sectional view of the transistor 200e in the channel length direction, and FIG. 43D is a cross-sectional view of the transistor 200e in the channel width direction.

The transistor 200d illustrated in FIGS. 43A and 43B is different from the transistor 200b in that the conductive layer 223 and the opening portion 235 are not provided. The transistor 200d is different from the transistor 200b in the structures of the insulating layer 212, the conductive layer 222a, and the conductive layer 222b.

The insulating layer 212 of the transistor 200d includes an insulating layer 212c and an insulating layer 212d over the insulating layer 212c. The insulating layer 212c has a function of supplying oxygen to the semiconductor layer 231 and function of preventing impurities (typically, water, hydrogen, and the like) from entering the semiconductor layer 231. As the insulating layer 212c, an aluminum oxide film, an aluminum oxynitride film, or an aluminum nitride oxide film can be used. In particular, the insulating layer 212c is preferably an aluminum oxide film formed by a reactive sputtering method. As an example of a method of forming an aluminum oxide by a reactive sputtering method, the following method can be given.

First, a mixed gas of an inert gas (typically, an Ar gas) and an oxygen gas is introduced into a sputtering chamber. Subsequently, a voltage is applied to an aluminum target provided in the sputtering chamber, whereby the aluminum oxide film can be deposited. Electric power used for applying a voltage to the aluminum target is supplied from a DC power source, an AC power source, or an RF power source. The DC power source is particularly preferably used to improve the productivity.

The insulating layer 212d has a function of preventing the entry of impurities (typically, water, hydrogen, and the like). As the insulating layer 212d, a silicon nitride film, a silicon nitride oxide film, or a silicon oxynitride film can be used. In particular, a silicon nitride film formed by a PECVD method is preferably used as the insulating layer 212d. The silicon nitride film formed by a PECVD method is preferable because the film is likely to have a high film density. Note that the hydrogen concentration in the silicon nitride film formed by a PECVD method is high in some cases.

Since the insulating layer 212c is provided below the insulating layer 212d in the transistor 200d, hydrogen in the insulating layer 212d does not or is less likely to diffuse into the semiconductor layer 231 side.

The transistor 200d is a single-gate transistor, unlike the transistor 200b. The use of a single-gate transistor can reduce the number of masks, leading to increased productivity.

The transistor 200e illustrated in FIGS. 43C and 43D is different from the transistor 200c in the structures of the insulating layer 216 and the insulating layer 212. Specifically, the transistor 200e includes an insulating layer 216a instead of the insulating layer 216 and the insulating layer 212d instead of the insulating layer 212.

The insulating layer 216a has a function similar to that of the insulating layer 212c.

The structure of the transistor 200d or 200e can be formed using the existing production line without high capital investment. For example, a manufacturing plant for an oxide semiconductor can be simply substituted for a manufacturing plant for hydrogenated amorphous silicon.

[STRUCTURAL EXAMPLE 5]

Figure 44A:
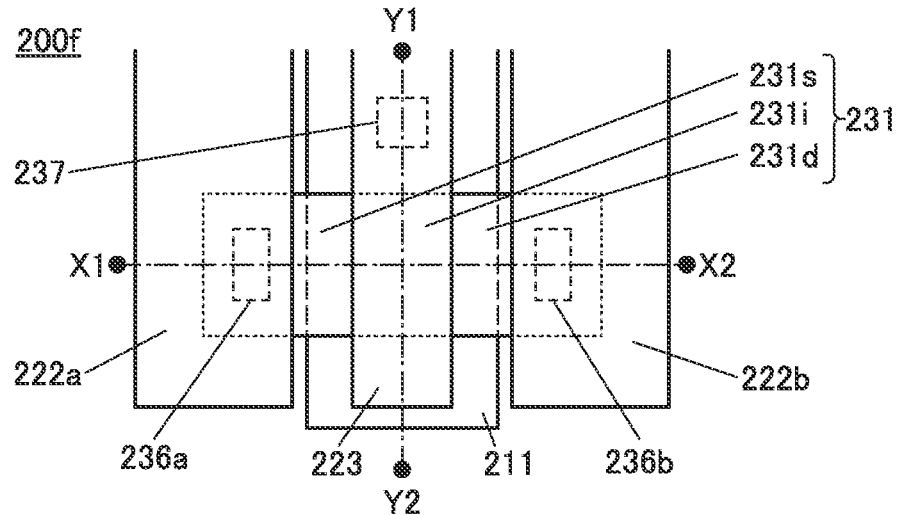
FIGS. 44A to 44C illustrate a structural example of a transistor.
Figure 44B:
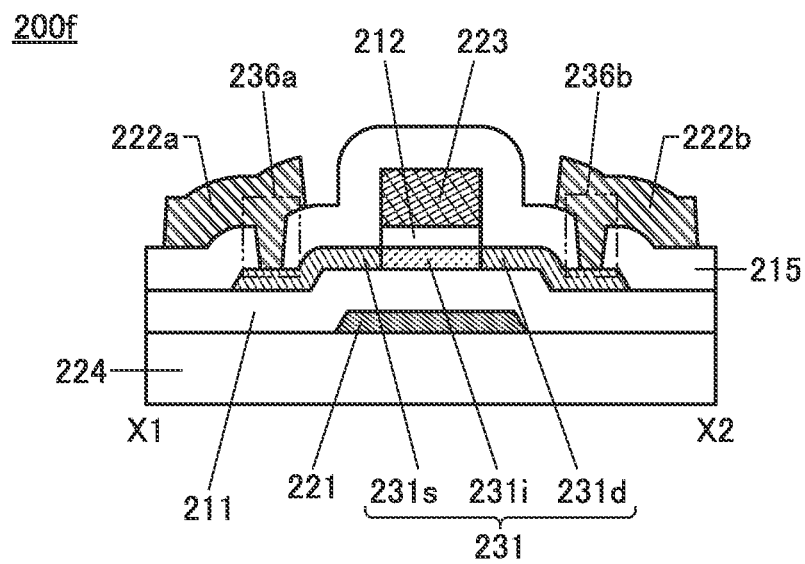

To show a structural example of a transistor, a transistor 200f is described with reference to FIGS. 44A to 44C. FIG. 44A is a top view of the transistor 200f. FIG. 44B is a cross-sectional view taken along dashed-dotted line X1-X2 in FIG. 44A, and FIG. 44C is a cross-sectional view taken along dashed-dotted line Y1-Y2 in FIG. 44A.

Figure 44C:
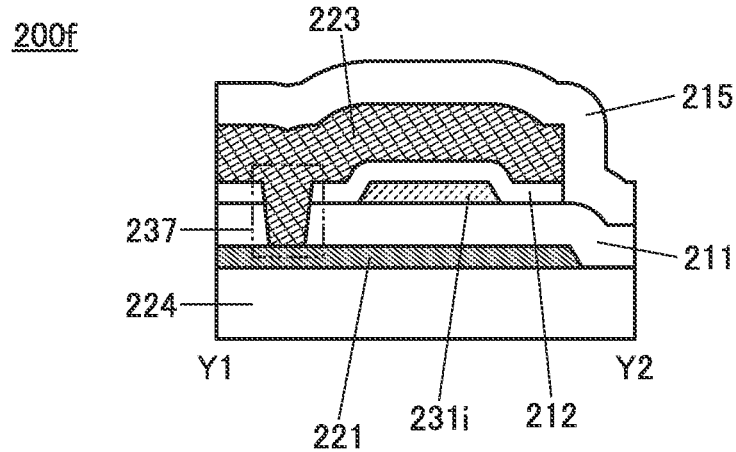

The transistor 200f illustrated in FIGS. 44A to 44C includes the conductive layer 221 over the insulating layer 224, the insulating layer 211 over the conductive layer 221 and over the insulating layer 224, the semiconductor layer 231 over the insulating layer 211, the insulating layer 212 over the semiconductor layer 231, the conductive layer 223 over the insulating layer 212, and an insulating layer 215 over the insulating layer 211, over the semiconductor layer 231, and over the conductive layer 223. The semiconductor layer 231 includes a channel formation region 231i overlapping with the conductive layer 223, a source region 231s in contact with the insulating layer 215, and a drain region 231d in contact with the insulating layer 215.

The insulating layer 215 contains nitrogen or hydrogen. The insulating layer 215 is in contact with the source region 231s and the drain region 231d, so that nitrogen or hydrogen that is contained in the insulating layer 215 is added to the source region 231s and the drain region 231d. The source region 231s and the drain region 231d each have a high carrier density when nitrogen or hydrogen is added thereto.

The transistor 200f may include the conductive layer 222a electrically connected to the source region 231s through an opening portion 236a provided in the insulating layer 215. The transistor 200f may further include the conductive layer 222b electrically connected to the drain region 231d through an opening portion 236b provided in the insulating layer 215.

The insulating layer 211 has a function as a first gate insulating layer, and the insulating layer 212 has a function as a second gate insulating layer. The insulating layer 215 serves as a protective insulating layer.

The insulating layer 212 includes an excess oxygen region. Since the insulating layer 212 includes the excess oxygen region, excess oxygen can be supplied to the channel formation region 231i included in the semiconductor layer 231. As a result, oxygen vacancies that might be formed in the channel formation region 231i can be filled with excess oxygen, which can provide a highly reliable display device.

To supply excess oxygen to the semiconductor layer 231, excess oxygen may be supplied to the insulating layer 211 that is formed below the semiconductor layer 231. However, in that case, excess oxygen contained in the insulating layer 211 might also be supplied to the source region 231s and the drain region 231d included in the semiconductor layer 231. When excess oxygen is supplied to the source region 231s and the drain region 231d, the resistance of the source region 231s and the drain region 231d might be increased.

By contrast, in the structure in which the insulating layer 212 formed over the semiconductor layer 231 contains excess oxygen, excess oxygen can be selectively supplied only to the channel formation region 231i. Alternatively, the carrier density of the source and drain regions 231s and 231d can be selectively increased after excess oxygen is supplied to the channel formation region 231i and the source and drain regions 231s and 231d, in which case an increase in the resistance of the source and drain regions 231s and 231d can be prevented.

Furthermore, each of the source region 231s and the drain region 231d included in the semiconductor layer 231 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. In the case where one or more of the elements that form oxygen vacancies are contained in the insulating layer 215, the one or more of the elements are diffused from the insulating layer 215 to the source region 231s and the drain region 231d, and/or may be added to the source region 231s and the drain region 231d by impurity addition treatment.

An impurity element added to the metal oxide cuts a bond between a metal element and oxygen in the metal oxide, so that an oxygen vacancy is formed. Alternatively, when the impurity element is added to the metal oxide, oxygen bonded to a metal element in the metal oxide is bonded to the impurity element, and the oxygen is released from the metal element, whereby an oxygen vacancy is formed. As a result, the metal oxide has a higher carrier density and thus the conductivity thereof becomes higher.

The conductive layer 221 functions as a first gate and the conductive layer 223 functions as a second gate. The conductive layer 222a has a function as a source and the conductive layer 222b has a function as a drain.

As illustrated in FIG. 44C, an opening portion 237 is formed in the insulating layers 211 and 212. The conductive layer 221 is electrically connected to the conductive layer 223 in the opening portion 237. Thus, the conductive layers 221 and 223 are supplied with the same potential. Note that different potentials may be applied to the conductive layers 221 and 223 without providing the opening portion 237. Alternatively, the conductive layer 221 may be used as a light-blocking film without providing the opening portion 237. For example, light irradiating the channel formation region 231i from the bottom can be reduced by the conductive layer 221 formed with a light-blocking material.

As illustrated in FIGS. 44B and 44C, while facing the conductive layer 221 having a function as the first gate and the conductive layer 223 having a function as the second gate, the semiconductor layer 231 is positioned between the two conductive layers having functions as the gates.

As with the transistors 200a, 200b, and 200c, the transistor 200f has the S-channel structure. Such a structure enables the semiconductor layer 231 included in the transistor 200f to be electrically surrounded by electric fields of the conductive layer 221 having a function as the first gate and the conductive layer 223 having a function as the second gate.

Since the transistor 200f has the S-channel structure, an electric field for inducing a channel can be effectively applied to the semiconductor layer 231 by the conductive layer 221 or 223. Thus, the current drive capability of the transistor 200f can be improved and high on-state current characteristics can be obtained. As a result of the high on-state current, it is possible to reduce the size of the transistor 200f. Furthermore, since the transistor 200f has a structure in which the semiconductor layer 231 is surrounded by the conductive layers 221 and 223, the mechanical strength of the transistor 200f can be increased.

The transistor 200f may be called a top-gate self-aligned (TGSA) FET from the position of the conductive layer 223 relative to the semiconductor layer 231 or the formation method of the conductive layer 223.

The semiconductor layer 231 in the transistor 200f may have a multi-layer structure including two or more layers, as in the transistor 200b.

Although the insulating layer 212 is present only in a portion overlapping with the conductive layer 223 in the transistor 200f, the structure is not limited thereto, and the insulating layer 212 may cover the semiconductor layer 231. Alternatively, the conductive layer 221 may be omitted.

At least part of this embodiment can be implemented in combination with any of the other embodiments described in this specification as appropriate.

Embodiment 6

Described below is the composition of a cloud-aligned composite (CAC) OS applicable to a transistor disclosed in one embodiment of the present invention.

<Composition of CAC—OS>

The CAC—OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC—OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC—OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a c-axis-aligned crystal (CAAC) structure. Note that the CAAC structure is a crystal structure in which a plurality of IGZO nanocrystals have c-axis alignment and are connected in the a-b plane direction without alignment.

On the other hand, the CAC—OS relates to the material composition of a metal oxide. In a CAC—OS material including In, Ga, Zn, and O, regions where nanoparticles including Ga as a main component are partly observed and regions where nanoparticles including In as a main component are partly observed are randomly dispersed to form a mosaic pattern. Therefore, the crystal structure is a secondary element for the CAC—OS.

Note that in the CAC—OS, a stacked-layer structure including two or more films with different atomic ratios is not included. For example, a two-layer structure of a film including In as a main component and a film including Ga as a main component is not included.

A boundary between the region including GaO$_{X3}$ as a main component and the region including In$_{X2}$Zn$_{Y2}$O$_{Z2}$ or InO$_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC—OS, nanoparticle regions including the selected metal element(s) as a main component(s) are observed in part of the CAC—OS and nanoparticle regions including In as a main component are observed in part thereof, and these nanoparticle regions are randomly dispersed to form a mosaic pattern in the CAC—OS.

The CAC—OS can be formed by a sputtering method under conditions where a substrate is not heated intentionally, for example. In the case of forming the CAC—OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC—OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC—OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC—OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including GaO$_{X3}$ as a main component and a region including In$_{X2}$Zn$_{Y2}$O$_{Z2}$ or InO$_{X1}$ as a main component are unevenly distributed and mixed.

The CAC—OS has a structure different from that of an IGZO compound in which metal elements are evenly distributed, and has characteristics different from those of the IGZO compound. That is, in the CAC—OS, regions including GaO$_{X3}$ or the like as a main component and regions including In$_{X2}$Zn$_{Y2}$O$_{Z2}$ or InO$_{X1}$ as a main component are separated to form a mosaic pattern.

The conductivity of a region including In$_{X2}$Zn$_{Y2}$O$_{Z2}$ or InO$_{X1}$ as a main component is higher than that of a region including GaO$_{X3}$ or the like as a main component. In other words, when carriers flow through regions including $In_{x2}Zn_{y2}O_{z2}$ or $InO_{X1}$ as a main component, the conductivity of a metal oxide is exhibited. Accordingly, when regions including $In_{x2}Zn_{y2}O_{z2}$ or $InO_{X1}$ as a main component are distributed in a metal oxide like a cloud, a high field-effect mobility (μ) can be achieved.

By contrast, the insulating property of a region including $GaO_{X3}$ or the like as a main component is higher than that of a region including $In_{x2}Zn_{y2}O_{z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC—OS is used for a semiconductor element, the insulating property derived from $GaO_{X3}$ or the like and the conductivity derived from $In_{x2}Zn_{y2}O_{z2}$ or $InO_{X1}$ complement each other, whereby a high on-state current (Ion) and a high field-effect mobility (μ) can be achieved.

A semiconductor element including a CAC—OS has high reliability. Thus, the CAC—OS is suitably used in a variety of semiconductor devices typified by a display.

At least part of this embodiment can be implemented in combination with any of the other embodiments described in this specification as appropriate.

Embodiment 7

In this embodiment, another structural example of the display device described in the above embodiment will be described.

FIG. 45 illustrates a structural example of the display device 10. The display device 10 includes the display portion 17 provided over the substrate 14. The display portion 17 includes the plurality of pixels 11 connected to the wirings GL and the wirings SL.

Furthermore, the display device 10 is provided with a plurality of tape automated bonding (TAB) tapes 121a and a plurality of TAB tapes 121b. The TAB tapes 121a and the TAB tapes 121b are provided to face each other with the display portion 17 provided therebetween. Integrated circuits in which the gate drivers 12a and the like are formed are mounted on the TAB tapes 121a, and integrated circuits in which the gate drivers 12b and the like are formed are mounted on the TAB tapes 121b. The gate drivers 12a and 12b are connected to the plurality of wirings GL and configured to supply selection signals to the wirings GL.

In addition, the display device 10 is provided with a plurality of printed boards 131a and a plurality of TAB tapes 132a and provided with a plurality of printed boards 131b and a plurality of TAB tapes 132b. The printed boards 131a and the TAB tapes 132a face the printed boards 131b and the TAB tapes 132b with the display portion 17 provided therebetween.

The printed boards 131a are connected to the plurality of TAB tapes 132a and have a function of distributing external input signals to the TAB tapes 132a. The printed boards 131b are connected to the plurality of TAB tapes 132b and have a function of distributing external input signals to the TAB tapes 132b. Integrated circuits in which the source drivers 13a and the like are formed are mounted on the TAB tapes 132a, and integrated circuits in which the source drivers 13b and the like are formed are mounted on the TAB tapes 132b. The source drivers 13a and the source drivers 13b are connected to the plurality of wirings SL and have a function of supplying selection signals to the wirings SL.

In the case where a large-sized display panel which is compatible with 2K, 4K, or 8K broadcasting or the like is formed, the display panel is preferably provided with the plurality of printed boards 131a and the plurality of printed boards 131b as illustrated in FIG. 45.

Accordingly, input of image data to the display device 10 is facilitated.

Note that the gate driver 12a, the gate driver 12b, the source driver 13a, and the source driver 13b can also be provided over the substrate 14 by a chip on glass (COG) method, a chip on film (COF) method, or the like.

At least part of this embodiment can be implemented in combination with any of the other embodiments described in this specification as appropriate.

Embodiment 8

Described in this embodiment are examples of a method of crystallization for polycrystalline silicon which can be used for a semiconductor layer of a transistor and a laser crystallization apparatus.

To form polycrystalline silicon layers having favorable crystallinity, it is preferable that an amorphous silicon layer be provided over a substrate and crystallized by laser irradiation. For example, the substrate is moved while the amorphous silicon layer is irradiated with a linear beam, so that polycrystalline silicon layers can be formed in desired regions over the substrate.

The method using a linear beam is relatively favorable in throughput. On the other hand, the method tends to produce variations in crystallinity owing to a change in the output of laser light and a change in the beam profile caused by the output change because laser light is moved relative to a region and is emitted to the region a plurality of times. For example, a display device that uses a transistor including a semiconductor layer crystallized by this method in a pixel might display a random stripe pattern caused by variations in crystallinity.

The length of the linear beam is ideally greater than or equal to the length of a side of the substrate; however, the length of the linear beam is limited by an output of a laser and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem, an amorphous silicon layer formed over a substrate may be crystallized by local laser irradiation. Local laser irradiation easily forms polycrystalline silicon layers with small variation in crystallinity.

Figure 46A:
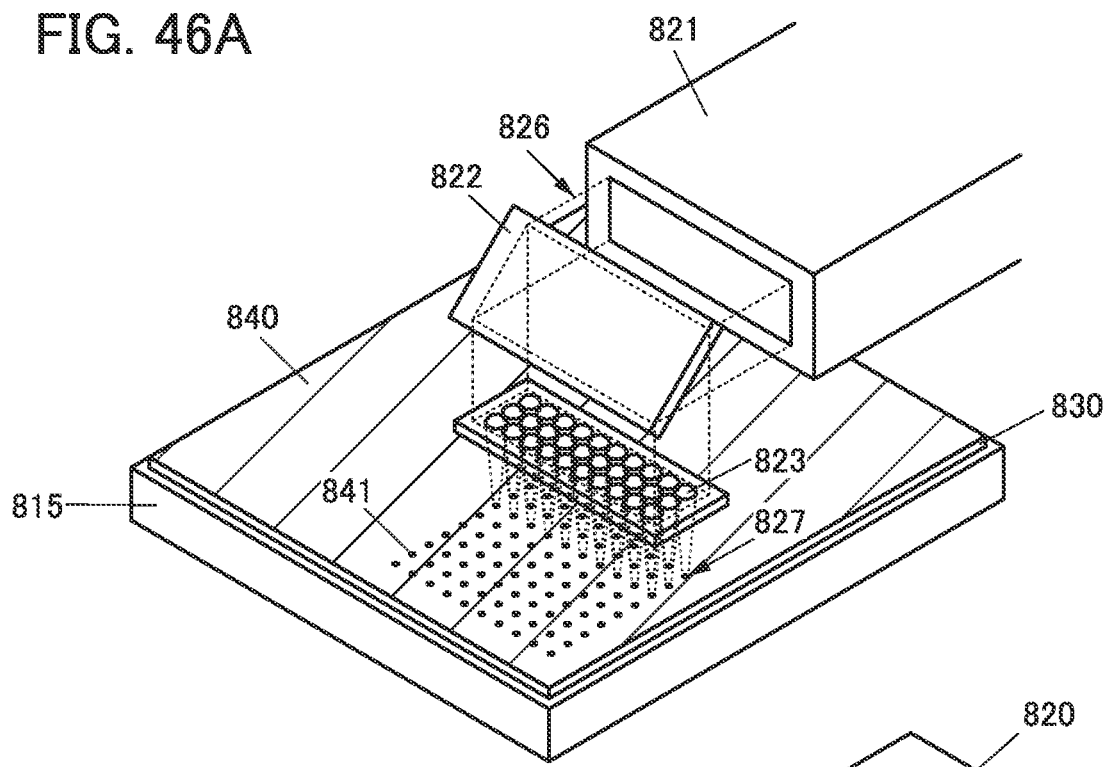
FIGS. 46A and 46B illustrate a laser irradiation method and a laser crystallization apparatus.

FIG. 46A illustrates a method of locally irradiating an amorphous silicon layer formed over a substrate with laser light.

Laser light 826 emitted from an optical system unit 821 is reflected by a mirror 822 and enters a microlens array 823. The microlens array 823 collects the laser light 826 to form a plurality of laser beams 827.

A substrate 830 over which an amorphous silicon layer 840 is formed is fixed to a stage 815. The amorphous silicon layer 840 is irradiated with the plurality of laser beams 827, so that a plurality of polycrystalline silicon layers 841 can be formed at the same time.

Microlenses of the microlens array 823 are preferably provided with a pixel pitch of a display device. Alternatively, they may be provided at intervals of an integral multiple of the pixel pitch. In either of the cases, polycrystalline silicon layers can be formed in regions corresponding to all pixels by repeating laser irradiation and movement of the stage 815 in the X direction or the Y direction.

For example, when the microlens array 823 includes M rows and N columns (M and N are natural numbers) of microlenses arranged with a pixel pitch, laser light irradiation is performed at a predetermined start position first, so that M rows and N columns polycrystalline silicon layers 841 can be formed. Then, the stage 815 is moved by N columns in the row direction and laser irradiation is performed, so that M rows and N columns of polycrystalline silicon layers 841 can be further formed. Consequently, M rows and 2N columns of polycrystalline silicon layers 841 can be obtained. By repeating the steps, a plurality of polycrystalline silicon layers 841 can be formed in desired regions. In the case where laser light irradiation is performed by turning back the laser light, the following steps are repeated: the stage 815 is moved by N columns in the row direction; laser light irradiation is performed; the stage 815 is moved by M rows in the column direction: and laser light irradiation is performed.

Note that even when a method of performing laser irradiation while the stage 815 is moved in one direction is employed, polycrystalline silicon layers can be formed with a pixel pitch by adjusting the oscillation frequency of the laser light and the moving speed of the stage 815 properly.

The size of the laser beam 827 can be an area in which the whole semiconductor layer of a transistor is included, for example. Alternatively, the size can be an area in which the whole channel formation region of a transistor is included. Further alternatively, the size can be an area in which part of a channel formation region of a transistor is included. The size can be selected from them depending on required electrical characteristics of a transistor.

Note that in the case of a display device including a plurality of transistors in a pixel, the size of the laser beam 827 can be an area in which the whole semiconductor layer of each transistor in a pixel is included. Alternatively, the size of the laser beam 827 may be an area in which the whole semiconductor layers of transistors in a plurality of pixels are included.

Figure 47A:
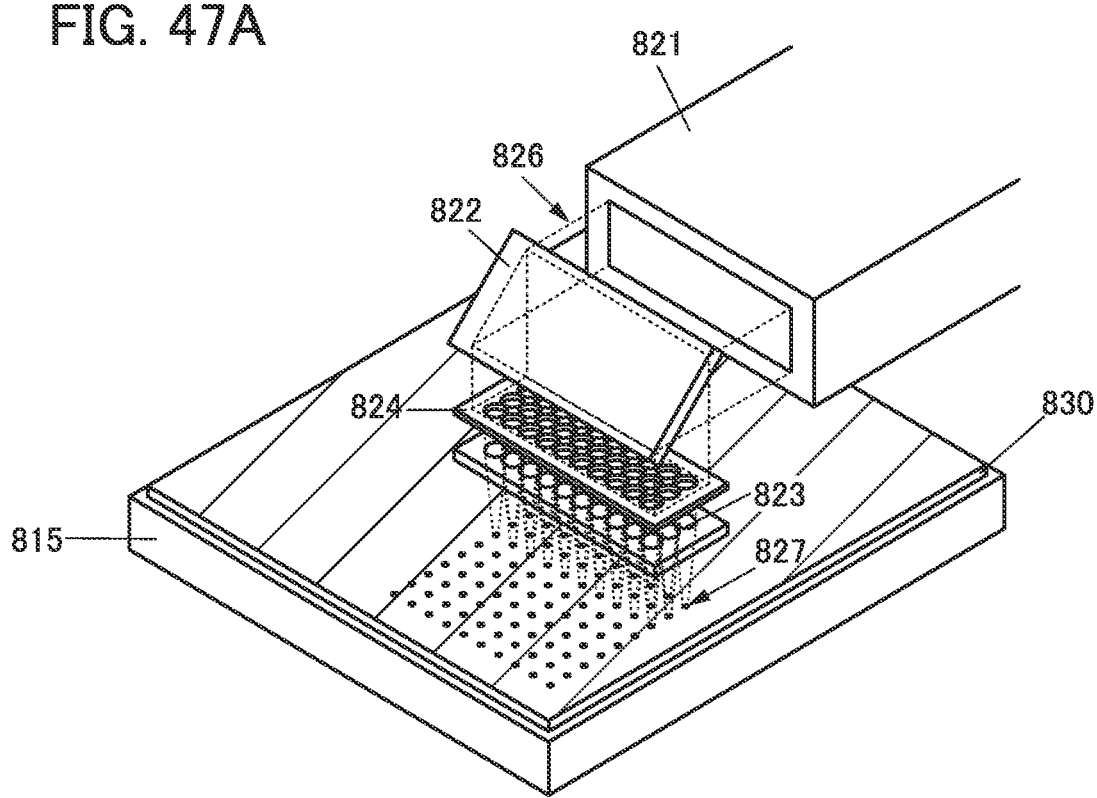
FIGS. 47A and 47B illustrate a laser irradiation method.
Figure 47B:
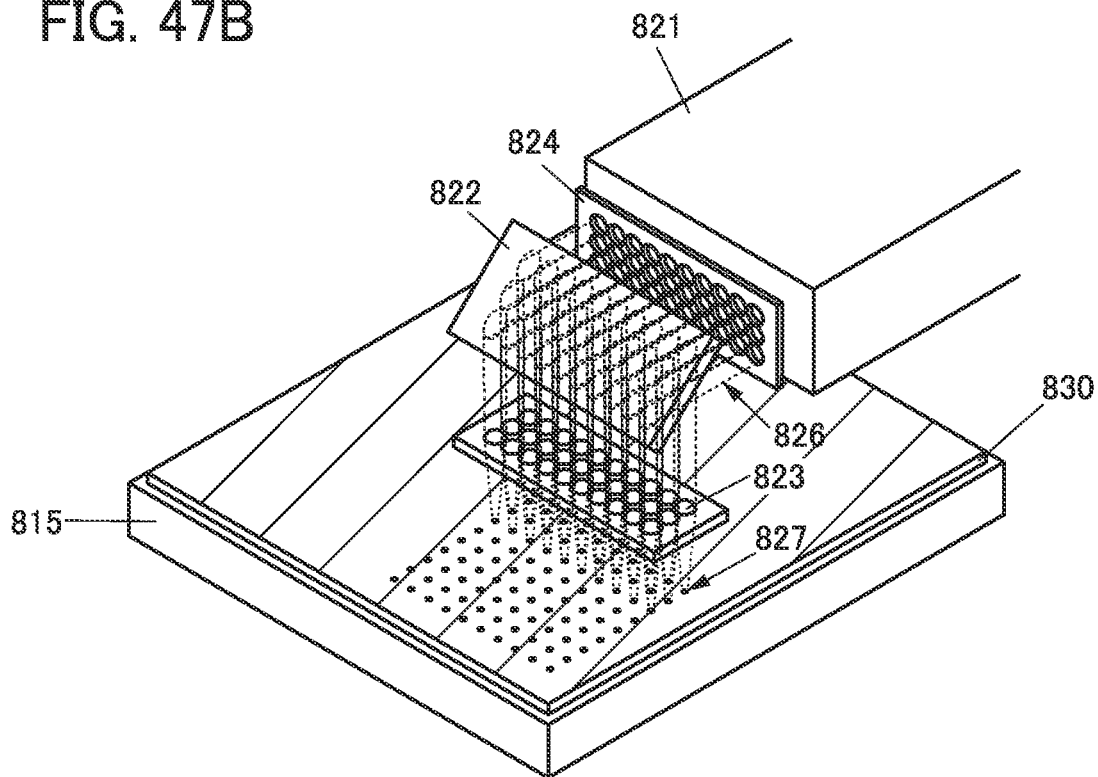

As illustrated in FIG. 47A, a mask 824 may be provided between the mirror 822 and the microlens array 823. The mask 824 includes a plurality of opening portions corresponding to respective microlenses. The shape of the opening portion can be reflected by the shape of the laser beam 827; as illustrated in FIG. 47A, the laser beam 827 having a circular shape can be obtained in the case where the mask 824 includes circular opening portions. The laser beam 827 having a rectangular shape can be obtained in the case where the mask 824 includes rectangular opening portions. The mask 824 is effective in the case where only a channel formation region of a transistor is crystallized, for example. Note that the mask 824 may be provided between the optical system unit 821 and the mirror 822 as illustrated in FIG. 47B.

Figure 46B:
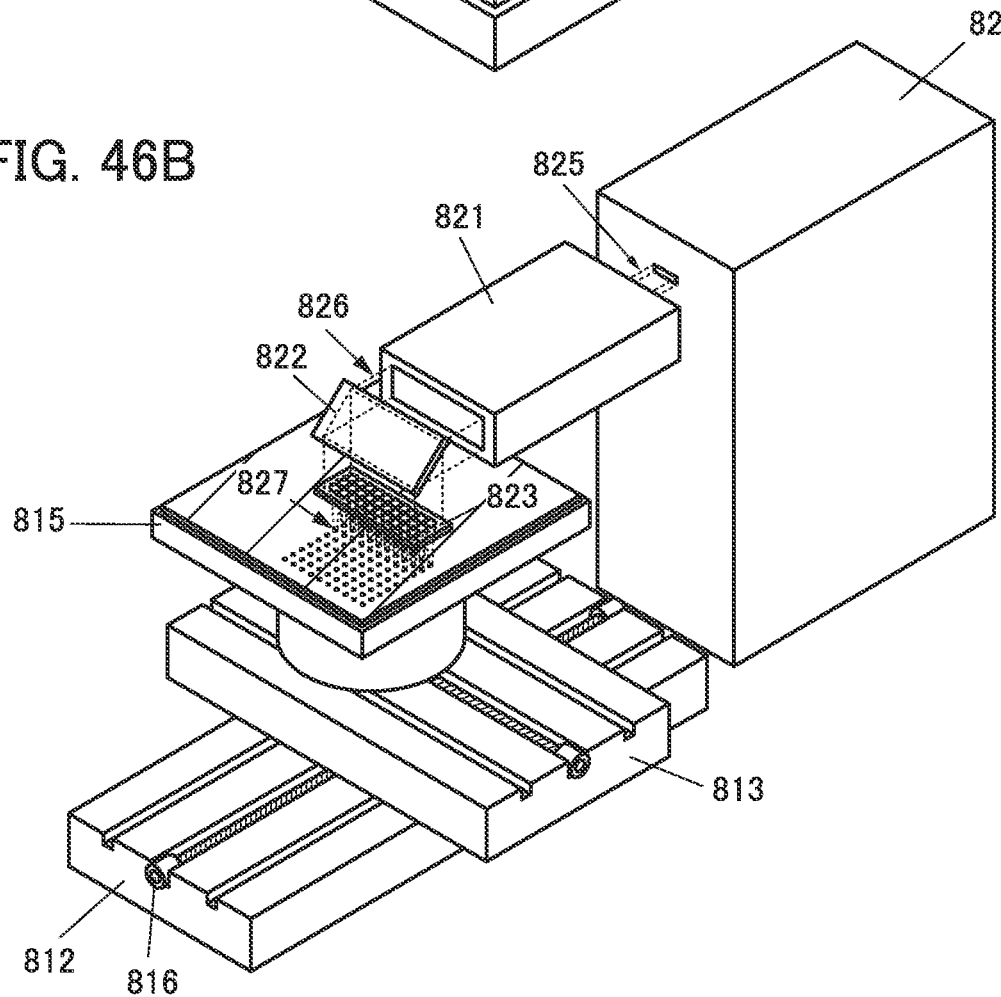

FIG. 46B is a perspective view illustrating a main structure of a laser crystallization apparatus which can be used in the above local laser irradiation step. The laser crystallization apparatus includes a moving mechanism 812, a moving mechanism 813, and the stage 815 which are components of an X-Y stage. The crystallization apparatus further includes a laser 820, the optical system unit 821, the mirror 822, and the microlens array 823 to shape the laser beam 827.

The moving mechanism 812 and the moving mechanism 813 each have a function of performing reciprocating linear motion in the horizontal direction. As a mechanism for powering the moving mechanism 812 and the moving mechanism 813, a ball screw mechanism 816 driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The stage 815 includes a fixing mechanism such as a vacuum suction mechanism and can fix the substrate 830 or the like. Furthermore, the stage 815 may include a heating mechanism as needed. Although not illustrated, the stage 815 may include a pusher pin and a vertical moving mechanism thereof, and the substrate 830 or the like can be moved up and down when being transferred.

The laser 820 is preferably a pulsed laser, but may be a CW laser as long as it outputs light with a wavelength and intensity suitable for the purpose of processing. Typically, an excimer laser that emits ultraviolet light with a wavelength of 351 nm to 353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of lasers 820 may be provided.

The optical system unit 821 includes a mirror, a beam expander, a beam homogenizer, or the like, for example, and can homogenize and expand the energy in-plane distribution of laser light 825 emitted from the laser 820.

As the mirror 822, a dielectric multilayer mirror can be used, for example, and is provided so that the incident angle of the laser light is substantially 45°. The microlens array 823 can have a shape such that a plurality of convex lenses are provided on the top surface or on the top and bottom surfaces of a quartz board, for example.

With the above-described laser crystallization apparatus, polycrystalline silicon layers with small variation in crystallinity can be formed.

At least part of this embodiment can be implemented in combination with any of the other embodiments described in this specification as appropriate.

Embodiment 9

In this embodiment, electronic devices of embodiments of the present invention will be described with reference to drawings.

Each of the electronic devices described below is provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices include electronic devices with a relatively large screen, such as a television device, a desktop or laptop personal computer, a monitor of a computer or the like, a digital signage, and a large game machine (e.g., a pachinko machine); a camera such as a digital camera or a digital video camera; a digital photo frame; a mobile phone; a portable game console; a portable information terminal; and an audio reproducing device.

The electronic device or a lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display an image, information, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 48A:
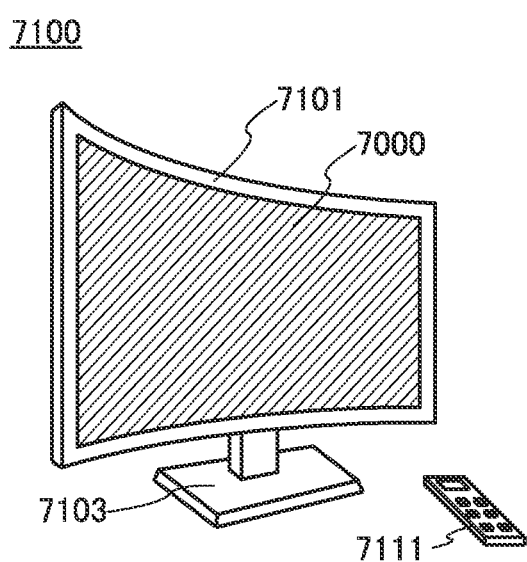
FIGS. 48A to 48D each illustrate an example of an electronic device.

FIG. 48A illustrates an example of a television device. In a television device 7100, a display portion 7000 is incorporated in a housing 7101. Here, the housing 7101 is supported by a stand 7103.

The display device of one embodiment of the present invention can be used in the display portion 7000. The television device 7100 using the display device of one embodiment of the present invention can display a high-resolution image. The television device 7100 can also display a high-resolution image on a large screen. The use of the display device of one embodiment of the present invention can improve the display quality of the television device 7100.

The television device 7100 illustrated in FIG. 48A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) information communication can be performed.

Figure 48B:
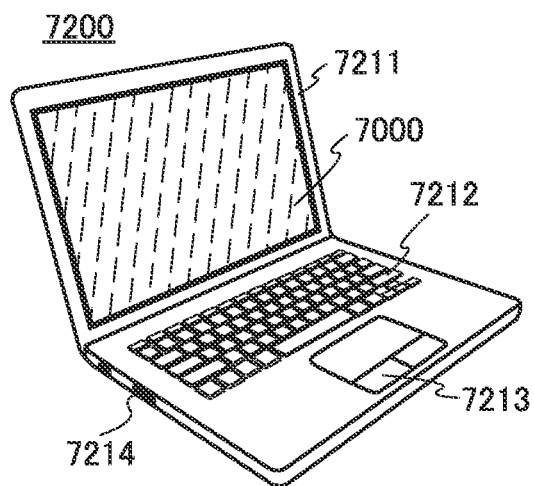

FIG. 48B illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000. The laptop personal computer 7200 using the display device of one embodiment of the present invention can display a high-resolution image. The laptop personal computer 7200 can also display a high-resolution image on a large screen. The use of the display device of one embodiment of the present invention can improve the display quality of the laptop personal computer 7200.

Figure 48C:
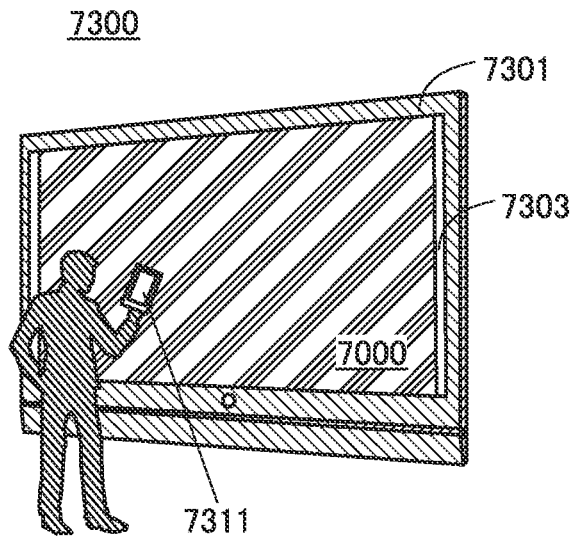
Figure 48D:
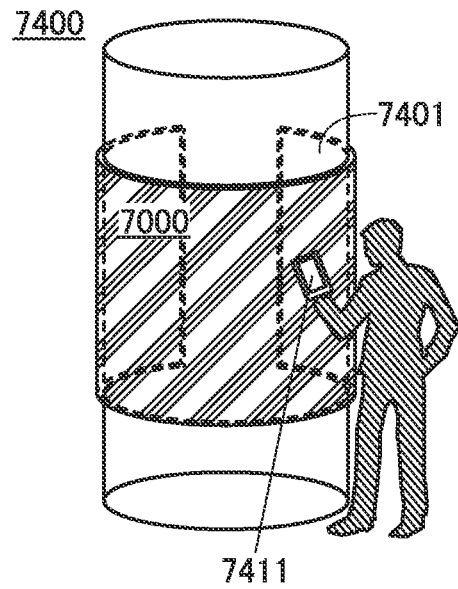

FIGS. 48C and 48D illustrate examples of the digital signage.

A digital signage 7300 illustrated in FIG. 48C includes a housing 7301, the display portion 7000, a speaker 7303, and the like. Also, the digital signage 7300 can include an LED lamp, operation keys (including a power switch or an operation switch), a connection terminal, a variety of sensors, a microphone, and the like.

FIG. 48D illustrates a digital signage 7400 mounted on a cylindrical pillar 7401. The digital signage 7400 includes the display portion 7000 provided along a curved surface of the pillar 7401.

The display device of one embodiment of the present invention can be used in each of the display portions 7000 illustrated in FIGS. 48C and 48D. The digital signages 7300 and 7400 using the display device of one embodiment of the present invention can display a high-resolution image. The digital signages 7300 and 7400 can also display a high-resolution image on a large screen. The use of the display device of one embodiment of the present invention can improve the display quality of the digital signages 7300 and 7400.

A larger area of the display portion 7000 can provide more information at a time. In addition, the larger display portion 7000 attracts more attention, so that the effectiveness of the advertisement can be increased, for example.

The use of the touch panel in the display portion 7000 is preferable because in addition to display of a still or moving image on the display portion 7000, intuitive operation by a user is possible. In the case where the display device is used for providing information such as route or traffic information, usability can be enhanced by intuitive operation.

Furthermore, as illustrated in FIGS. 48C and 48D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or 7411. Moreover, by operation of the information terminal 7311 or 7411, a displayed image on the display portion 7000 can be switched.

Furthermore, it is possible to make the digital signage 7300 or 7400 execute a game with use of the screen of the information terminal 7311 or 7411 as an operation means (controller). Thus, an unspecified number of people can join in and enjoy the game concurrently.

At least part of this embodiment can be implemented in combination with any of the other embodiments described in this specification as appropriate.

REFERENCE NUMERALS

10: display device, 11: pixel, 14: substrate, 15: substrate, 16: reference voltage generation circuit, 17: display portion, 20: liquid crystal element, 21: conductive layer, 22: liquid crystal, 23: conductive layer, 26: insulating layer, 30: transistor, 31: conductive layer, 32: semiconductor layer, 33: conductive layer, 34: insulating layer, 35: impurity semiconductor layer, 37: semiconductor layer, 38: opening portion, 41: coloring layer, 42: light-blocking layer, 50: light, 51: conductive layer, 52: conductive layer, 53: conductive layer, 54: conductive layer, 55: conductive layer This application is based on Japanese Patent Application Serial No. 2017-027901 filed with Japan Patent Office on Feb. 17, 2017, the entire contents of which are hereby incorporated by reference.

The invention claimed is:

1. A display device comprising:
   first to fourth gate lines;
   first to third source lines; and
   a display portion comprising:
      first to fourth pixels arranged in a first column; and
      fifth to eighth pixels arranged in a second column,
   wherein the first and fifth pixels are electrically connected to the first gate line,
   wherein the second and sixth pixels are electrically connected to the second gate line,
   wherein the third and seventh pixels are electrically connected to the third gate line,
   wherein the fourth and eighth pixels are electrically connected to the fourth gate line,
   wherein the second pixel is between the first pixel and the third pixel and adjacent to the sixth pixel,
   wherein the first to third source lines are provided between the first and second columns,
   wherein the first source line is electrically connected to the first and third pixels,
   wherein the second source line is electrically connected to the sixth pixel,
   wherein the third source line is electrically connected to the eighth pixel, and
   wherein the first to third source lines supply signals having the same polarity.

2. The display device according to claim 1, wherein the first to eighth pixels each comprise a transistor comprising an oxide semiconductor layer.

3. The display device according to claim 1, wherein the first to eighth pixels each comprise a liquid crystal element.

4. The display device according to claim 1, wherein the signals having the same polarity are supplied to the first to third source lines during one frame period.

5. The display device according to claim 1, wherein the display device is operated by dot inversion driving.

6. A display device comprising:
   first to fourth gate lines;
   first to fourth source lines; and
   a display portion comprising:
      first to fourth pixels arranged in a first column; and
      fifth to eighth pixels arranged in a second column,
   wherein the first and fifth pixels are electrically connected to the first gate line,
   wherein the second and sixth pixels are electrically connected to the second gate line,
   wherein the third and seventh pixels are electrically connected to the third gate line,
   wherein the fourth and eighth pixels are electrically connected to the fourth gate line,
   wherein the second pixel is between the first pixel and the third pixel and adjacent to the sixth pixel,
   wherein the first to fourth source lines are provided between the first and second columns,
   wherein the first source line is electrically connected to the first pixel,
   wherein the second source line is electrically connected to the third pixel,
   wherein the third source line is electrically connected to the sixth pixel,
   wherein the fourth source line is electrically connected to the eighth pixel, and
   wherein the first to fourth source lines supply signals having the same polarity.

7. The display device according to claim 6, wherein the first to eighth pixels each comprise a transistor comprising an oxide semiconductor layer.

8. The display device according to claim 6, wherein the first to eighth pixels each comprise a liquid crystal element.

9. The display device according to claim 6, wherein the signals having the same polarity are supplied to the first to fourth source lines during one frame period.

10. The display device according to claim 6, wherein the display device is operated by dot inversion driving.

* * * * *